(12) United States Patent
Yamazaki et al.

(10) Patent No.: US 8,709,864 B2
(45) Date of Patent: Apr. 29, 2014

(54) METHOD FOR MANUFACTURING SEMICONDUCTOR ELEMENT AND SEMICONDUCTOR DEVICE, AND DEPOSITION APPARATUS

(75) Inventors: Shunpei Yamazaki, Tokyo (JP); Junichiro Sakata, Kanagawa (JP); Toru Takayama, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 430 days.

(21) Appl. No.: 12/938,538

(22) Filed: Nov. 3, 2010

(65) Prior Publication Data

US 2011/0111558 A1    May 12, 2011

(30) Foreign Application Priority Data

Nov. 6, 2009  (JP) .................. 2009-255217

(51) Int. Cl.
 *H01L 21/00* (2006.01)
(52) U.S. Cl.
 USPC .......... 438/104; 257/43; 204/298.09
(58) Field of Classification Search
 USPC ............ 257/43, E21.411; 483/104; 204/298.09–298.13
 See application file for complete search history.

(56) References Cited

U.S. PATENT DOCUMENTS

| 4,297,189 A | 10/1981 | Smith, Jr. et al. |
| 5,514,879 A * | 5/1996 | Yamazaki ............... 257/65 |
| 5,731,856 A | 3/1998 | Kim et al. |
| 5,744,864 A | 4/1998 | Cillessen et al. |
| 5,747,427 A * | 5/1998 | Homma et al. ............... 505/476 |
| 6,294,274 B1 | 9/2001 | Kawazoe et al. |

(Continued)

FOREIGN PATENT DOCUMENTS

| EP | 1737044 A | 12/2006 |
| EP | 2226847 A | 9/2010 |

(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters) , Sep. 27, 2004, vol. 85, No. 13, pp. 2541-2543.

(Continued)

*Primary Examiner* — Julio J Maldonado
*Assistant Examiner* — Robert Bachner
(74) *Attorney, Agent, or Firm* — Eric J. Robinson; Robinson Intellectual Property Law Office, P.C.

(57) ABSTRACT

An object is to provide a deposition apparatus for forming a thin film which contains few impurities such as a hydrogen atom or a carbon atom. Further, an object is to provide a method for forming a thin film containing few impurities. Furthermore, an object is to provide a method for manufacturing a highly reliable semiconductor element including an oxide semiconductor film containing few impurities. A deposition apparatus can be provided for forming a thin film which contains few impurities such as a compound containing a hydrogen atom such as $H_2O$, a compound containing a carbon atom, a hydrogen atom, or a carbon atom can be provided. Further, a method for forming a thin film containing few impurities can be provided. Furthermore, a method for forming a highly reliable semiconductor element including an oxide semiconductor film containing few impurities can be provided.

14 Claims, 20 Drawing Sheets

(56) References Cited

U.S. PATENT DOCUMENTS

| | | |
|---|---|---|
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,141,489 B2 * | 11/2006 | Burgener et al. ............ 438/478 |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0186852 A1 * | 8/2007 | Sakata et al. .................. 118/719 |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-010780 A | 1/1999 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 | 4/2007 |
| JP | 2007-123861 | 5/2007 |
| WO | WO-2004/114391 | 12/2004 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In-Ga-Zn-O TFTs,", SID Digest '08 : SID International symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters) , Jun. 17, 1996, vol. 68, No. 25, pp. 3650-3652.

Nakamura.M et al., "The phase relations in the $In_2O_3$-$Ga_2ZnO_4$-ZnO system at 1350°C.", Journal of Solid State Chemistry, Aug. 1, 1991, vol. 93, No. 2, pp. 298-315.

Kimizuka.n. et al., "Syntheses and Single-Crystal Data of Homologous Compounds, $In_2O_3(ZnO)_m$ (m = 3, 4, and 5), $InGaO_3(ZnO)_3$,

(56) References Cited

OTHER PUBLICATIONS and Ga2O3(ZnO)m (m = 7, 8, 9, and 16) in the In2O3-ZnGa2O4-ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N. et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In-Ga-Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3-In2O3-ZnO) TFT,", SID Digest '08 : SID International Symposium Digest of Technical Papers, May 20, 2008, vol. 39, pp. 633-636.

Lee.J et al., "World'S Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 As a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits, 2008, vol. 43, No. 1, pp. 292-299.

Ohara.H et al., "Amorphous In-Ga-Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In-Ga-Zn-Oxide TFTs,", IDW '09 : Proceedings of the 16th International Display Workshops, 2009, pp. 689-692.

Park.J et al., "Amorphous Indium-Gallium-Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by PEALD Grown ZnO TFT,", IMID '07 Digest, 2007, pp. 1249-1252.

Godo.H et al., "Temperature Dependence of Characteristics and Electronic Structure for Amorphous In-Ga-Zn-Oxide TFT,", AM-FPD '09 Digest of Technical Papers, Jul. 1, 2009, pp. 41-44.

Osada.T et al., "Development of Driver-Integrated Panel Using Amorphous In-Ga-Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In-Ga-Zn-Oxide TFT,", SID Digest '09 : SID International Symposium Digest of Technical Papers, May 31, 2009, pp. 1110-1112.

Ohara.H et al., "21.3:4.0 In. QVGA AMOLED Display Using In-Ga-Zn-Oxide TFTs With a Novel Passivation Layer,", SID Digest '09 : SID International Symposium Digest of Technical Papers, May 31, 2009, pp. 284-287.

Miyasaka.M, "Suftla Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transcations on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter Mar. 1, 1995, vol. 150, pp. 1-4.

Kikuchi.H et al., "Polymer-Stabilized Liquid crystal Blue Phases,", Nature Materials, Sep. 1, 2002, vol. 1, pp. 64-68.

Kimizuka.N et al., "Spinel, YbFe2O4, and YbFe3O7 Types of Structures for Compounds in the In2O3 and Sc2O3-A2O3-BO Systems

(56) References Cited

OTHER PUBLICATIONS

[A; Fe, Ga, or Al; B: Mg, Mn, Fe, Ni, Cu, or Zn] at Temperatures over 1000°C.", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics), 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters), 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

Invitation to pay additional fees (Application No. PCT/JP2010/069651), International Searching Authority, dated Nov. 30, 2010.

International Search Report (Application No. PCT/JP2010/069651) Dated Jan. 25, 2011.

Written Opinion (Application No. PCT/JP2010/069651) Dated Jan. 25, 2011.

\* cited by examiner

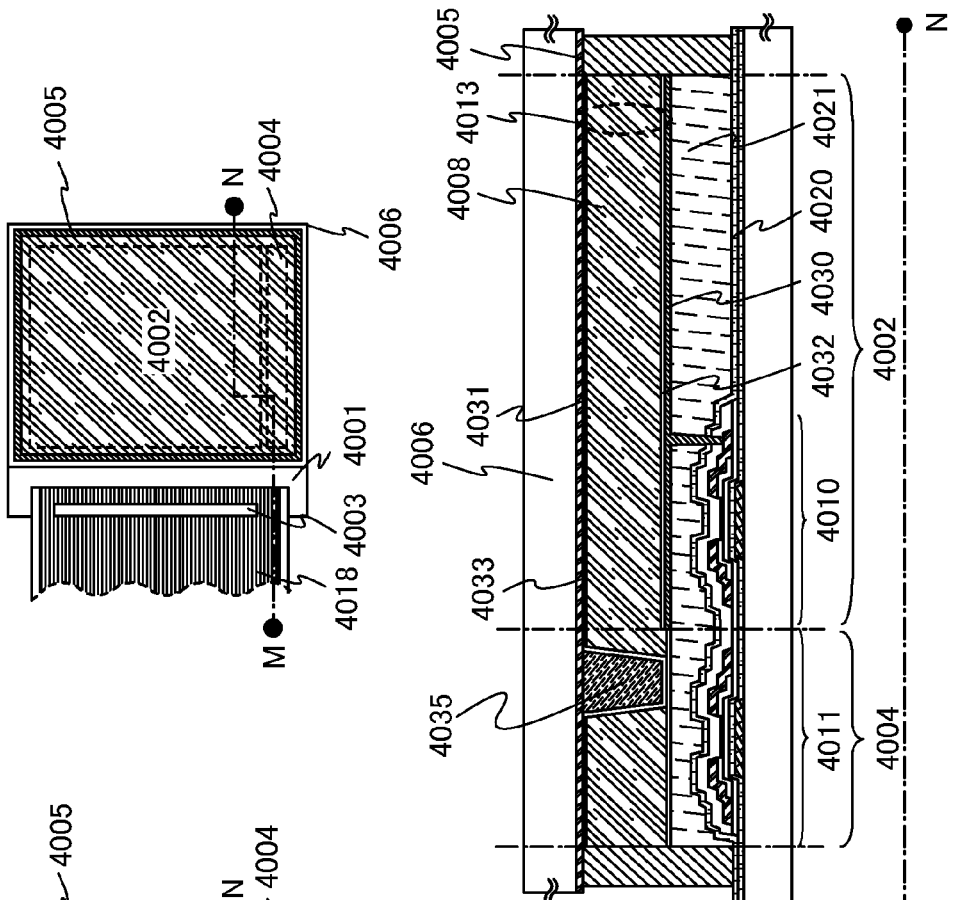
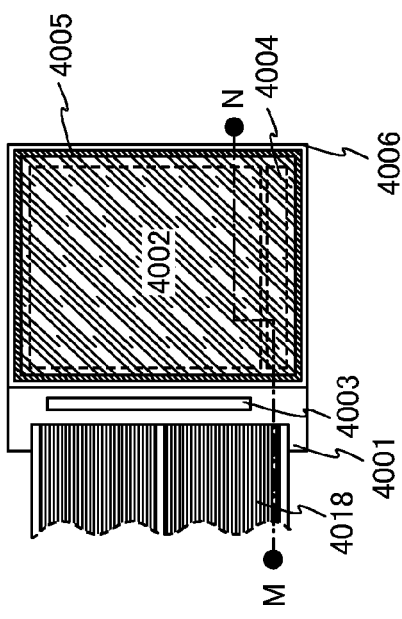
FIG. 10A
FIG. 10B
FIG. 10C

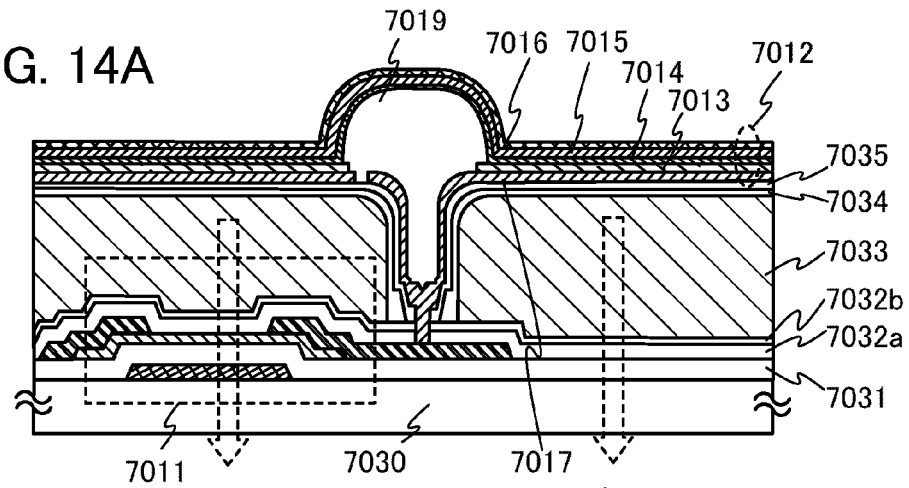
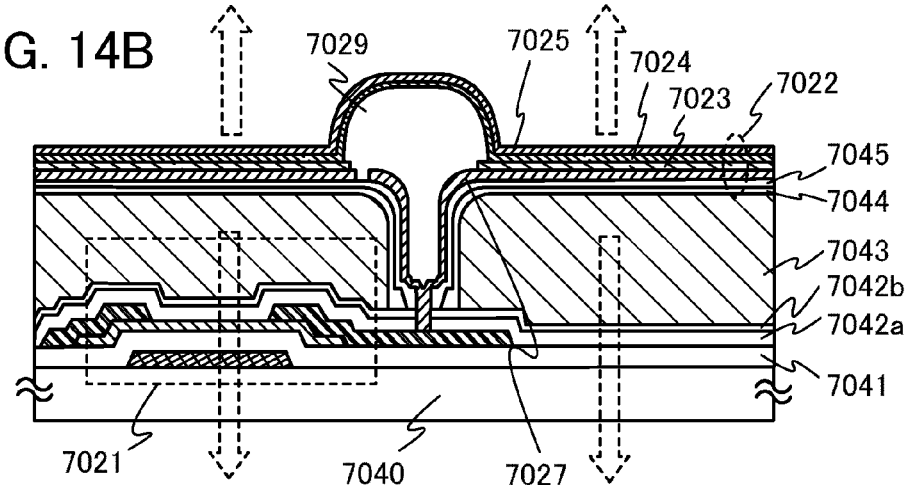
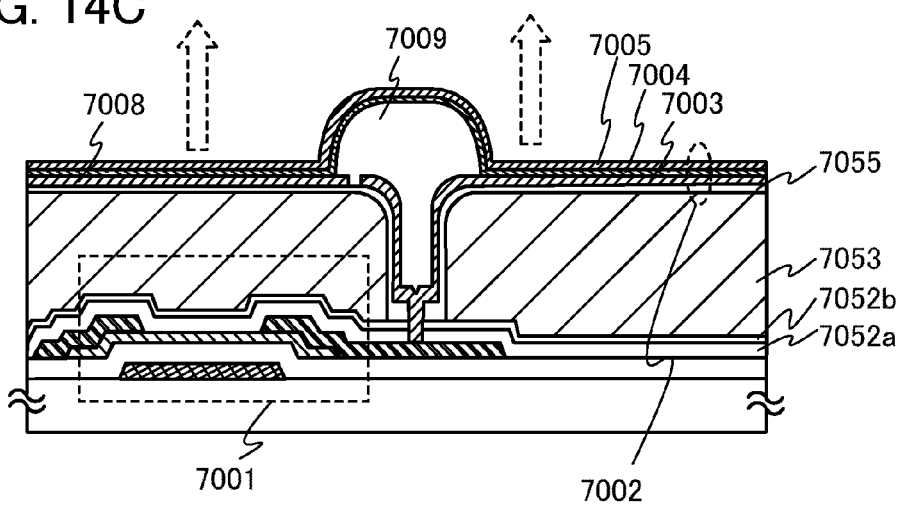

METHOD FOR MANUFACTURING SEMICONDUCTOR ELEMENT AND SEMICONDUCTOR DEVICE, AND DEPOSITION APPARATUS

TECHNICAL FIELD

The present invention relates to a method for manufacturing a semiconductor element and a semiconductor device including an oxide semiconductor and relates to a deposition apparatus.

The semiconductor device in this specification refers to all devices that can function by utilizing semiconductor characteristics; semiconductor elements and electrical circuits having the semiconductor elements, and electro-optic devices and electronic appliances including semiconductor elements and electrical circuits having the semiconductor elements are all semiconductor devices.

BACKGROUND ART

A transistor formed with a semiconductor thin film that is formed over a flat plate such as a glass substrate, which is typically used in a liquid crystal display device, is referred to as a thin film transistor (TFT). A TFT is an embodiment of semiconductor elements and formed using a semiconductor material such as amorphous silicon or polycrystalline silicon. TFTs formed using amorphous silicon have a low electric field mobility but can respond to increase in size of glass substrates. On the other hand, TFTs formed using polycrystalline silicon have a high electric field mobility but need a crystallization step such as laser annealing and are not always suitable for increase in size of glass substrates.

Thus, a technique in which a TFT is formed using an oxide semiconductor as a semiconductor material and applied to an electronic device or an optical device has attracted attention. For example, Patent Documents 1 and 2 each disclose a technique in which a TFT is formed using zinc oxide or an In—Ga—Zn—O-based oxide semiconductor as a semiconductor material and used for a switching element or the like in an image display device.

A TFT in which a channel formation region (also referred to as a channel region) is provided in an oxide semiconductor can have a higher electric field mobility than a TFT using amorphous silicon. An oxide semiconductor film can be formed at a relatively low temperature by a sputtering method or the like, and a manufacturing process of the TFT using an oxide semiconductor is simpler than that of the TFT using polycrystalline silicon.

TFTs which are formed using such an oxide semiconductor over a glass substrate, a plastic substrate, or the like are expected to be applied to display devices such as a liquid crystal display, an electroluminescent display (also referred to as an EL display), and electronic paper.

REFERENCE

Patent Document

[Patent Document 1] Japanese Published Patent Application No. 2007-123861
[Patent Document 2] Japanese Published Patent Application No. 2007-096055

DISCLOSURE OF INVENTION

However, a semiconductor element including an oxide semiconductor has not had satisfactory properties. For example, a controlled threshold voltage, high operation speed, a relatively easy manufacturing process, and sufficient reliability are required for a thin film transistor including an oxide semiconductor film.

The concentration of carriers in an oxide semiconductor film has influence on the threshold voltage of a thin film transistor including the oxide semiconductor. The carriers in the oxide semiconductor film are generated due to an impurity contained in the oxide semiconductor film. For example, an impurity such as a compound containing a hydrogen atom such as $H_2O$, a compound containing a carbon atom, a hydrogen atom, or a carbon atom, which is contained in the formed oxide semiconductor film, causes an increase in the carrier concentration in the oxide semiconductor film.

It is difficult to control the threshold voltage of a thin film transistor including an oxide semiconductor film which contains an impurity such as a compound containing a hydrogen atom such as $H_2O$, a compound containing a carbon atom, a hydrogen atom, or a carbon atom for a channel formation region. The present invention is made in view of the foregoing technical background.

Accordingly, an object of one embodiment of the present invention is to provide a deposition apparatus for forming a thin film which contains few impurities such as a compound containing a hydrogen atom, a compound containing a carbon atom, a hydrogen atom, or a carbon atom. Further, an object is to provide a method for forming a thin film containing few impurities. Furthermore, an object is to provide a method for manufacturing a highly reliable semiconductor element including an oxide semiconductor film containing few impurities.

Another object is to provide a semiconductor device including an oxide semiconductor with a controlled threshold voltage, high operation speed, a relatively easy manufacturing process, and sufficient reliability.

In order to achieve the above objects, an impurity having influence on the concentration of carriers in the oxide semiconductor film, e.g., a compound containing a hydrogen atom such as $H_2O$, a compound containing a carbon atom, a hydrogen atom, or a carbon atom, may be removed in a deposition process. Specifically, an oxide semiconductor film may be formed using a deposition apparatus in which sputtering is performed while a target is heated.

That is, an embodiment of the present invention is a method for manufacturing an oxide semiconductor element including the steps of forming a gate electrode over a substrate, forming a gate insulating film over the gate electrode, forming an oxide semiconductor layer over the gate electrode with the gate insulating film therebetween, forming a source electrode and a drain electrode in contact with the oxide semiconductor layer so that end portions of the source electrode and the drain electrode overlap with the gate electrode, and forming an oxide insulating film covering the oxide semiconductor layer between the source electrode and the drain electrode. The substrate is held in a chamber kept in a reduced pressure state, moisture remaining in the chamber is removed and a sputtering gas from which hydrogen and moisture are removed is introduced, and the oxide semiconductor layer is formed over the gate insulating film while a target containing a metal oxide which is provided in the chamber is heated to higher than or equal to room temperature and lower than or equal to 600° C.

In the above-described method, an embodiment of the present invention is a method for manufacturing an oxide semiconductor element in which remaining moisture is removed by evacuation with the use of a cryopump.

Further, an embodiment of the present invention is a method for manufacturing an oxide semiconductor element, in which the metal oxide target contains a metal oxide with an energy gap of larger than or equal to 2 eV and smaller than or equal to 4.5 eV as its main component.

In the above-described method, an embodiment of the present invention is a method for manufacturing an oxide semiconductor element in which the metal oxide target is a metal oxide containing indium, gallium, and zinc.

Further, an embodiment of the present invention is a sputtering apparatus including a substrate and a target in a chamber, an evacuation device for removing moisture remaining in the chamber, and a heating mechanism for heating the target. Moreover, the target contains a metal oxide with an energy gap of larger than or equal to 2 eV and smaller than or equal to 4.5 eV as its main component, and one surface of the target, with which plasma does not collide, is heated.

Further, an embodiment of the present invention is a sputtering apparatus including a substrate and a target fixed to a rotation axis in a chamber, an evacuation device for removing moisture remaining in the chamber, and a heating mechanism for heating the rotating target by irradiation with light.

An embodiment of the present invention is a sputtering apparatus in which the target is irradiated with light which is not transmitted through the substrate.

Note that the ordinal numbers such as "first" and "second" in this specification are used for convenience and do not denote the order of steps and the stacking order of layers. In addition, the ordinal numbers in this specification do not denote particular names which specify the present invention.

Note that in this specification, oxynitride refers to a substance that contains more oxygen atoms than nitrogen atoms and nitride oxide refers to a substance that contains more nitrogen atoms than oxygen atoms. For example, a silicon oxynitride film means a film that includes more oxygen atoms than nitrogen atoms, and oxygen, nitrogen, silicon, and hydrogen at concentrations of 50 at. % to 70 at. %, 0.5 at. % to 15 at. %, 25 at. % to 35 at. %, and 0.1 at. % to 10 at. %, respectively, when they are measured by Rutherford backscattering spectrometry (RBS) and hydrogen forward scattering (HFS). Further, a silicon nitride oxide film means a film that includes more nitrogen atoms than oxygen atoms, and oxygen, nitrogen, silicon, and hydrogen at concentrations of 5 at. % to 30 at. %, 20 at. % to 55 at. %, 25 at. % to 35 at. %, and 10 at. % to 30 at. %, respectively, when they are measured by RBS and HFS. Note that percentages of nitrogen, oxygen, silicon, and hydrogen fall within the ranges given above when the total number of atoms contained in the silicon oxynitride film or the silicon nitride oxide film is defined as 100 at. %.

In this specification, an EL layer refers to a layer provided between a pair of electrodes in a light-emitting element. Accordingly, a light-emitting layer including an organic compound which is a light-emitting substance, between a pair of electrodes, is an embodiment of an EL layer.

Note that in this specification, a light-emitting device refers to an image display device, a light-emitting device, or a light source (including a lighting device). In addition, the light-emitting device includes any of the following modules in its category: a module in which a connector such as an FPC (flexible printed circuit), a TAB (tape automated bonding) tape, or a TCP (tape carrier package) is attached to a light-emitting device; a module having a TAB tape or a TCP provided with a printed wiring board at the end thereof; and a module having an IC (integrated circuit) directly mounted over a substrate over which a light-emitting element is formed by a COG (chip on glass) method.

According to the present invention, a deposition apparatus can be provided in which a thin film which contains few impurities such as a compound containing a hydrogen atom such as $H_2O$, a compound containing a carbon atom, a hydrogen atom, or a carbon atom is formed. Further, a method for forming a thin film containing few impurities can be provided. Furthermore, a method for manufacturing a highly reliable semiconductor element including an oxide semiconductor film containing few impurities can be provided.

In addition, a semiconductor device including an oxide semiconductor with a controlled threshold voltage, high operation speed, a relatively easy manufacturing process, and sufficient reliability can be provided.

BRIEF DESCRIPTION OF DRAWINGS

In the accompanying drawings:

FIGS. 10A to 10C illustrate a semiconductor device according to an embodiment;

FIGS. 14A to 14C each illustrate a semiconductor device according to an embodiment;

BEST MODE FOR CARRYING OUT THE INVENTION

Figure 1A:
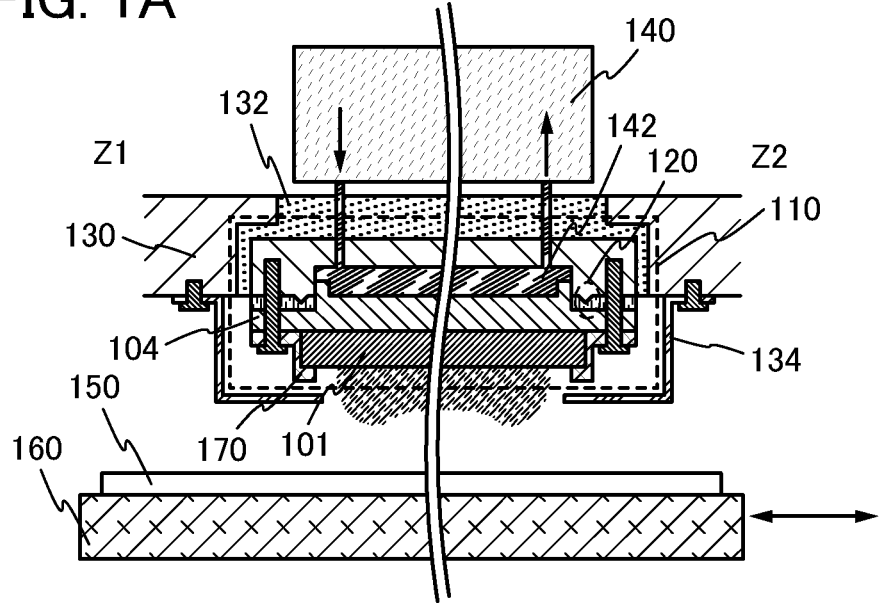
FIGS. 1A and 1B illustrate a deposition apparatus according to an embodiment.

Embodiments will be described in detail with reference to the drawings. Note that the invention is not limited to the following description, and it will be easily understood by those skilled in the art that various changes and modifications can be made without departing from the spirit and scope of the invention. Therefore, the present invention should not be construed as being limited to the description in the following embodiments. Note that in the structures of the invention described below, the same portions or portions having similar functions are denoted by the same reference numerals in different drawings, and description of such portions is not repeated.

(Embodiment 1)

In this embodiment, an apparatus used for forming a thin film containing few impurities will be described. Specifically, a deposition apparatus by which sputtering is performed while a plate-like target is heated will be described.

Figure 1B:
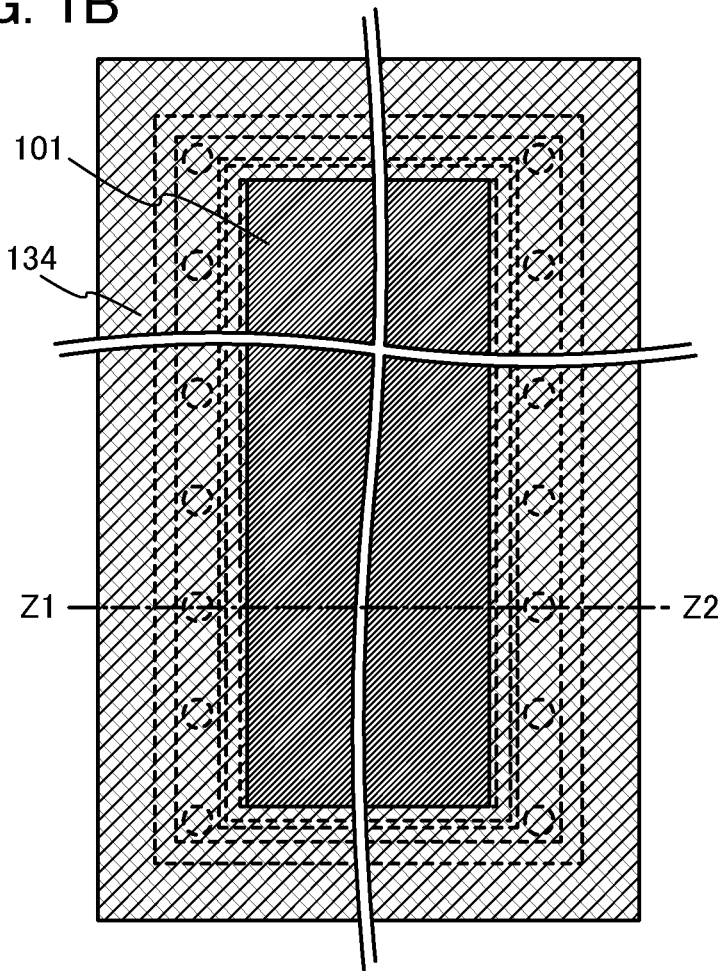

FIGS. 1A and 1B illustrate an example of a mechanism for heating a target, which is included in the deposition apparatus of this embodiment. FIG. 1A is a cross section taken along line Z1-Z2 in FIG. 1B. A plate-like target 101 is pressure-bonded to a backing plate 104 by a flange 170. A back surface of the backing plate 104 is in contact with a heating medium 142 and the heating medium 142 is sealed with a sealing portion 120. The temperature of the heating medium 142 is controlled by a temperature adjustment mechanism 140 connected to the heating medium 142. Note that a cathode portion 110 including the target 101 is fixed to a treatment chamber 130 of the deposition apparatus with an insulator 132 therebetween. Note that the cathode portion 110 is connected to a power source which is not illustrated.

The temperature of the target 101 during film formation is controlled by the temperature adjustment mechanism 140 through the backing plate 104 and the heating medium 142. As the heating medium 142, oil having a high boiling point, such as silicone oil, can be used. As the backing plate 104, metal or ceramics which has high thermal conductivity is preferably used, and a material may be selected in accordance with a process temperature. Further, a heating device which can adjust the temperature of the backing plate from the back surface may be provided instead of the heating medium. For example, an electric heater or a lamp may be provided to the back surface side of the backing plate 104 and a target is heated from the backing plate side so that the temperature may be adjusted. Alternatively, the target 101 may be directly irradiated with light in order to be heated from a top surface.

Note that the target 101 and the backing plate 104 may be fixed to each other with brazing filler metal; however, in the case where the heating temperature is higher than the melting point of the brazing filler metal, the target may be fixed by the flange 170 without using the brazing filler metal. A temperature range in which brazing filler metal can be used varies depending on the kind of brazing filler metal. In the case where the heating temperature is higher than the melting point of the brazing filler material (approximately within a range of 150° C. to 300° C.), a flange is used for fixing.

In the case of forming an oxide semiconductor film, the temperature of a target is set to higher than or equal to 100° C. and lower than or equal to 600° C., preferably higher than or equal to 200° C. and lower than or equal to 400° C.

The heating step of the target 101 is not limited to the above example. The target 101 may be heated before or after film formation in order that an impurity included in the target is removed.

As the target used for forming the oxide semiconductor film, a target which is formed by mixing and sintering magnesium oxide (MgO), zinc oxide (ZnO), alumina ($Al_2O_3$), gallium oxide ($Ga_2O_3$), indium oxide ($In_2O_3$), tin oxide ($SnO_2$), or the like as appropriate may be used.

Further, $SiO_2$ may be added to the target at greater than or equal to 2 wt % and less than or equal to 10 wt % in order that the oxide semiconductor film may include $SiO_x$ (x>0). When the oxide semiconductor film includes $SiO_x$ (x>0), crystallization of the oxide semiconductor film can be prevented. It is particularly preferable in the case of performing heat treatment for dehydration or dehydrogenation since the oxide semiconductor film can be prevented from being excessively crystallized.

By performing sputtering with such a target, as the oxide semiconductor film, a four-component metal oxide film such as an In—Sn—Ga—Zn—O-based film; a three-component metal oxide film such as an In—Ga—Zn—O-based film, an In—Sn—Zn—O-based film, an In—Al—Zn—O-based film, a Sn—Ga—Zn—O-based film, an Al—Ga—Zn—O-based film, or a Sn—Al—Zn—O-based film; a two-component metal oxide film such as an In—Zn—O-based film, a Sn—Zn—O-based film, an Al—Zn—O-based film, a Zn—Mg—O-based film, a Sn—Mg—O-based film, an In—Mg—O-based film, or an In—Ga—O-base film; or an In—O-based film, a Sn—O-based film, or a Zn—O-based film can be used. Silicon oxide may be added to any of the above oxide semiconductor films. Addition of silicon oxide ($SiO_x$ (x>0)) which hinders crystallization to the oxide semiconductor film can suppress crystallization of the oxide semiconductor layer.

As the oxide semiconductor layer, a thin film represented by $InMO_3(ZnO)_m$ (m>0) can be used. Here, M represents one or more metal elements selected from Ga, Al, Mn, and Co. For example, M may be Ga, Ga and Al, Ga and Mn, Ga and Co, or the like. An oxide semiconductor film whose composition formula is represented by $InMO_3(ZnO)_m$ (m>0) where at least Ga is included as M is referred to as the In—Ga—Zn—O-based oxide semiconductor described above, and a thin film thereof is referred to as an In—Ga—Zn—O-based film.

The filling rate of the oxide semiconductor target is greater than or equal to 90% and less than or equal to 100%, preferably, greater than or equal to 95% and less than or equal to 99.9%. With the use of the oxide semiconductor target having a high filling rate, a space to adsorb an impurity such as moisture can be removed, generation of nodules is prevented, uniform discharge is possible, and generation of particles can be suppressed. The formed oxide semiconductor film is a dense film. As a result, an impurity concentration is reduced and an oxide semiconductor film with a uniform quality can be obtained.

In this embodiment, as the target 101, an oxide semiconductor including In, Ga, and Zn (composition ratio of $In_2O_3$:$Ga_2O_3$:ZnO=1:1:1 [mol %], In:Ga:Zn=1:1:0.5 [at. %]) is used to form an In—Ga—Zn—O-based film.

There is no limitation on relative arrangement of a substrate 150 and the target 101 as long as a uniform film can be formed. In FIG. 1A, an example where the substrate 150 is placed to face part of the target 101 which is positioned in an opening portion of a shield 134 is illustrated. A stage 160 holding the substrate 150 swings in film formation while keeping parallel to the target 101, whereby a thin film formed over the substrate 150 has a uniform thickness. Note that the stage 160 does not necessarily move relatively to the target in film formation; the stage 160 may stop. Further, a method for moving the stage 160 relatively to the target is not limited to swing; the stage 160 may be rotated.

The stage 160 may be provided with a substrate heating mechanism. A film is formed while a substrate is heated, so that stress caused inside an oxide semiconductor film to be formed can be relieved. In addition, damage by sputtering can be reduced. Further, an impurity having high vapor pressure can be prevented from entering an oxide semiconductor film to be formed. Note that the substrate temperature is set to higher than or equal to room temperature and lower than or equal to 600° C. in film formation, preferably higher than or equal to 200° C. and lower than or equal to 400° C.

Note that in this embodiment, the distance between the substrate 150 and the target 101 is 100 mm, for example.

Note that a deposition chamber where an oxide semiconductor film is formed is provided with a cryopump as an evacuation unit. The evacuation unit may be a turbo pump provided with a cold trap.

When the deposition chamber is evacuated with a cryopump or a turbo pump provided with a cold trap, for example, a compound containing a hydrogen atom such as $H_2O$ or a compound containing a carbon atom can be removed. In this embodiment, an impurity eliminated from the target 101 due to heating can be removed, which is particularly effective. As a result, the impurity concentration in the oxide semiconductor film formed in the deposition chamber can be reduced.

The oxide semiconductor film is formed by a sputtering method in a rare gas (typically argon) atmosphere, an oxygen atmosphere, or an atmosphere of a rare gas (typically argon) and oxygen. In this embodiment, film formation is performed with oxygen (the proportion of the oxygen flow is 100%) as a sputtering gas and under a pressure of 0.6 Pa.

A variety of methods for causing a sputtering phenomenon can be applied to the deposition apparatus used for performing sputtering with a target being heated, which is described in this embodiment. Examples of a sputtering method include an RF sputtering method in which a high-frequency power source is used as a sputtering power source, a DC sputtering method, and a pulsed DC sputtering method in which a bias is applied in a pulsed manner. An RF sputtering method is mainly used for forming an insulating film, and a DC sputtering method is mainly used for forming a metal conductive film.

In addition, there are a sputtering apparatus provided with a magnet system inside the chamber and used for a magnetron sputtering method, and a sputtering apparatus used for an ECR sputtering method in which plasma generated with the use of microwaves is used without using glow discharge.

Furthermore, as a deposition method by sputtering, there are also a reactive sputtering method in which a target substance and a sputtering gas component are chemically reacted with each other during deposition to form a thin compound film thereof, and a bias sputtering method in which a voltage is also applied to a substrate during deposition.

In addition, there is also a multi-source sputtering method in which a plurality of targets of different materials is set. With the multi-source sputtering method, films of different materials can be formed to be stacked in the same chamber, or a film of plural kinds of materials can be formed by performing sputtering at the same time in the same chamber.

In this embodiment, a direct current (DC) power source of 0.5 kW is used as a power source. Note that a pulse direct current (DC) power source is preferable because dust can be reduced and a film thickness can be uniform.

With the use of the deposition apparatus disclosed in this embodiment, a target is heated and thus an impurity contained in the target is eliminated, so that the impurity can be removed. As a result, a thin film formed using the deposition apparatus contains few impurities. For example, impurities such as a compound containing a hydrogen atom such as $H_2O$, a compound containing a carbon atom, a hydrogen atom, or a carbon atom can be reduced.

Further, the oxide semiconductor film formed using a heated target in the deposition apparatus in this embodiment contains few impurities. For example, according to a technical idea of the present invention, an oxide semiconductor film which has an ideal hydrogen concentration of zero or close to zero can be formed.

This embodiment can be combined with any of the other embodiments in this specification as appropriate.

(Embodiment 2)

In this embodiment, a deposition apparatus which differs in structure from the deposition apparatus in Embodiment 1 will be described. Specifically, a deposition apparatus in which sputtering is performed while a rotating cylindrical target is heated will be described.

Figure 2A:
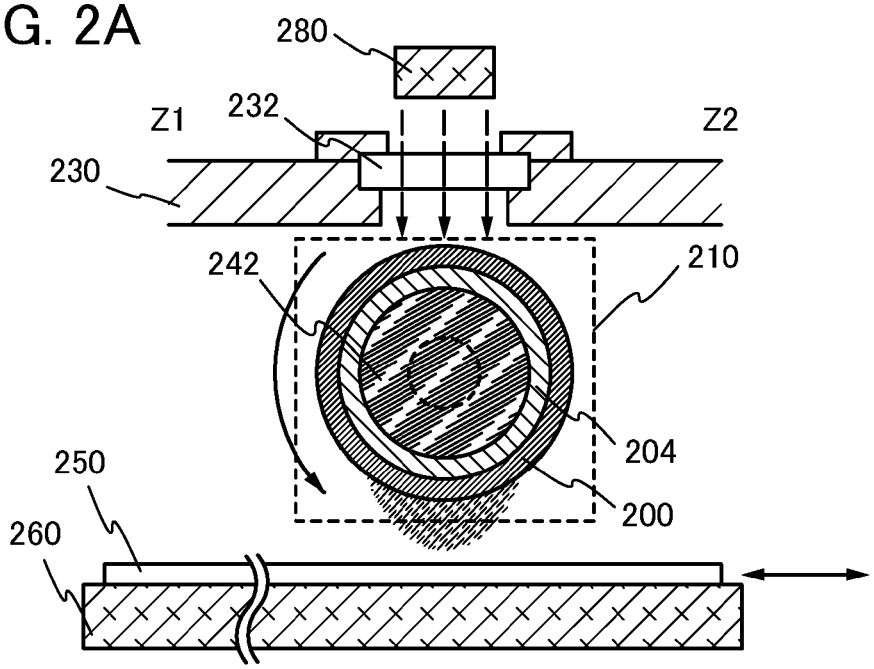
FIGS. 2A and 2B illustrate a deposition apparatus according to an embodiment.
Figure 2B:
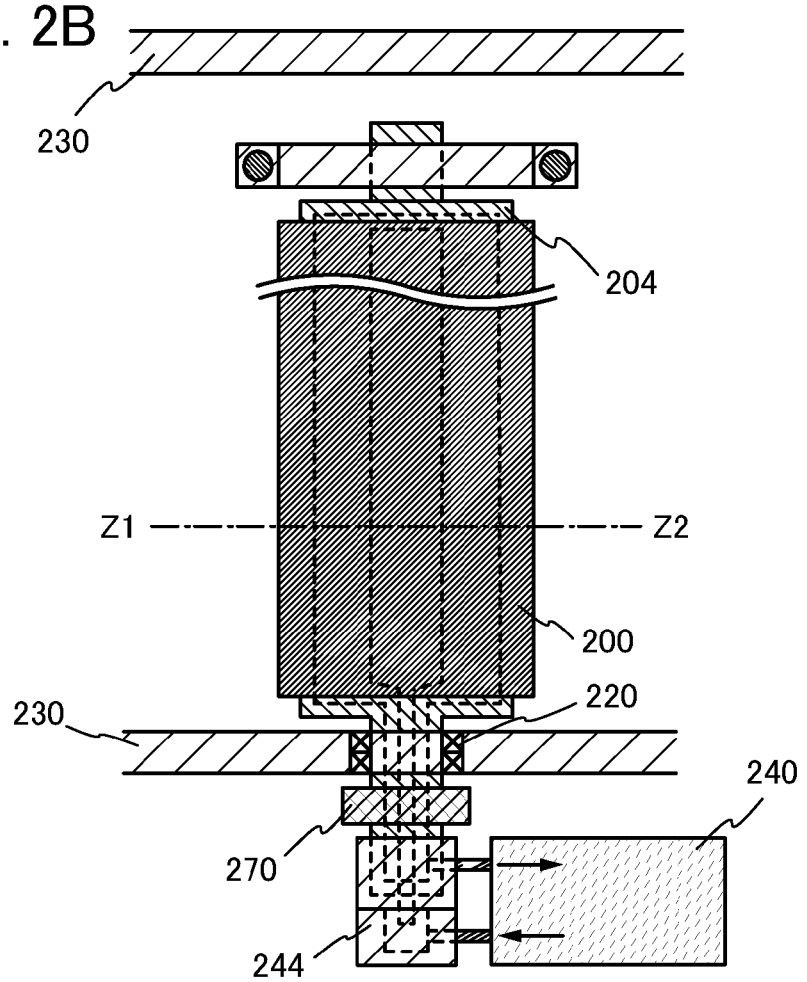

FIGS. 2A and 2B illustrate an example of a mechanism for heating a cylindrical target in the deposition apparatus of this embodiment. FIG. 2A is a cross section taken along line Z1-Z2 in FIG. 2B. A cylindrical target 200 is fixed to a cylinder 204 which is inserted into the cylindrical target 200. A heating medium 242 circulates inside the cylinder 204. One end of the cylinder 204 is supported in a state where the cylinder 204 can be rotated in a treatment chamber divided from the outside by an outer wall 230 of the deposition apparatus. The other end of the cylinder 204 extends outside the outer wall 230 of the deposition apparatus through a sealing portion 220. Note that the sealing portion 220 supports the cylinder 204 in a state where the cylinder 204 can be rotated while airtightness of the outer wall 230 is kept (see FIG. 2B).

A rotation mechanism 270 provided outside the outer wall 230 rotates the cylinder 204. The cylindrical target 200 is rotated in the treatment chamber in accordance with rotation of the inserted cylinder 204. Note that a cathode portion 210 including the target 200 is electrically insulated from the outer wall 230 of the deposition apparatus with the sealing portion 220 having an insulating property therebetween. Note that the cathode portion 210 is electrically connected to a power source which is not illustrated.

The heating medium 242 in the cylinder 204 circularly flows between the cylinder 204 and a temperature adjustment mechanism 240 through a connection portion 244. The temperature of the heating medium 242 is controlled by the temperature adjustment mechanism 240.

The temperature of the target 200 during film formation is controlled by the temperature adjustment mechanism 240 through the cylinder 204 and the heating medium 242. The heating medium 242 can be formed using the same material as the heating medium described in Embodiment 1. Further, a heating device which can adjust the temperature of the target 200 may be provided instead of the heating medium. For example, an electrical heater or a lamp may be provided inside the cylinder 204 and the target 200 is heated from the cylinder 204 side so that the temperature may be adjusted.

Alternatively, a surface of the target may be heated by light. In the deposition apparatus described in this embodiment, a window 232 having a light-transmitting property is provided for the outer wall 230. A light source 280 is placed outside the outer wall 230 and light is emitted to the target 200 through the window 232; thus, the target may be heated from a surface. As a light source, a lamp such as a halogen lamp, a metal halide lamp, a xenon arc lamp, a carbon arc lamp, a high pressure sodium lamp, or a high pressure mercury lamp or a linear laser beam can be used.

Note that in this embodiment, since the rotation mechanism 270 rotates the target 200, the entire surface of the target 200 can be heated by the light source 280. Further, the target 200 is rotated and consumed uniformly; accordingly, waste of the target can be reduced and use efficiency can be increased.

As a method for fixing the target 200 to the cylinder 204, there is a method in which thermal expansion of the cylinder 204 is set to be larger than that of the target 200. For example, the cylinder 204 is cooled by a refrigerant and a diameter thereof is made to shrink; then, the cylinder 204 is inserted into the target 200 whose internal diameter is expanded by heating; and the temperature of the cylinder 204 is increased after a position of the cylinder 204 is decided; thus, the target 200 can be fixed to the cylinder 204.

In the case of forming an oxide semiconductor film, the temperature of a target is set to higher than or equal to 100° C. and lower than or equal to 600° C., preferably higher than or equal to 200° C. and lower than or equal to 400° C.

The heating step of the target 200 is not limited to the above example. The target 200 may be heated before or after film formation in order that an impurity included in the target is removed.

The target for forming the oxide semiconductor film can be formed using the same material as the target described in Embodiment 1; therefore, detailed description is omitted here.

A substrate 250 is placed parallel to a rotation axis of the target 200. In this embodiment, a stage 260 holding the substrate 250 swings in film formation while keeping parallel to the rotation axis of the target 200, whereby a thin film formed over the substrate 250 has a uniform thickness.

The stage 260 may be provided with a substrate heating mechanism. A film is formed while a substrate is heated, so that stress caused inside an oxide semiconductor film to be formed can be relieved. In addition, damage by sputtering can be reduced. Further, an impurity having high vapor pressure can be prevented from entering an oxide semiconductor film to be formed. Note that the substrate temperature is set to higher than or equal to room temperature and lower than or equal to 600° C. in film formation, preferably higher than or equal to 200° C. and lower than or equal to 400° C.

Note that in this embodiment, the distance between the substrate 250 and the target 200 is 100 mm, for example.

Note that a deposition chamber where an oxide semiconductor film is formed is provided with a cryopump as an evacuation unit as in Embodiment 1. The evacuation unit may be a turbo pump provided with a cold trap.

The oxide semiconductor film is formed by a sputtering method in a rare gas (typically argon) atmosphere, an oxygen atmosphere, or an atmosphere of a rare gas (typically argon) and oxygen.

As in Embodiment 1, a variety of methods for causing a sputtering phenomenon can be applied to a deposition apparatus used for sputtering with a target being heated, which is described in this embodiment. Description thereof is omitted here.

A thin film formed using the deposition apparatus disclosed in this embodiment contains few impurities. Therefore, according to this embodiment, a deposition apparatus can be provided in which a thin film which contains few impurities such as a compound containing a hydrogen atom such as $H_2O$, a compound containing a carbon atom, a hydrogen atom, or a carbon atom can be formed.

Further, the oxide semiconductor film formed using a heated target in the deposition apparatus in this embodiment contains few impurities. For example, according to a technical idea of the present invention, an oxide semiconductor film which has an ideal hydrogen concentration of zero or close to zero can be formed.

Further, with the use of a method for heating a rotating target by irradiation of a surface with light, an impurity can be removed from the surface of the target. Since film formation is performed by sputtering the target just after the impurity is removed, a thin film with very few impurities can be formed. Further, the target is consumed uniformly while being rotated, so that use efficiency of the target can be increased.

Note that this embodiment can be combined with any of the other embodiments in this specification as appropriate.

(Embodiment 3)

In this embodiment, a deposition apparatus used for forming a thin film containing few impurities will be described. Specifically, a deposition apparatus including a treatment chamber for heating a substrate, a treatment chamber for cooling the substrate, and a treatment chamber for performing sputtering while a target is heated will be described. Further, a method for forming an oxide semiconductor film using the apparatus will be described.

Figure 3:
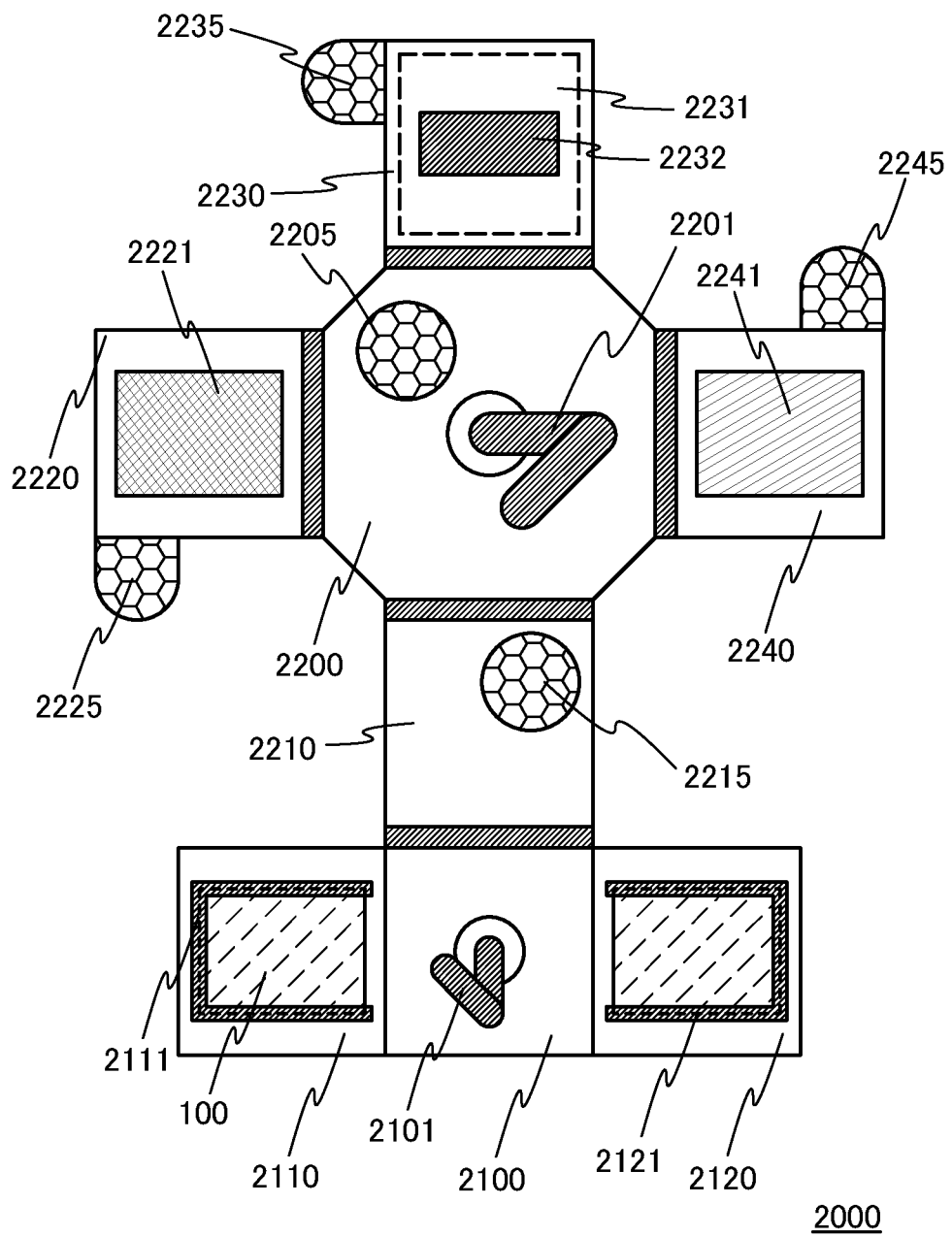
FIG. 3 illustrates a deposition apparatus according to an embodiment.

A deposition apparatus 2000 used in this embodiment is illustrated in FIG. 3. The deposition apparatus 2000 includes a load chamber 2110 and an unload chamber 2120. The load chamber 2110 and the unload chamber 2120 are respectively provided with a cassette 2111 which stores a substrate before treatment and a cassette 2121 which stores a substrate after treatment. A first transfer chamber 2100 is provided between the load chamber 2110 and the unload chamber 2120, and is provided with a transfer mechanism 2101 which transfers a substrate.

In addition, the deposition apparatus 2000 includes a second transfer chamber 2200. The second transfer chamber 2200 is provided with a transfer unit 2201. Four treatment chambers (a first treatment chamber 2210, a second treatment chamber 2220, a third treatment chamber 2230, and a fourth treatment chamber 2240) are connected to the second transfer chamber 2200 through gate valves, and are arranged around the second transfer chamber 2200. Note that one side of the first treatment chamber 2210 is connected to the first transfer chamber 2100 through a gate valve, and the other side of the first treatment chamber 2210 is connected to the second transfer chamber 2200 through another gate valve.

Note that the pressure in the first transfer chamber 2100, the load chamber 2110, and the unload chamber 2120 is atmospheric pressure. The second transfer chamber 2200, the first treatment chamber 2210, the second treatment chamber 2220, the third treatment chamber 2230, and the fourth treatment chamber 2240 are respectively provided with an evacuation unit 2205, an evacuation unit 2215, an evacuation unit 2225, an evacuation unit 2235, and an evacuation unit 2245, so that a reduced-pressure state can be realized. Although the evacuation unit may be selected in accordance with the use application of each treatment chamber, an evacuation unit such as a cryopump is particularly preferable. Alternatively, as the evacuation unit, a turbo pump provided with a cold trap may be used.

An evacuation unit such as a cryopump is preferably used in order to prevent impurities from being contained in steps before and after formation of the oxide semiconductor film, and needless to say, in a treatment chamber for forming a highly purified oxide semiconductor film.

The first treatment chamber 2210 serves as a delivery chamber for transferring a substrate from the first transfer chamber 2100 in an atmospheric pressure state into the second transfer chamber 2200 in a reduced pressure state. By provision of the delivery chamber, the second transfer chamber 2200 can be protected from being contaminated by air.

The second treatment chamber 2220 is provided with a substrate heating mechanism 2221. As the substrate heating mechanism, a hot plate, rapid thermal annealing (RTA), or the like can be used.

The third treatment chamber 2230 is provided with a sputtering apparatus 2231. The sputtering apparatus 2231 includes at least a target 2232, an electrode, a power source, a substrate supporting mechanism, a target heating mechanism, and a substrate heating mechanism. Note that since the sputtering apparatus 2231 is the same as the sputtering apparatus described in Embodiment 1 or 2, detailed description is omitted here.

The fourth treatment chamber 2240 is provided with a substrate cooling mechanism 2241. As the substrate cooling mechanism, a substrate supporting table serving as a heat sink, an introduction port for cooling gas, or the like is provided.

Next, a method for forming an oxide semiconductor film with the use of the deposition apparatus 2000 described. Here, a method for forming the oxide semiconductor film over a substrate over which a gate electrode and a gate insulating film on the gate electrode are formed in advance is described. Note that the deposition method can be applied to a manufacturing process of the thin film transistor, as an example.

First, the transfer mechanism 2101 transfers a substrate 100 in which a gate insulating film is formed over a gate electrode from the cassette 2111 to the first treatment chamber in an atmospheric pressure state. Next, the gate valve is closed, and the first treatment chamber 2210 is evacuated. When the pressure in the first treatment chamber 2210 and the pressure in the second transfer chamber 2200 are substantially equal, the gate valve is opened and the substrate 100 is transferred from the first treatment chamber 2210 to the second treatment chamber 2220 through the second transfer chamber 2200.

Next, the substrate 100 is preheated by the substrate heating mechanism 2221 in the second treatment chamber 2220, so that impurities adsorbed on the substrate are eliminated and the impurities are removed. Examples of the impurities are a compound containing a hydrogen atom, a compound containing a carbon atom, and the like. Note that the temperature at the preheating is higher than or equal to room temperature and lower than or equal to 600° C., preferably higher than or equal to 100° C. and lower than or equal to 400° C. As an evacuation unit provided for the second treatment chamber 2220, a cryopump is preferably used. Since impurities adsorbed on the substrate 100 are eliminated by the preheating and diffused into the second treatment chamber 2220, the impurities should be evacuated from the second treatment chamber 2220 with the use of a cryopump. After preheating, the substrate 100 is transferred to the third treatment chamber 2230.

Next, an oxide semiconductor film is formed over the substrate 100 by the sputtering apparatus 2231 in the third treatment chamber 2230. Note that as for the sputtering apparatus 2231 and the method for forming an oxide semiconductor film with the sputtering apparatus 2231, the sputtering apparatus and the method which are described in Embodiment 1 or 2 can be applied; therefore, detailed description is omitted here.

The oxide semiconductor film is formed while the target 2232 is heated. In this embodiment, the target 2232 is heated to higher than or equal to 100° C. and lower than or equal to 600° C., preferably higher than or equal to 200° C. and lower than or equal to 400° C. By heating the target 2232 in film formation, the impurity concentration in the formed oxide semiconductor film can be reduced.

The oxide semiconductor film is formed while the substrate is heated. In this embodiment, the oxide semiconductor film is formed while the substrate is heated to higher than or equal to room temperature and lower than or equal to 600° C., preferably higher than or equal to 100° C. and lower than or equal to 400° C. Film formation is performed while a substrate is heated, whereby an impurity is unlikely to be adsorbed on a surface of the oxide semiconductor film in film formation and thus, the impurity concentration in the oxide semiconductor film can be reduced.

The third treatment chamber 2230 is evacuated with use of a cryopump or the like, so that the impurity concentration in the treatment chambers is reduced. In an oxide semiconductor film formed in a treatment chamber where impurities are reduced, the impurity concentration is suppressed. Specifically, hydrogen concentration in the oxide semiconductor film can be reduced.

After that, the substrate 100 is transferred to the fourth treatment chamber 2240. The substrate 100 is cooled from the substrate temperature (T° C.) in formation of the oxide semiconductor film to such a low temperature that an impurity such as water is prevented from entering again. Specifically, slow cooling is performed so that the temperature becomes 100° C. or more lower than the substrate temperature (T° C.) in film formation. Cooling may be performed with nitrogen or a rare gas such as helium, neon, or argon introduced into the fourth treatment chamber 2240. Note that it is preferable that water, hydrogen, or the like be not included in nitrogen or a rare gas such as helium, neon, or argon which is used for the cooling. The purity of nitrogen or a rare gas such as helium, neon, or argon is preferably 6N (99.9999%) or more, more preferably 7N (99.99999%) or more (that is, the impurity concentration is 1 ppm or less, preferably 0.1 ppm or less). Note that high purity oxygen may be added to high purity nitrogen or a high purity rare gas such as helium, neon, or argon which is used for the cooling.

As described above, an oxide semiconductor thin film which contains few impurities such as a compound containing a hydrogen atom, a compound containing a carbon atom, a hydrogen atom, or carbon atom can be obtained.

A structure in which three or more treatment chambers are connected through a transfer chamber is employed in this embodiment; however, there is no limitation to this structure. For example, a so-called in-line structure in which the entrance and the exit for the substrate are provided and the treatment chambers are connected to each other may be employed.

An oxide semiconductor film can be formed using a heated target with the deposition apparatus described in this embodiment. An oxide semiconductor film formed using a heated target contains few impurities. For example, according to a technical idea of the present invention, an oxide semiconductor film which has an ideal hydrogen concentration of zero or close to zero can be formed.

With the use of the deposition apparatus described in this embodiment, while the substrate is heated, an oxide semiconductor film can be formed using a target in which impurities are reduced by heating in a treatment chamber where an impurity is reduced by evacuation with a cryopump. With the use of the deposition apparatus, a thin film in which an impurity is reduced can be formed.

Further, an impurity adsorbed on the target, the substrate, and the inner wall of the treatment chamber are eliminated, whereby the impurity entering the target, the substrate in film formation, and the oxide semiconductor film can be reduced. Furthermore, the substrate is cooled after film formation in a high purity inert gas, so that an impurity is prevented from being adsorbed on the substrate.

Further, according to this embodiment, a deposition apparatus can be provided in which a thin film which contains few impurities such as a compound containing a hydrogen atom such as $H_2O$, a compound containing a carbon atom, a hydrogen atom, or a carbon atom can be formed.

This embodiment can be combined with any of the other embodiments in this specification as appropriate.

(Embodiment 4)

In this embodiment, a method for forming a semiconductor element with the use of an oxide semiconductor film formed by the deposition apparatus described in any of Embodiments 1 to 3 will be described. Note that in this embodiment, a structure of a thin film transistor illustrated in FIG. 4 and a manufacturing method thereof will be described as an example of a semiconductor element.

Figure 4:
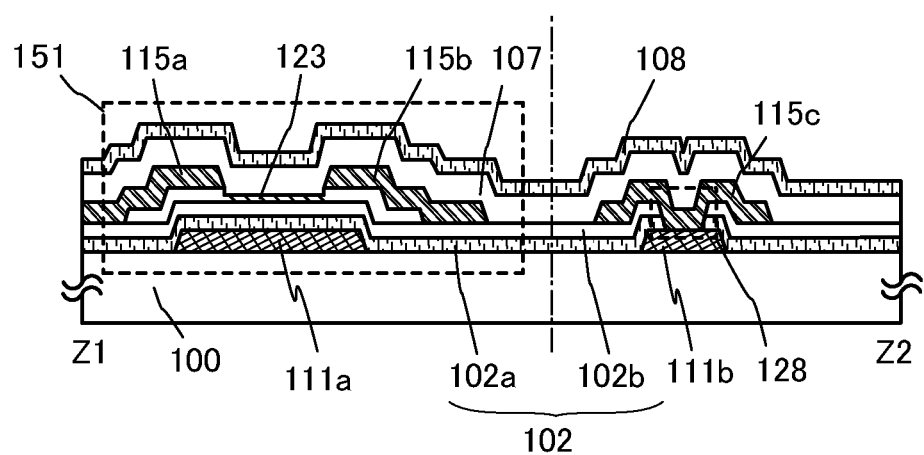
FIG. 4 illustrates a semiconductor device according to an embodiment.

FIG. 4 is a cross-sectional view illustrating a thin film transistor 151 of this embodiment. In the thin film transistor 151, a gate electrode 111a and a gate wiring layer 111b are formed over a substrate 100, and a gate insulating layer 102 is formed over the gate electrode 111a and the gate wiring layer 111b. The gate insulating layer 102 is a stack of a first gate insulating layer 102a and a second gate insulating layer 102b. An oxide semiconductor layer 123 is formed over the gate electrode 111a with the gate insulating layer 102 therebetween. A source electrode layer and a drain electrode layer (denoted by 115a and 115b) are formed so that end portions of the source electrode layer and the drain electrode layer overlap with the gate electrode 111a. An oxide insulating film 107 is formed to be in contact with an oxide semiconductor layer 123 which is interposed between the source electrode layer and the drain electrode layer (denoted by 115a and 115b) over the gate electrode 111a. A protective insulating layer 108 is formed over the oxide insulating film 107.

A contact hole 128 is formed in the gate insulating layer 102 to reach the gate wiring layer 111b. The gate wiring layer 111b and a second wiring layer 115c are connected to each other through the contact hole 128.

A method for manufacturing the thin film transistor 151 of this embodiment is described with reference to FIGS. 5A, 5B, 5C, and 5D. FIGS. 5A to 5D are cross-sectional views illustrating a method for manufacturing the thin film transistor of this embodiment.

As a glass substrate used for the substrate 100, in the case where the temperature of the heat treatment is high, a glass substrate whose strain point is 730° C. or higher is preferably used. As a glass substrate, a glass material such as aluminosilicate glass, aluminoborosilicate glass, or barium borosilicate glass is used, for example. By containing a larger amount of barium oxide (BaO) than boron oxide, a more practical heat-resistant glass substrate can be obtained. Therefore, a glass substrate containing BaO and $B_2O_3$ so that the amount of BaO is larger than that of $B_2O_3$ is preferably used.

Note that as the above glass substrate, a substrate formed of an insulator such as a ceramic substrate, a quartz substrate, or a sapphire substrate may be used. Alternatively, crystallized glass or the like may be used.

An insulating film serving as a base film may be formed between the substrate 100, and the gate electrode 111a and the gate wiring layer 111b, which are described below. The base film has a function of preventing diffusion of an impurity element from the substrate 100, and can be formed to have a single-layer or stacked-layer structure using one or more of a silicon nitride film, a silicon oxide film, a silicon nitride oxide film, and a silicon oxynitride film.

After formation of a conductive film over the substrate 100 having an insulating surface, a first wiring layer including the gate electrode 111a and the gate wiring layer 111b is formed through a first photolithography step. Note that the end portions of the formed gate electrodes are preferably tapered.

Note that a resist mask may be formed by an inkjet method. Formation of the resist mask by an inkjet method needs no photomask; thus, manufacturing cost can be reduced.

As the conductive film for forming the gate electrode 111a and the gate wiring layer 111b, an element selected from Al, Cr, Ta, Ti, Mo, or W, an alloy containing any of these elements as a component, an alloy containing any of these elements in combination, or the like can be used. The conductive film can be a single layer or a stack formed using a metal material such as copper, neodymium, or scandium, or an alloy material containing any of these materials as a main component, in addition to the above metal. Note that the gate electrode can also be formed using a light-transmitting conductive film. As an example of a material of the light-transmitting conductive film, a transparent conductive oxide or the like can be given.

Next, the gate insulating layer 102 is formed. As the gate insulating layer 102, a single-layer film or a stacked film of any of a silicon oxide layer, a silicon oxynitride layer, a silicon nitride oxide layer, a silicon nitride layer, an aluminum oxide layer, a tantalum oxide layer, and the like can be used. The gate insulating layer 102 is formed to have a thickness of from 50 nm to 250 nm inclusive with a CVD method, a sputtering method, or the like. Note that the gate insulating layer 102 may be doped with phosphorus (P) or boron (B).

An oxide insulating layer is preferably formed on a side of the gate insulating layer 102, which is in contact with an oxide semiconductor layer. In this embodiment, silicon nitride is used for the first gate insulating layer 102a and silicon oxide is used for the second gate insulating layer 102b. An i-type or substantially i-type oxide semiconductor achieved by removal of impurities (a highly purified oxide semiconductor) which is used in this embodiment is extremely sensitive to interface state density and interface charge. Therefore, an interface with an insulating film is important. Accordingly, an insulating film which is in contact with a highly purified oxide semiconductor is required to have high quality.

For example, high density plasma CVD using μ waves (2.45 GHz) is preferably used since a high-quality dense insulating film having high withstand voltage can be formed. This is because close contact between a highly purified oxide semiconductor and a high-quality gate insulating film can reduce interface state density and provide favorable interface characteristics.

In addition, since the insulating film formed by using the high-density plasma CVD apparatus can have a certain thickness, the insulating film has excellent step coverage. Further, the thickness of a thin insulating film formed with the high-density plasma CVD apparatus can be controlled precisely.

Needless to say, another deposition method such as a sputtering method or a plasma CVD method can be used as long as a favorable insulating film can be formed as a gate insulating film. Further, an insulating film may be used in which quality of the gate insulating film or interface characteristics with an oxide semiconductor is modified by heat treatment after film formation. In any cases, an insulating film is acceptable as long as the insulating film has favorable quality as a gate insulating film, interface state density with an oxide semiconductor is reduced, and a favorable interface is formed.

The gate insulating layer 102 is formed using a high-density plasma CVD apparatus. Here, a high-density plasma CVD apparatus refers to an apparatus which can realize a plasma density greater than or equal to $1 \times 10^{11}/cm^3$. For example, plasma is generated by applying a microwave power of 3 kW to 6 kW so that the insulating film is formed.

A monosilane gas ($SiH_4$), nitrous oxide ($N_2O$), and a rare gas are introduced into a chamber as a source gas to generate high-density plasma at a pressure of 10 Pa to 30 Pa so that an insulating film is formed over a substrate having an insulating surface, such as a glass substrate. After that, the supply of a monosilane gas is stopped, and nitrous oxide ($N_2O$) and a rare gas are introduced without exposure to the air, so that plasma treatment may be performed on a surface of the insulating film. The plasma treatment performed on the surface of the insulating film by introducing nitrous oxide ($N_2O$) and a rare gas is performed at least after the insulating film is formed. The insulating film formed through the above process procedure has a small thickness and reliability can be ensured even with a thickness of less than 100 nm, for example.

In forming the gate insulating layer 102, the flow ratio of a monosilane gas ($SiH_4$) to nitrous oxide ($N_2O$) which are introduced into the chamber is in a range of 1:10 to 1:200. In addition, as a rare gas which is introduced into the chamber, helium, argon, krypton, xenon, or the like can be used. In particular, argon, which is inexpensive, is preferably used.

In addition, since the insulating film formed by using the high-density plasma apparatus can have certain thickness, the insulating film has excellent step coverage. Further, as for the insulating film formed by using the high-density plasma apparatus, the thickness of a thin film can be controlled precisely.

The insulating film formed through the above process procedure is greatly different from the insulating film formed using a conventional parallel plate plasma CVD apparatus. The etching rate of the insulating film formed through the above process procedure is lower than that of the insulating film formed using the conventional parallel plate plasma CVD apparatus by 10% or more or 20% or more in the case where the etching rates with the same etchant are compared to each other. Thus, it can be said that the insulating film formed using the high-density plasma apparatus is a dense film.

Alternatively, the gate insulating layer 102 can be formed of a silicon oxide layer by a CVD method using an organosilane gas. As an organosilane gas, a silicon-containing compound such as tetraethoxysilane (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), or trisdimethylaminosilane (chemical formula: $SiH(N(CH_3)_2)_3$) can be used.

Alternatively, the gate insulating layer 102 may be formed using one kind of oxide, nitride, oxynitride, and nitride oxide of aluminum, yttrium, or hafnium; or a compound including at least two or more kinds of the above.

Further, the gate insulating layer 102 and the oxide semiconductor film 103 may be formed successively. For example, when a multi-chamber sputtering apparatus provided with a target of silicon or silicon oxide (artificial quartz) and a target for oxide semiconductor film is used, successive film formation can be performed without the gate insulating layer 102 being exposed to air.

Then, an oxide semiconductor film is formed over the gate insulating layer 102. As the oxide semiconductor film, a four-component metal oxide film such as an In—Sn—Ga—Zn—O-based film; a three-component metal oxide film such as an In—Ga—Zn—O-based film, an In—Sn—Zn—O-based film, an In—Al—Zn—O-based film, a Sn—Ga—Zn—O-based film, an Al—Ga—Zn—O-based film, or a Sn—Al—Zn—O-based film; or a two-component metal oxide film such as an In—Zn—O-based film, a Sn—Zn—O-based film, an Al—Zn—O-based film, a Zn—Mg—O-based film, a Sn—Mg—O-based film, an In—Mg—O-based film, or an In—Ga—O-base film; an In—O-based film, a Sn—O-based film, or a Zn—O-based film can be used. $SiO_2$ may be included in any of the above oxide semiconductor films.

As the oxide semiconductor film, a thin film represented by $InMO_3(ZnO)_m$ (m>0) can be used. Here, M represents one or more metal elements selected from Ga, Al, Mn, and Co. For example, M may be Ga, Ga and Al, Ga and Mn, Ga and Co, or the like. An oxide semiconductor film whose composition formula is represented by $InMO_3(ZnO)_m$ (m>0) where at least Ga is included as M is referred to as the In—Ga—Zn—O-based oxide semiconductor described above, and a thin film thereof is referred to as an In—Ga—Zn—O-based film.

The oxide semiconductor film preferably has a thickness of 5 nm to 30 nm inclusive. Note that an appropriate thickness differs depending on an oxide semiconductor material, and the thickness may be set as appropriate depending on the material.

Figure 5A:
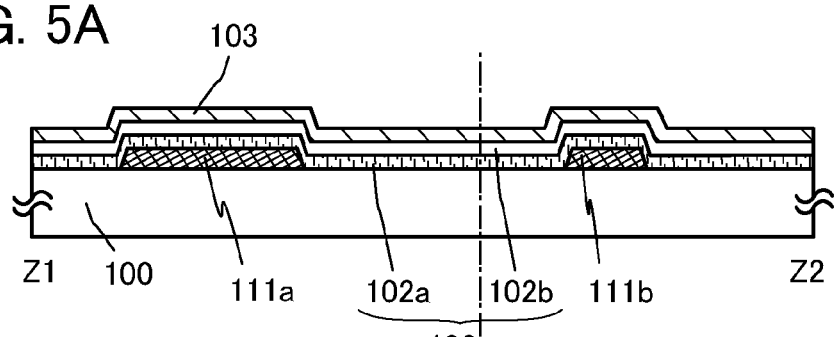
FIGS. 5A to 5D illustrate a method for manufacturing a semiconductor device according to an embodiment.

The oxide semiconductor film is formed using the deposition apparatus and the formation method described in any of Embodiments 1 to 3; therefore, detailed description is omitted here. A cross-sectional view at this stage is illustrated in FIG. 5A.

The oxide semiconductor film formed using the deposition apparatus and the formation method described in any of Embodiments 1 to 3 contains few impurities such as a compound containing a hydrogen atom such as $H_2O$, a compound containing a carbon atom, a hydrogen atom, or a carbon atom. For example, according to a technical idea of the present invention, an oxide semiconductor film which has an ideal hydrogen concentration of zero or close to zero can be formed.

Note that after the oxide semiconductor film is formed, the oxide semiconductor film may be subjected to first heat treatment. Detailed description of the first heat treatment will be made after description of a series of steps of manufacturing a thin film transistor.

Note that before the oxide semiconductor film is formed, dust on a surface of the gate insulating layer 102 is preferably removed by reverse sputtering in which an argon gas is introduced to the sputtering apparatus and plasma is generated. The reverse sputtering refers to a method in which an RF power supply is used for application of voltage to a substrate in an argon atmosphere and plasma is generated in the vicinity of the substrate to modify a surface. Note that instead of an argon atmosphere, a nitrogen atmosphere, a helium atmosphere, an oxygen atmosphere, or the like may be used.

Next, the oxide semiconductor film 103 is processed into an island shape through a second photolithography step, whereby an oxide semiconductor layer 113 is formed.

Note that a resist mask for forming an island-shaped oxide semiconductor layer may be formed by an inkjet method. When the resist mask is formed with an inkjet method, a photomask is not used; therefore, manufacturing costs can be reduced.

Figure 5B:
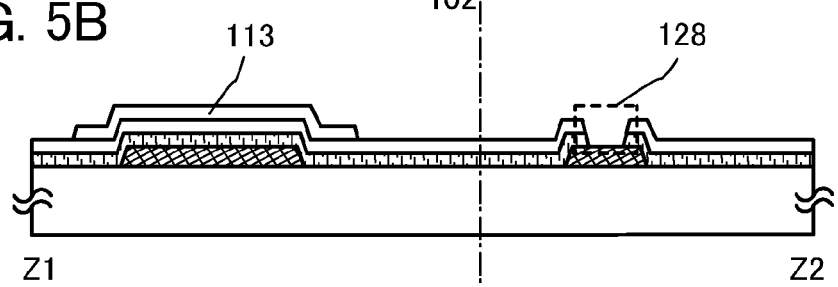

Then, the contact hole 128 is formed in the gate insulating layer 102 through a third photolithography step. Note that reverse sputtering is preferably performed before formation of a conductive film in a subsequent step, so that a resist residue attached to surfaces of the oxide semiconductor layer 113 and the gate insulating layer 102 is removed. A cross-sectional view at this stage is illustrated in FIG. 5B.

Although the gate insulating layer is selectively etched for formation of the contact hole 128 reaching the gate wiring layer 111b through the third photolithography step in this embodiment, there is no limitation to this method. Alternatively, after the oxide semiconductor film is formed, a resist mask may be formed over the oxide semiconductor film and a contact hole reaching the gate electrode 111a may be formed. After the contact hole is formed, the resist mask is removed, a resist mask is formed over the oxide semiconductor film with the use of another photomask, and the second oxide semiconductor film may be selectively etched into an island-shaped oxide semiconductor layer.

Next, a conductive film to be the source electrode layer and the drain electrode layer of the thin film transistor is formed over the gate insulating layer 102, the oxide semiconductor layer 113, and the gate wiring layer 111b through the contact hole 128.

As the conductive film for forming the source electrode layer and the drain electrode layer (including a wiring formed using the same layer), a metal material such as Al, Cu, Cr, Ta, Ti, Mo, or W, or an alloy material including the metal material as a component is used. Further, a structure may be employed in which a film of a high-melting point metal such as Cr, Ta, Ti, Mo, or W is stacked over one or both sides of a metal film such as Al or Cu. Furthermore, an Al material to which an element which prevents generation of hillocks or whisker in an Al film, such as Si, Ti, Ta, W, Mo, Cr, Nd, Sc, or Y is added may be used, leading to improvement in heat resistance.

The source electrode layer and the drain electrode layer (including the wiring formed using the same layer) may be formed using a conductive metal oxide film. As a conductive metal oxide, indium oxide ($In_2O_3$), tin oxide ($SnO_2$), zinc oxide (ZnO), an alloy of indium oxide and tin oxide ($In_2O_3$—$SnO_2$, abbreviated to ITO), an alloy of indium oxide and zinc oxide ($In_2O_3$—ZnO), or the metal oxide material to which silicon or silicon oxide is added can be used.

For the conductive film which is in contact with the oxide semiconductor layer 113, a material including metal with high oxygen affinity is preferably used. It is preferable that the metal with high oxygen affinity be one or more materials selected from titanium (Ti), manganese, (Mn), magnesium (Mg), zirconium, beryllium, and thorium. In this embodiment, a three-layer conductive film in which a titanium film (with a thickness of 100 nm), an aluminum film (with a thickness of 200 nm), and a titanium film (with a thickness of 100 nm) are stacked is formed. Instead of a Ti film, a titanium nitride film may be used.

Note that in the case of performing heat treatment at 200° C. to 600° C., the conductive film preferably has heat resistance so as to be able to withstand this heat treatment. For example, it is preferable to use an aluminum alloy to which an element for preventing hillocks is added, or a conductive film stacked with a heat resistant conductive film. Note that as a method for forming the conductive film, a sputtering method, a vacuum evaporation method (e.g., an electron beam evaporation method), an arc discharge ion plating method, or a spray method is used. The conductive film can also be formed by discharging a conductive nanopaste of silver, gold, copper, or the like by a screen printing method, an inkjet method, or the like and baking the nanopaste.

Figure 5C:
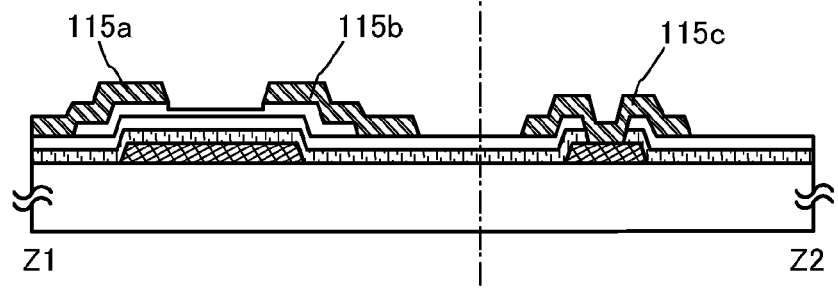

Next, through a fourth photolithography step, a resist mask is formed and the conductive film is selectively etched and removed, so that the second wiring layer (denoted by 115a, 115b, and 115c) including the source electrode layer and the drain electrode layer is formed (see FIG. 5C). As shown in FIG. 5C, the second wiring layer 115c is directly connected to the gate wiring layer 111b through the contact hole 128.

In the fourth photolithography step, only a portion of the conductive film which is on and in contact with the oxide semiconductor layer is selectively removed. When an ammonia peroxide mixture (at a composition weight ratio of hydrogen peroxide:ammonia:water=5:2:2) or the like is used as an alkaline etchant in order to selectively remove only a portion of the conductive film which is on and in contact with the oxide semiconductor layer, the metal conductive film can be selectively removed and the oxide semiconductor layer containing an In—Ga—Zn—O-based oxide semiconductor can be left.

Although it depends on the etching conditions, exposed region of the oxide semiconductor layer may be etched in the fourth photolithography step. In that case, the thickness of the oxide semiconductor layer in a region interposed between the source electrode layer and the drain electrode layer (a region interposed between reference numerals 115a and 115b) is smaller than the thickness of the oxide semiconductor layer in a region overlapping with the source electrode layer over the gate electrode 111a or the thickness of the oxide semiconductor layer in a region overlapping with the drain electrode layer over the gate electrode 111a (see FIG. 5C).

Note that a resist mask for forming the second wiring layer (denoted by 115a, 115b, and 115c) including the source electrode layer and the drain electrode layer may be formed by an inkjet method. Formation of the resist mask by an inkjet method needs no photomask; thus, manufacturing cost can be reduced.

Next, the oxide insulating film 107 is formed over the gate insulating layer 102 and the oxide semiconductor layer 113. In this stage, a region where the oxide insulating film 107 is in contact with the oxide semiconductor layer 113 is formed. A region of the oxide semiconductor layer 113 which overlaps with the gate electrode and is sandwiched between and in contact with the oxide insulating film 107 and the gate insulating layer 102 is a channel formation region.

The oxide insulating film which is in contact with the oxide semiconductor layer which contains few impurities such as a compound containing a hydrogen atom such as $H_2O$, a compound containing a carbon atom, a hydrogen atom, or a carbon atom is formed using an inorganic insulating film which does not contain an impurity such as moisture, a hydrogen ion, or OH and prevents these impurities from entering from the outside. Typically, a silicon oxide film, a silicon nitride oxide film, an aluminum oxide film, an aluminum oxynitride film, or the like is used. The oxide insulating film 107 can be formed to have a thickness of at least 1 nm by a method with which an impurity such as water or hydrogen is not mixed into the oxide insulating film, such as a sputtering method, as appropriate.

In this embodiment, a silicon oxide film is formed as an oxide insulating film by a sputtering method. The substrate temperature at the time of film formation may be at higher than or equal to room temperature and lower than or equal to 600° C., preferably higher than or equal to 200° C. and lower than or equal to 400° C. In this embodiment, the substrate temperature is set to 100° C. The formation of the silicon oxide film by a sputtering method can be performed in a rare gas (typically argon) atmosphere, an oxygen atmosphere, or an atmosphere including a rare gas (typically argon) and oxygen. Note that an oxide insulating film formed by a sputtering method is particularly dense and even a single layer thereof can be used as a protective film for suppressing diffusion of an impurity into a layer in contact with the oxide insulating film. In addition, phosphorus (P) or boron (B) can be added to the oxide insulating film by using a target doped with phosphorus (P) or boron (B).

As a target, a silicon oxide target or a silicon target may be used, and the silicon target is particularly preferable. A silicon oxide film formed by a sputtering method under an atmosphere including oxygen and a rare gas by using the silicon target contains a large number of dangling bonds of silicon atoms or oxygen atoms.

Since the oxide insulating film 107 contains many dangling bonds, an impurity contained in the oxide semiconductor layer 113 are more likely to diffuse into the oxide insulating film 107 through the interface between the oxide semiconductor layer 113 and the oxide insulating film 107. Specifically, a hydrogen atom or a compound containing a hydrogen atom such as $H_2O$ in the oxide semiconductor layer 113 is more likely to diffuse into the oxide insulating film 107.

In this embodiment, the film deposition is performed by a pulsed DC sputtering method using a columnar polycrystalline, boron-doped silicon target which has a purity of 6N (the resistivity is 0.01 Ωcm), in which the distance between substrate and target (T-S distance) is 89 mm, the pressure is 0.4 Pa, the direct-current (DC) power source is 6 kW, and the atmosphere is oxygen (the flow rate ratio of oxygen is 100%). The film thickness thereof is 300 nm.

Note that the oxide insulating film 107 is provided on and in contact with the channel formation regions of the oxide semiconductor layer and functions as a channel protective layer.

Figure 5D:
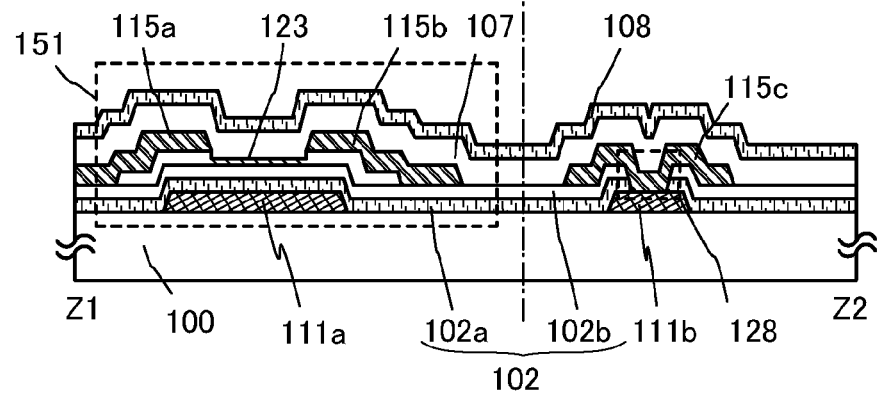

Then, the protective insulating layer 108 is formed over the oxide insulating film 107 (see FIG. 5D). As the protective insulating layer 108, a silicon nitride film, a silicon nitride oxide film, an aluminum nitride film, or the like is used. In this embodiment, a silicon nitride film is formed as the protective insulating layer 108 by an RF sputtering method.

After formation of the oxide insulating film 107, second heat treatment (preferably at a temperature of 200° C. to 400° C. inclusive, for example, 250° C. to 350° C. inclusive) may be performed in an inert gas atmosphere or a nitrogen atmosphere.

For example, the second heat treatment is performed in a nitrogen atmosphere at 250° C. for one hour. In the second heat treatment, heating is performed in the state where part of the oxide semiconductor layer 113 is in contact with the oxide insulating film 107 and other part of the oxide semiconductor layer 113 is in contact with the second wiring layer (denoted by 115a and 115b).

When the second heat treatment is performed in the state where the oxide semiconductor layer which contains few impurities such as a compound containing a hydrogen atom such as $H_2O$, a compound containing a carbon atom, a hydrogen atom, or a carbon atom is in contact with the oxide insulating film 107, a region with which the oxide insulating film 107 is in contact becomes an oxygen-excess state. Thus, resistivity becomes higher (the region of the oxide semiconductor layer becomes an i-type oxide semiconductor) in a direction from the region of the oxide semiconductor layer 113 in contact with the oxide insulating film 107 toward the bottom of the oxide semiconductor layer 113.

Specifically, the oxide semiconductor layer 123 having the region where the resistivity is lowered (the i-type oxide semiconductor) from the interface between the oxide semiconductor layer 113 and the oxide insulating film 107 toward the gate insulating layer 102 is formed.

Since the oxide semiconductor layer where the resistivity is lowered (the i-type oxide semiconductor) is formed in the channel formation region of the thin film transistor 151, the threshold voltage is a positive value and the thin film transistor 151 behaves as an enhancement-type thin film transistor.

In the case where a metal conductive film with high oxygen affinity is in contact with an oxide semiconductor layer, oxygen tends to move toward the metal conductive film side by performing heat treatment and the oxide semiconductor layer becomes to have n-type conductivity. Accordingly, by performing the second heat treatment, regions in the oxide semiconductor layer 113, which are in contact with the source electrode layer and the drain electrode layer (denoted by 115a and 115b) formed using a metal conductive film with high oxygen affinity, such as titanium, become to have n-type conductivity.

The timing of the second heat treatment is not limited to the timing shortly after the fourth photolithography step as long as it is after the fifth photolithography step.

Through the above steps, the thin film transistor 151 can be manufactured.

Although the gate insulating layer is selectively etched for formation of the contact hole 128 which reaches the gate wiring layer 111b through the third photolithography step in this embodiment, there is no limitation to this method. For example, after formation of the gate insulating layer 102, a resist mask may be formed over the gate insulating layer and a contact hole which reaches the gate wiring layer 111b may be formed.

After formation of the oxide semiconductor layer, the concentration of an impurity remaining in the oxide semiconductor layer, typically the hydrogen concentration, is ideally zero or close to zero according to a technical idea of the present invention. When the concentration of hydrogen remaining in the oxide semiconductor layer needs to be lowered, first heat treatment for dehydration or dehydrogenation may be performed.

First heat treatment for dehydration or dehydrogenation is performed at a temperature higher than or equal to 400° C. and lower than 750° C., preferably, higher than or equal to 425° C. and lower than 750° C. Note that in the case of a temperature that is 425° C. or higher, the heat treatment time may be one hour or shorter, whereas in the case of a temperature lower than 425° C., the heat treatment time is longer than one hour. In the first heat treatment, the substrate is introduced into an electric furnace, which is one of heat treatment apparatuses, and heat treatment is performed on the oxide semiconductor layer in a nitrogen atmosphere. After that, the oxide semiconductor layer is not exposed to air, which prevents water or hydrogen from entering the oxide semiconductor layer again, so that the oxide semiconductor layer is obtained. Slow cooling is performed in a nitrogen atmosphere in one furnace from the heating temperature T at which the oxide semiconductor layer is dehydrated or dehydrogenated to a temperature low enough to prevent water from entering, specifically to a temperature lower than the heating temperature T by 100° C. or more. Without being limited to a nitrogen atmosphere, dehydration or dehydrogenation is performed in an atmosphere of helium, neon, argon, or the like.

The heat treatment apparatus is not limited to the electric furnace, and for example, an RTA (rapid thermal annealing) apparatus such as a GRTA (gas rapid thermal annealing) apparatus or an LRTA (lamp rapid thermal annealing) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heating an object to be processed by thermal radiation using light emitted from the above-described lamp and by conduction of heat from a gas heated by light emitted from a lamp. As the gas, an inert gas which does not react with an object to be processed by heat treatment, such as nitrogen or a rare gas such as argon, is used. An LRTA apparatus or a GRTA apparatus may include not only a lamp but also a device for heating an object to be processed by heat conduction or heat radiation from a heater such as a resistance heater.

In addition, in the first heat treatment, it is preferable that nitrogen or a rare gas such as helium, neon, or argon do not include water, hydrogen, or the like. It is preferable that the purity of nitrogen or the rare gas such as helium, neon, or argon which is introduced into a heat treatment apparatus be set to be 6N (99.9999%) or higher, preferably 7N (99.99999%) or higher (that is, the impurity concentration is 1 ppm or lower, preferably 0.1 ppm or lower).

Depending on conditions of the first heat treatment or a material of the oxide semiconductor layer, the oxide semiconductor layer is crystallized to be a microcrystalline film or a polycrystalline film in some cases. For example, the oxide semiconductor layer may be crystallized to become a microcrystalline oxide semiconductor film having a degree of crystallization of 90% or more, or 80% or more. Alternatively, depending on the conditions of the first heat treatment or the material of the oxide semiconductor layer, the oxide semiconductor layer might become an amorphous oxide semiconductor film containing no crystalline component.

After the first heat treatment, the oxide semiconductor layer is changed to an oxygen-deficient and low resistance oxide semiconductor layer. The carrier concentration of the oxide semiconductor film after the first heat treatment is higher than that of the oxide semiconductor film just after the deposition; the oxide semiconductor layer has a carrier concentration of $1\times10^{18}/cm^3$ or more. Therefore, in the case of performing the first heat treatment, second heat treatment (preferably, at 200° C. to 400° C., for example, at 250° C. to 350° C.) is performed in an inert gas atmosphere or in a nitrogen gas atmosphere.

Note that depending on the conditions of the first heat treatment or a material of the gate electrode 111a and the gate wiring layer 111b, the gate electrode 111a and the gate wiring layer 111b are crystallized to be a microcrystalline film or a polycrystalline film in some cases. For example, in the case where a film of an alloy of indium oxide and tin oxide is used as the gate electrode 111a and the gate wiring layer 111b, the gate electrode 111a and the gate wiring layer 111b are crystallized by the first heat treatment at 450° C. for one hour. In contrast, in the case where a film of an alloy of indium oxide and tin oxide containing silicon oxide is used as the gate electrode 111a and the gate wiring layer 111b, the gate electrode 111a and the gate wiring layer 111b are not crystallized.

The first heat treatment for the oxide semiconductor layer can be performed before the oxide semiconductor film is processed into the island-shaped oxide semiconductor layer. In that case, the substrate is taken out of the heating apparatus after the first heat treatment and a fourth photolithography step is performed.

The semiconductor element described in this embodiment includes an oxide semiconductor film formed using a heated target. An oxide semiconductor film formed using a heated target contains few impurities. For example, an oxide semiconductor film can be formed whose hydrogen concentration is ideally zero or close to zero according to a technical idea of the present invention. The hydrogen concentration in the oxide semiconductor layer may be measured by secondary ion mass spectroscopy (SIMS).

An oxide semiconductor with an energy gap of larger than or equal to 2 eV, preferably larger than or equal to 2.5 eV, more preferably larger than or equal to 3 eV is used. The oxide semiconductor layer is highly purified by sufficiently removing hydrogen contained in the oxide semiconductor layer. The carrier concentration is set to less than $1\times10^{14}/cm^3$, preferably less than or equal to $1\times10^{12}/cm^3$. That is, a thin film transistor is formed using an oxide semiconductor layer whose carrier concentration is as close to as zero for a channel formation region. When an oxide semiconductor layer whose carrier concentration is as close to as zero is used for a channel formation region of a thin film transistor, a thin film transistor with an extremely small off-current can be provided.

For example, even in a thin film transistor including a highly purified oxide semiconductor layer with a channel length of 3 μm and a channel width of 10 mm, the thin film transistor operates so that a drain current of $1\times10^{-13}$ A or smaller is obtained at drain voltages of 1 V and 10 V and gate voltages ranging from −5 V to −20 V (off state).

The semiconductor element described in this embodiment includes an oxide semiconductor film with a low impurity concentration for a channel formation region and thus has excellent electric characteristics and high reliability. Specifically, a thin film transistor which has an extremely small off-current and a controlled threshold voltage can be provided. In addition, a thin film transistor including an oxide semiconductor with high operation speed, a relatively easy manufacturing process, and sufficient reliability can be provided.

Further, it is possible to reduce a degree of shift of the threshold voltage when BT stress testing (bias-temperature stress testing) is performed, and a highly reliable thin film transistor can be obtained. Note that the BT stress testing (bias-temperature stress testing) in this specification refers to testing in which a high gate voltage is applied to a thin film transistor in a high temperature atmosphere.

Note that this embodiment can be combined with any of the other embodiments in this specification as appropriate.
(Embodiment 5)

In this embodiment, an example will be described below in which at least part of a driver circuit and a thin film transistor to be disposed in a pixel portion are formed over one substrate.

The thin film transistor to be disposed in the pixel portion is formed according to Embodiment 4. The thin film transistor described in Embodiment 4 is an n-channel TFT; therefore, part of a driver circuit which can be formed using an n-channel TFT is formed over a substrate over which the thin film transistor of the pixel portion is formed.

Figure 6A:
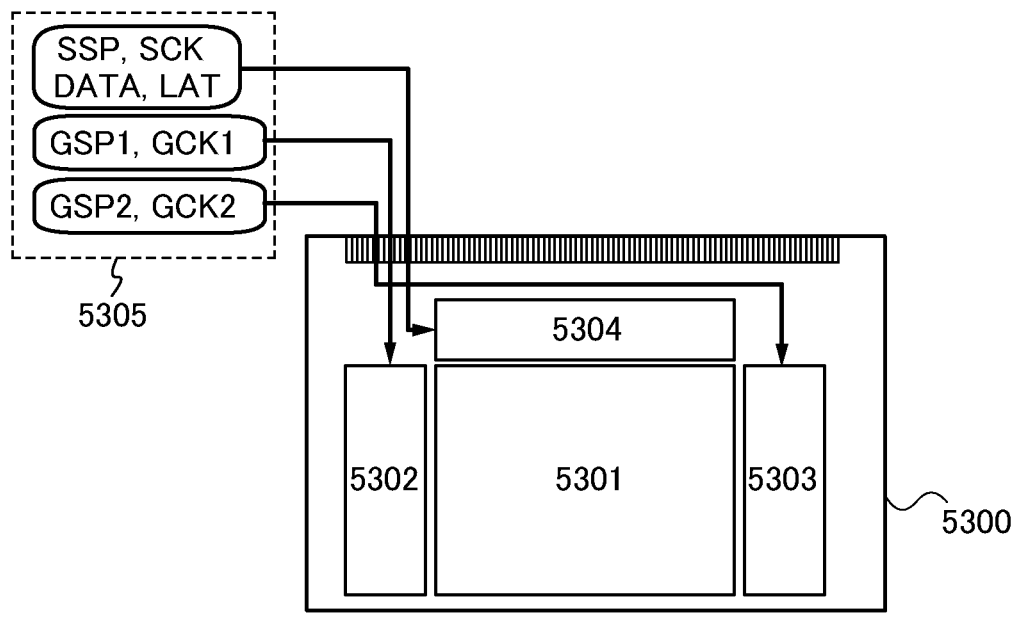
FIGS. 6A and 6B each illustrate a block diagram of a display device according to an embodiment.

FIG. 6A illustrates an example of a block diagram of an active matrix display device. Over a substrate 5300 in the display device, a pixel portion 5301, a first scan line driver circuit 5302, a second scan line driver circuit 5303, and a signal line driver circuit 5304 are provided. In the pixel portion 5301, a plurality of signal lines extended from the signal line driver circuit 5304 is arranged and a plurality of scan lines extended from the first scan line driver circuit 5302 and the second scan line driver circuit 5303 is arranged. Note that pixels which include display elements are provided in a matrix in respective regions where the scan lines and the signal lines intersect with each other. Further, the substrate 5300 in the display device is connected to a timing control circuit 5305 (also referred to as a controller or a controller IC) through a connection portion such as a flexible printed circuit (FPC).

In FIG. 6A, the first scan line driver circuit 5302, the second scan line driver circuit 5303, and the signal line driver circuit 5304 are formed over the same substrate 5300 as the pixel portion 5301. Accordingly, the number of components of a drive circuit which is provided outside and the like are reduced, so that cost reduction can be achieved. Further, if the driver circuit is provided outside the substrate 5300, wirings would need to be extended and the number of connections of wirings would be increased, but by providing the driver circuit over the substrate 5300, the number of connections of the wirings can be reduced. Accordingly, improvement in reliability and yield can be achieved.

Note that the timing control circuit 5305 supplies, for example, a first scan line driver circuit start signal (GSP1) and a scan line driver circuit clock signal (GCK1) to the first scan line driver circuit 5302. The timing control circuit 5305 supplies, for example, a second scan line driver circuit start signal (GSP2) (also referred to as a start pulse) and a scan line driver circuit clock signal (GCK2) to the second scan line driver circuit 5303. The timing control circuit 5305 supplies a signal line driver circuit start signal (SSP), a signal line driver circuit clock signal (SCK), video signal data (DATA) (also simply referred to as a video signal), and a latch signal (LAT) to the signal line driver circuit 5304. Note that each clock signal may be a plurality of clock signals whose periods are different or may be supplied together with an inverted clock signal (CKB). Note that one of the first scan line driver circuit 5302 and the second scan line driver circuit 5303 can be omitted.

Figure 6B:
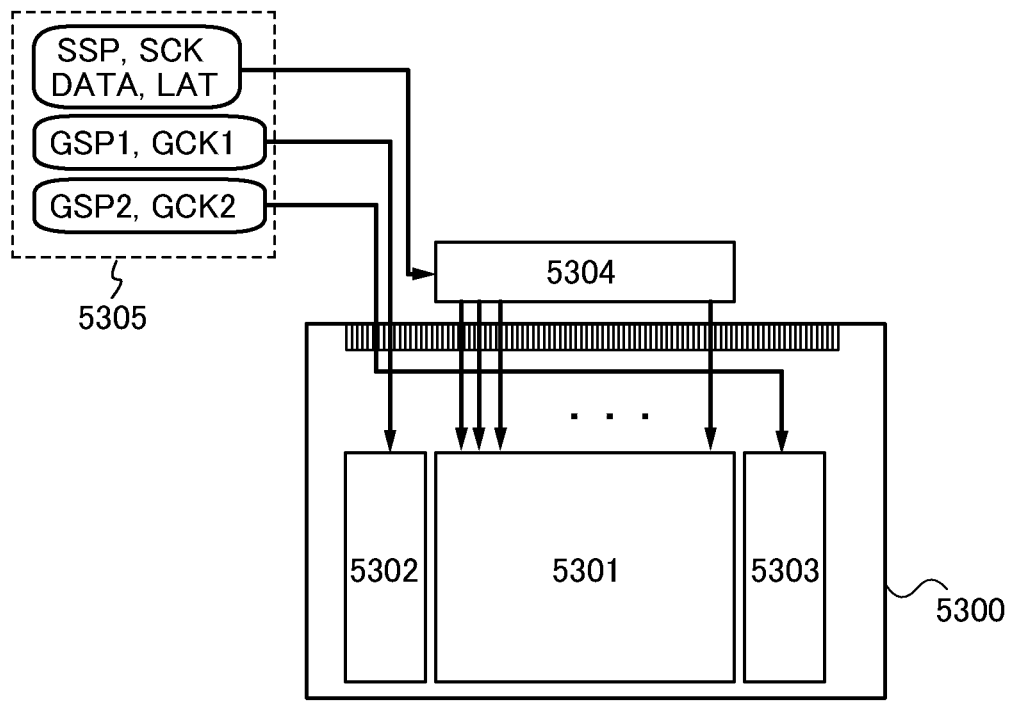

FIG. 6B illustrates a structure in which circuits with low driving frequency (for example, the first scan line driver circuit 5302 and the second scan line driver circuit 5303) are formed over the same substrate 5300 as the pixel portion 5301 and the signal line driver circuit 5304 is formed over a different substrate from the pixel portion 5301. With this structure, a driver circuit formed over the substrate 5300 can be formed using thin film transistors with lower field effect mobility as compared to that of a transistor formed using a single crystal semiconductor. Accordingly, increase in size of the display device, reduction in the number of steps, reduction in cost, improvement in yield, or the like can be achieved.

The thin film transistor in Embodiment 4 is an n-channel TFT. An example of a structure and operation of a signal line driver circuit including the n-channel TFT will be described with reference to FIGS. 7A and 7B.

The signal line driver circuit includes a shift register 5601 and a switching circuit 5602. The switching circuit 5602 includes a plurality of switching circuits 5602_1 to 5602_N (N is a natural number). The switching circuits 5602_1 to 5602_N each include a plurality of thin film transistors 5603_1 to 5603_k (k is a natural number). A case in which the thin film transistors 5603_1 to 5603_k are n-channel TFTs will be described.

A connection relation of the signal line driver circuit will be described by using the switching circuit 5602_1 as an example. First terminals of the thin film transistors 5603_1 to 5603_k are connected to wirings 5604_1 to 5604_k, respectively. Second terminals of the thin film transistors 5603_1 to 5603_k are connected to signal lines S1 to Sk, respectively. Gates of the thin film transistors 5603_1 to 5603_k are connected to the shift register 5601.

The shift register 5601 has a function of outputting an H level signal (also referred to as an H signal or a high power supply potential level) to the wirings 5605_1 to 5605_N in order and selecting the switching circuits 5602_1 to 5602_N in order.

The switching circuit 5602_1 has a function of controlling conduction states between the wirings 5604_1 to 5604_k and the signal lines S1 to Sk (conduction between the first terminal and the second terminal), that is, a function of controlling whether the potentials of the wirings 5604_1 to 5604_k are supplied or not to the signal lines S1 to Sk. Thus, the switching circuit 5602_1 functions as a selector. Further, the thin film transistors 5603_1 to 5603_k each have a function of controlling conduction states between the wirings 5604_1 to 5604_k and the signal lines S1 to Sk, namely a function of controlling whether or not to supply the potentials of the wirings 5604_1 to 5604_k to the signal lines S1 to Sk. In this manner, each of the thin film transistors 5603_1 to 5603_k functions as a switch.

Figure 7A:
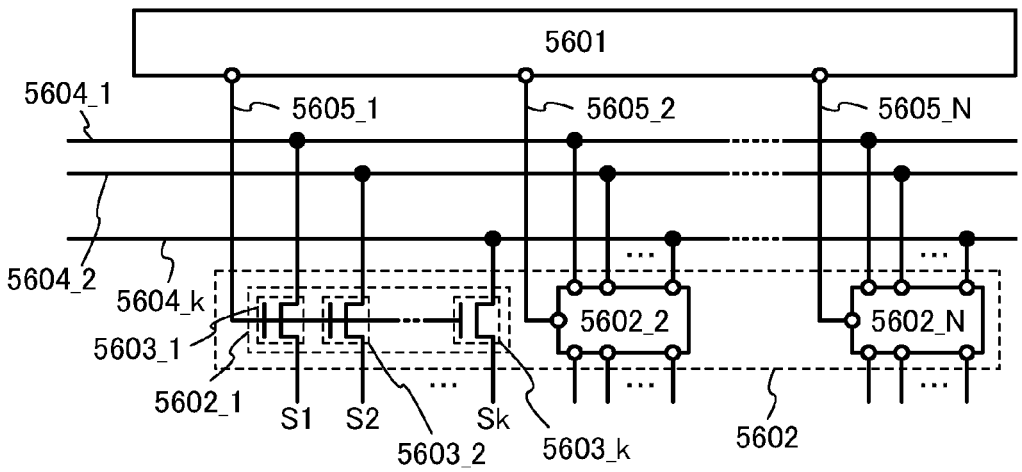
FIGS. 7A and 7B illustrate a structure of a signal line driver circuit according to an embodiment.
Figure 7B:
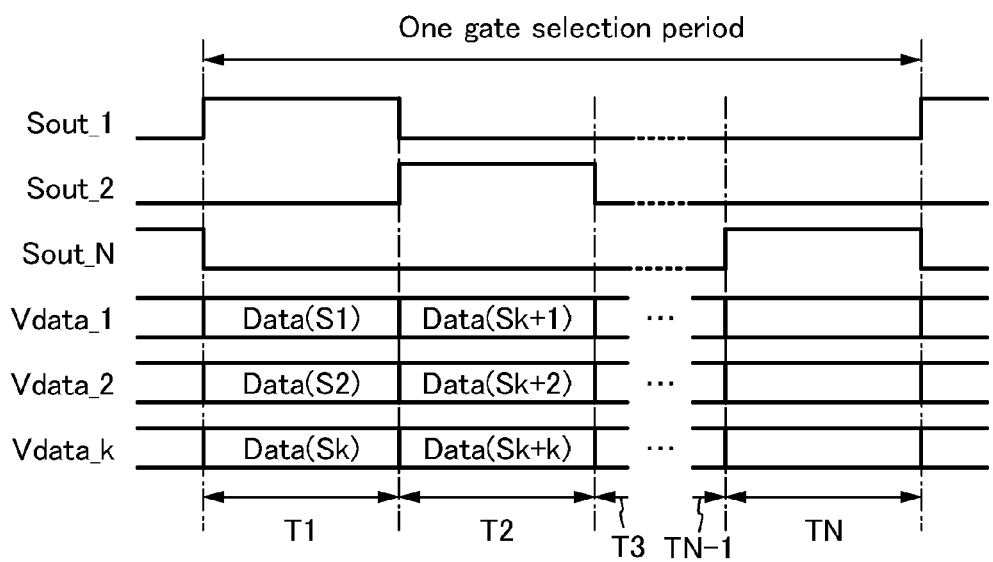

Note that video signal data (DATA) is input to each of the wirings 5604_1 to 5604_k. The video signal data (DATA) is an analog signal corresponding to image data or image signals in many cases. Next, operation of the signal line driver circuit in FIG. 7A is described with reference to a timing chart in FIG. 7B. In FIG. 7B, an example of signals Sout_1 to Sout_N and signals Vdata_1 to Vdata_k is shown. The signals Sout_1 to Sout_N are examples of output signals of the shift register 5601, and the signals Vdata_1 to Vdata_k are examples of signals input to the wirings 5604_1 to 5604_k. Note that one operation period of the signal line driver circuit corresponds to one gate selection period in a display device. For example, one gate selection period is divided into periods T1 to TN. The periods T1 to TN are periods for writing video signal data (DATA) to the pixels which belong to a selected row.

In the periods T1 to TN, the shift register 5601 sequentially outputs H level signals to the wirings 5605_1 to 5605_N. For example, in the period T1, the shift register 5601 outputs an H level signal to the wiring 5605_1. Then, the thin film transistors 5603_1 to 5603_k are turned on, so that the wirings 5604_1 to 5604_k and the signal lines S1 to Sk are brought into conduction. In this case, Data (S1) to Data (Sk) are input to the wirings 5604_1 to 5604_k, respectively. The Data (S1) to Data (Sk) are input to pixels in a selected row in a first to k-th columns through the thin film transistors 5603_1 to 5603_k, respectively. Thus, in the periods T1 to TN, video signal data (DATA) is sequentially written to the pixels in the selected row by k columns.

By writing video signal data (DATA) to pixels by a plurality of columns as described above, the number of video signal data (DATA) or the number of wirings can be reduced. Thus, connections to an external circuit can be reduced. By writing video signals to pixels by a plurality of columns, writing time can be extended and insufficient writing of video signals can be prevented.

Note that any of the circuits formed using the thin film transistors in Embodiment 4 can be used for the shift register 5601 and the switching circuit 5602. In this case, the shift register 5601 can be formed using only n-channel transistors or only p-channel transistors.

Further, a structure of a scan line driver circuit is described. The scan line driver circuit includes a shift register. Additionally, the scan line driver circuit may include a level shifter, a buffer, or the like in some cases. In the scan line driver circuit, when the clock signal (CLK) and the start pulse signal (SP) are input to the shift register, a selection signal is generated. The generated selection signal is buffered and amplified by the buffer, and the resulting signal is supplied to a corresponding scan line. Gate electrodes of transistors in pixels of one line are connected to the scan line. Since the transistors in the pixels of one line have to be turned on all at once, a buffer which can supply a large current is used.

One embodiment of a shift register which is used for part of the scan line driver circuit and/or the signal line driver circuit is described with reference to FIGS. 8A to 8C and FIGS. 9A and 9B.

Figure 8A:
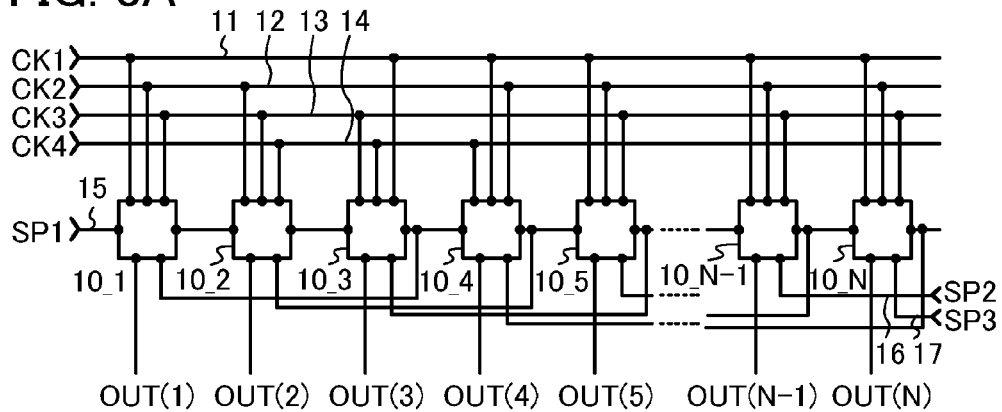
FIGS. 8A to 8C are circuit diagrams illustrating a structure of a shift register.

A shift register of a scan line driver circuit and/or a signal line driver circuit is described with reference to FIGS. 8A to 8C and FIGS. 9A and 9B. The shift register includes first to N-th pulse output circuits 10_1 to 10_N (N≥3 and N is a natural number) (see FIG. 8A). In the shift register illustrated in FIG. 8A, a first clock signal CK1, a second clock signal CK2, a third clock signal CK3, and a fourth clock signal CK4 are supplied from a first wiring 11, a second wiring 12, a third wiring 13, and a fourth wiring 14, respectively, to the first to N-th pulse output circuits 10_1 to 10_N. A start pulse SP1 (a first start pulse) from a fifth wiring 15 is input to the first pulse output circuit 10_1. To the n-th pulse output circuit 10_n in the second or subsequent stage (n is a natural number greater than or equal to 2 and less than or equal to N), a signal from the pulse output circuit in the preceding stage (such a signal is referred to as a preceding-stage signal OUT(n−1)) (n is a natural number greater than or equal to 2) is input. A signal from the third pulse output circuit 10_3 of the two stages after the first pulse output circuit 10_1 is input to the first pulse output circuit 10_1. Similarly, to the n-th pulse output circuit 10_n of the second or subsequent stage, a signal from the (n+2)-th pulse output circuit 10_(n+2) of the stage following the next stage (such a signal is referred to as a subsequent-stage signal OUT(n+2)) is input. Therefore, from the pulse output circuit in each stage, a first output signal (OUT(1)(SR) to OUT(N)(SR)) to be input to a pulse output circuit in the subsequent stage and/or the pulse output circuit in the stages before the preceding stages and a second output signal (OUT (1) to OUT(N)) for electrical connection to another wiring or the like are output. Note that since the subsequent-stage signal OUT(n+2) is not input to the last two stages of the shift register as illustrated in FIG. 8A, a second start pulse SP2 from the sixth wiring 16 and a third start pulse SP3 from the seventh wiring 17 may be input to the stage before the last stage and the last stage, respectively, for example. Alternatively, a signal which is additionally generated in the shift register may be used. For example, a (n+1)-th pulse output circuit 10_(n+1) and a (n+2)-th pulse output circuit 10_(n+2) which do not contribute to output of pulses to a pixel portion (such circuits are also referred to as dummy stages) may be provided, and signals corresponding to a second start pulse (SP2) and a third start pulse (SP3) may be generated in the dummy stages.

Note that a clock signal (CK) is a signal which alternates between an H level and an L level (referred to as an L signal or a low power supply potential level) at regular intervals. The first to the fourth clock signals (CK1) to (CK4) are delayed by ¼ cycle sequentially. In this embodiment, by using the first to fourth clock signals (CK1) to (CK4), control or the like of driving of a pulse output circuit is performed. Note that the clock signal is also called GCK or SCK in accordance with an driver circuit to which the clock signal is input; however, description is made using CK as the clock signal.

A first input terminal 21, a second input terminal 22, and a third input terminal 23 are electrically connected to any of the first to fourth wirings 11 to 14. For example, in FIG. 8A, the first input terminal 21 of the first pulse output circuit 10_1 is electrically connected to the first wiring 11, the second input terminal 22 of the first pulse output circuit 10_1 is electrically connected to the second wiring 12, and the third input terminal 23 of the first pulse output circuit 10_1 is electrically connected to the third wiring 13. In addition, the first input terminal 21 of the second pulse output circuit 102 is electrically connected to the second wiring 12, the second input terminal 22 of the second pulse output circuit 10_2 is electrically connected to the third wiring 13, and the third input terminal 23 of the second pulse output circuit 10_2 is electrically connected to the fourth wiring 14.

Figure 8B:
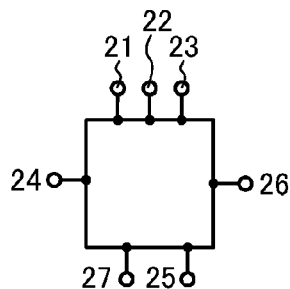

Each of the first to N-th pulse output circuits 10_1 to 10_N includes the first input terminal 21, the second input terminal 22, the third input terminal 23, a fourth input terminal 24, a fifth input terminal 25, a first output terminal 26, and a second output terminal 27 (see FIG. 8B). In the first pulse output circuit 10_1, the first clock signal CK1 is input to the first input terminal 21; the second clock signal CK2 is input to the second input terminal 22; the third clock signal CK3 is input to the third input terminal 23; the start pulse is input to the fourth input terminal 24; the next stage signal OUT (3) is input to the fifth input terminal 25; the first output signal OUT (1) (SR) is output from the first output terminal 26; and the second output signal OUT (1) is output from the second output terminal 27.

Next, an example of a specific circuit structure of the pulse output circuit is described with reference to FIG. 8C.

Figure 8C:
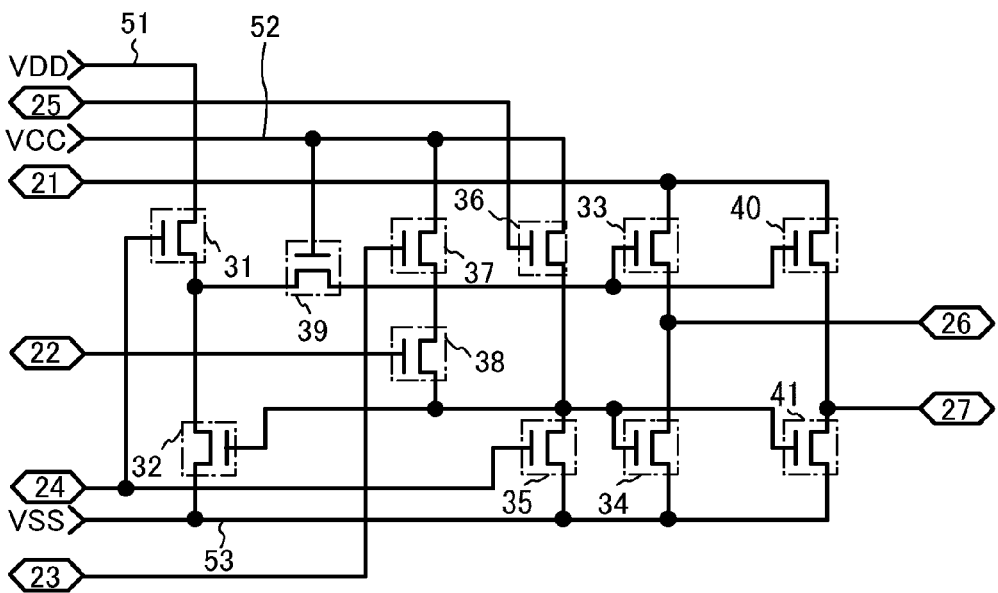

The first pulse output circuit 10_1 includes a first to eleventh transistors 31 to 41 (see FIG. 8C). A signal or a power source potential is supplied to the first to eleventh transistors 31 to 41 from a power supply line 51 to which a first high power source potential VDD is supplied, a power supply line 52 to which a second high power source potential VCC is supplied, and a power supply line 53 to which a low power source potential VSS is supplied, in addition to the first to fifth input terminals 21 to 25, the first output terminal 26, and the second output terminal 27, which are described above. The relation of the power supply potentials of the power supply lines in FIG. 8C is as follows: the first high power supply potential VDD is higher than or equal to the second high power supply potential VCC, and the second high power supply potential VCC is higher than the low power supply potential VSS. The first to fourth clock signals (CK1) to (CK4) are signals which alternate between H level and L level at regular intervals. The potential is VDD when the clock signal is at the H level, and the potential is VSS when the clock signal is at the L level. By making the potential VCC of the power supply line 52 lower than the potential VDD of the power supply line 51, a potential applied to a gate electrode of a transistor can be lowered, shift in threshold voltage of the transistor can be reduced, and deterioration of the transistor can be suppressed without an adverse effect on the operation of the transistor. A thin film transistor with four terminals is preferably used as each of the first transistor 31 and the sixth to ninth transistors 36 to 39 among the first to eleventh transistors 31 to 41. The first transistor 31 and the sixth to ninth transistors 36 to 39 need to switch a potential of a node to which one electrode serving as a source or a drain is connected, depending on a control signal of the gate electrode, and can reduce a malfunction of the pulse output circuit by quick response (sharp rising of on-current) to the control signal input to the gate electrode. Thus, by using the thin film transistor with four terminals, the threshold voltage can be controlled, and a malfunction of the pulse output circuit can be further reduced.

In FIG. 8C, a first terminal of the first transistor 31 is electrically connected to the power supply line 51, a second terminal of the first transistor 31 is electrically connected to a first terminal of the ninth transistor 39, and gate electrodes (a lower gate electrode and an upper gate electrode) of the first transistor 31 are electrically connected to the fourth input terminal 24. A first terminal of the second transistor 32 is electrically connected to the power supply line 53, a second terminal of the second transistor 32 is electrically connected to the first terminal of the ninth transistor 39, and a gate electrode of the second transistor 32 is electrically connected to a gate electrode of the fourth transistor 34. A first terminal of the third transistor 33 is electrically connected to the first input terminal 21, and a second terminal of the third transistor 33 is electrically connected to the first output terminal 26. A first terminal of the fourth transistor 34 is electrically connected to the power supply line 53, and a second terminal of the fourth transistor 34 is electrically connected to the first output terminal 26. A first terminal of the fifth transistor 35 is electrically connected to the power supply line 53, a second terminal of the fifth transistor 35 is electrically connected to the gate electrode of the second transistor 32 and the gate electrode of the fourth transistor 34, and a gate electrode of the fifth transistor 35 is electrically connected to the fourth input terminal 24. A first terminal of the sixth transistor 36 is electrically connected to the power supply line 52, a second terminal of the sixth transistor 36 is electrically connected to the gate electrode of the second transistor 32 and the gate electrode of the fourth transistor 34, and gate electrodes (a lower gate electrode and an upper gate electrode) of the sixth transistor 36 are electrically connected to the fifth input terminal 25. A first terminal of the seventh transistor 37 is electrically connected to the power supply line 52, a second terminal of the seventh transistor 37 is electrically connected to a second terminal of the eighth transistor 38, and gate electrodes (a lower gate electrode and an upper gate electrode) of the seventh transistor 37 are electrically connected to the third input terminal 23. A first terminal of the eighth transistor 38 is electrically connected to the gate electrode of the second transistor 32 and the gate electrode of the fourth transistor 34, and gate electrodes (a lower gate electrode and an upper gate electrode) of the eighth transistor 38 are electrically connected to the second input terminal 22. The first terminal of the ninth transistor 39 is electrically connected to the second terminal of the first transistor 31 and the second terminal of the second transistor 32, a second terminal of the ninth transistor 39 is electrically connected to a gate electrode of the third transistor 33 and a gate electrode of the tenth transistor 40, and gate electrodes (a lower gate electrode and an upper gate electrode) of the ninth transistor 39 are electrically connected to the power supply line 52. A first terminal of the tenth transistor 40 is electrically connected to the first input terminal 21, a second terminal of the tenth transistor 40 is electrically connected to the second output terminal 27, and the gate electrode of the tenth transistor 40 is electrically connected to the second terminal of the ninth transistor 39. A first terminal of the eleventh transistor 41 is electrically connected to the power supply line 53, a second terminal of the eleventh transistor 41 is electrically connected to the second output terminal 27, and a gate electrode of the eleventh transistor 41 is electrically connected to the gate electrode of the second transistor 32 and the gate electrode of the fourth transistor 34.

In FIG. 8C, a connection point of the gate electrode of the third transistor 33, the gate electrode of the tenth transistor 40, and the second terminal of the ninth transistor 39 is a node A. A connection point of the gate electrode of the second transistor 32, the gate electrode of the fourth transistor 34, the second terminal of the fifth transistor 35, the second terminal of the sixth transistor 36, the first terminal of the eighth transistor 38, and the gate electrode of the eleventh transistor 41 is a node B.

Note that a thin film transistor is an element having at least three terminals of a gate, a drain, and a source. The thin film transistor has a channel region between a drain region and a source region, and current can flow through the drain region, the channel region, and the source region. Here, since the source and the drain of the thin film transistor may interchange depending on the structure, the operating condition, and the like of the thin film transistor, it is difficult to define which is a source or a drain. Therefore, a region functioning as a source and a drain is not called the source or the drain in some cases. In such a case, for example, one of the source and the drain may be referred to as a first terminal and the other thereof may be referred to as a second terminal.

Figure 9A:
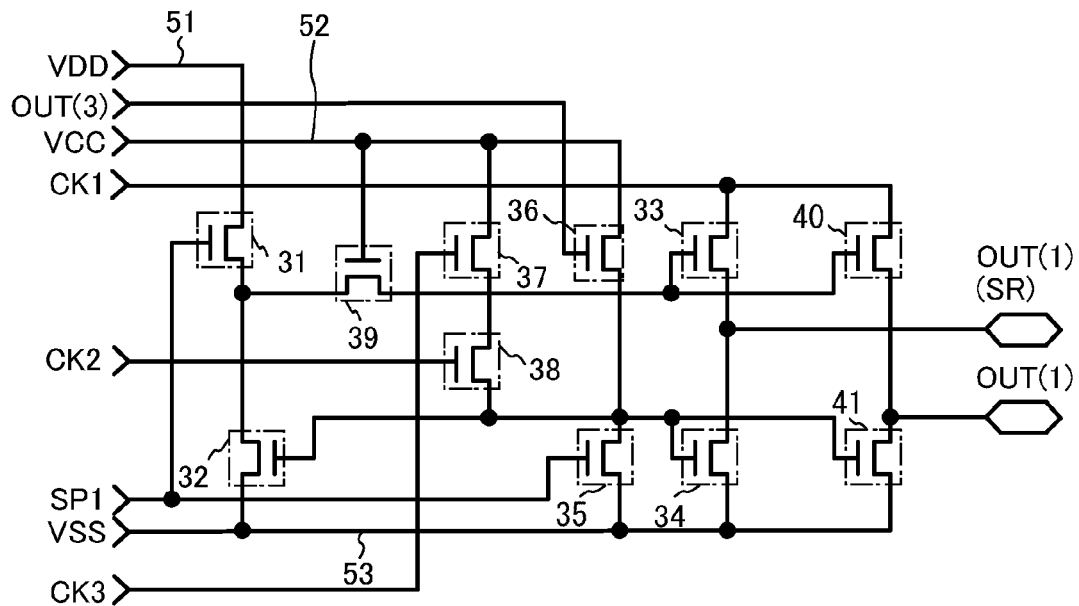
FIG. 9A is a circuit diagram of a shift register and FIG. 9B is a timing chart illustrating operation of the shift register.
Figure 9B:
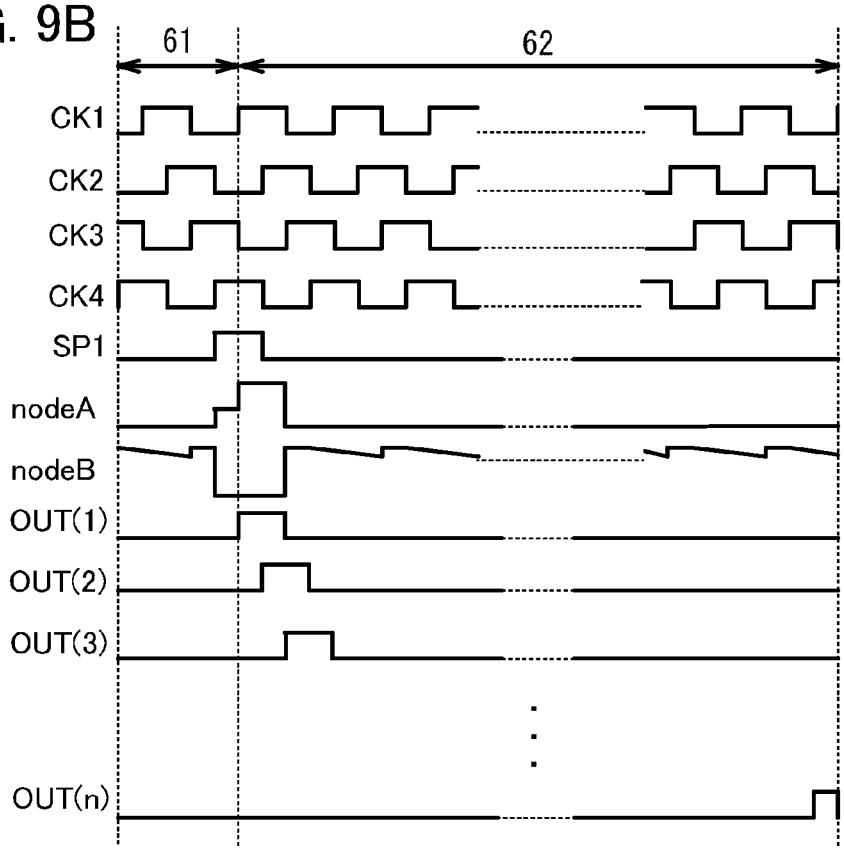

FIG. 9B illustrates a timing chart of a shift register including a plurality of pulse output circuits illustrated in FIG. 9A. Note that when the shift register is the one of a scan line driver circuit, a period 61 in FIG. 9B corresponds to a vertical retrace period and a period 62 corresponds to a gate selection period.

Note that by providing the ninth transistor 39 in which the second high power supply potential VCC is applied to the gate as illustrated in FIG. 9A, the following advantages before and after bootstrap operation are obtained.

In the case where the ninth transistor 39 having the gate electrode to which the second potential VCC is applied is not provided, when the potential at the node A is increased due to the bootstrap operation, the potential of a source which is the second terminal of the first transistor 31 increases to a value higher than the first power supply potential VDD. Then, the first terminal of the first transistor 31, namely the power supply line 51, becomes to serve as the source thereof. Therefore, in the first transistor 31, a large bias voltage is applied and thus significant stress is applied between the gate and the source and between the gate and the drain, which might cause deterioration in the transistor. By providing of the ninth transistor 39 whose gate is supplied with the second power supply potential VCC, the potential of the node A is raised by the bootstrap operation, but at the same time, an increase in the potential of the second terminal of the first transistor 31 can be prevented. In other words, by providing of the ninth transistor 39, a negative bias voltage applied between the gate and the source of the first transistor 31 can be reduced. Accordingly, with a circuit structure in this embodiment, a negative bias voltage applied between the gate and the source of the first transistor 31 can be reduced, so that deterioration of the first transistor 31, which is due to stress, can be suppressed.

Note that the ninth transistor 39 is provided so as to be connected between the second terminal of the first transistor 31 and the gate of the third transistor 33 through the first terminal and the second terminal of the ninth transistor 39. In the case of employing a shift register including a plurality of pulse output circuits of this embodiment, the ninth transistor 39 may be omitted in a signal line driver circuit in which the number of stages is larger than that of a scan line driver circuit, in order to reduce the number of transistors.

Note that when oxide semiconductors are used for semiconductor layers for the first to the eleventh transistors 31 to 41, the off-state current of the thin film transistors can be reduced, the on-state current and the field effect mobility can be increased, and the degree of deterioration can be reduced, whereby malfunction of a circuit can decrease. Compared with a transistor formed using an oxide semiconductor and a transistor formed using amorphous silicon, the degree of deterioration of the transistor due to the application of a high potential to the gate electrode is small. Therefore, even when the first power supply potential VDD is supplied to a power supply line to which the second power supply potential VCC is supplied, a similar operation can be performed, and the number of power supply lines which are provided in a circuit can be reduced, so that the size of the circuit can be reduced.

Note that a similar function is obtained even when the connection relation is changed so that a clock signal that is supplied to the gate electrode of the seventh transistor 37 from the third input terminal 23 and a clock signal that is supplied to the gate electrode of the eighth transistor 38 from the second input terminal 22 are supplied from the second input terminal 22 and the third input terminal 23, respectively. Note that in the shift register shown in FIG. 9A, after the seventh transistor 37 and the eighth transistor 38 are both turned on, the seventh transistor 37 is turned off and the eighth transistor 38 is still on, and then the seventh transistor 37 is still off and the eighth transistor 38 is turned off. Therefore, a decrease in the potential of the node B, which is caused by a decrease in the potentials of the second input terminal 22 and the third input terminal 23, occurs twice because of a decrease in the potential of the gate electrode of the seventh transistor 37 and a decrease in the potential of the gate electrode of the eighth transistor 38. On the other hand, when the states of the seventh transistor 37 and the eighth transistor 38 in the shift register illustrated in FIG. 9A are changed so that both the seventh transistor 37 and the eighth transistor 38 are on, then the seventh transistor 37 is on and the eighth transistor 38 is off, and then the seventh transistor 37 and the eighth transistor 38 are off, the fall in the potential of the node B due to the fall in the potentials of the second input terminal 22 and the third input terminal 23 is caused only once by the fall in the potential of the gate electrode of the eighth transistor 38. Therefore, the connection relation in which the clock signal CK3 is supplied from the third input terminal 23 to the gate electrode of the seventh transistor 37 and the clock signal CK2 is supplied from the second input terminal 22 to the gate electrode of the eighth transistor 38 is preferable. That is because the number of times of the change in the potential of the node B can be reduced, whereby the noise can be reduced.

In this way, in a period during which the potentials of the first output terminal 26 and the second output terminal 27 are held at the L level, the H level signal is regularly supplied to the node B; therefore, malfunction of a pulse output circuit can be suppressed.

(Embodiment 6)

The thin film transistor described in Embodiment 4 can be manufactured, and the thin film transistor can be used in a pixel portion and further in a driver circuit, so that a semiconductor device having a display function (also referred to as a display device) can be manufactured. Further, part or whole of a driver circuit can be formed over the same substrate as a pixel portion, using the thin film transistor described in Embodiment 4, whereby a system-on-panel can be obtained.

The display device includes a display element. As the display element, a liquid crystal element (also referred to as a liquid crystal display element) or a light-emitting element (also referred to as a light-emitting display element) can be used. The light-emitting element includes, in its category, an element whose luminance is controlled by a current or a voltage, and specifically includes, in its category, an inorganic electroluminescent (EL) element, an organic EL element, and the like. Furthermore, a display medium whose contrast is changed by an electric effect, such as electronic ink, can be used.

In addition, the display device includes a panel in which a display element is sealed, and a module in which an IC and the like including a controller are mounted on the panel. Furthermore, an element substrate, which corresponds to one embodiment before the display element is completed in a manufacturing process of the display device, is provided with a means for supplying current to the display element in each of a plurality of pixels. Specifically, the element substrate may be in a state where only a pixel electrode of the display element is formed, a state after formation of a conductive film to be a pixel electrode and before etching of the conductive film to form the pixel electrode, or any other states.

Note that a display device in this specification means an image display device, a display device, or a light source (including a lighting device). Further, the "display device" includes the following modules in its category: a module to which a connector such as a flexible printed circuit (FPC), a tape automated bonding (TAB) tape, or a tape carrier package (TCP) is attached; a module having a TAB tape or a TCP at the tip of which a printed wiring board is provided; and a module having an integrated circuit (IC) which is directly mounted on a display element by a chip on glass (COG) method.

In this embodiment, the appearance and a cross section of a liquid crystal display panel, which is an embodiment of a semiconductor device, will be described with reference to FIGS. 10A to 10C. FIGS. 10A and 10B are top views of a panel in which highly reliable thin film transistors 4010 and 4011 each including the In—Ga—Zn—O-based film described in Embodiment 4 as an oxide semiconductor layer and a liquid crystal element 4013 formed over a first substrate 4001 are sealed between the first substrate 4001 and a second substrate 4006 with a sealant 4005. FIG. 10C is a cross-sectional view taken along line M-N of FIGS. 10A and 10B.

The sealant 4005 is provided so as to surround a pixel portion 4002 and a scan line driver circuit 4004 which are provided over the first substrate 4001. The second substrate 4006 is provided over the pixel portion 4002 and the scan line driver circuit 4004. Therefore, the pixel portion 4002 and the scan line driver circuit 4004 are sealed together with a liquid crystal layer 4008, by the first substrate 4001, the sealant 4005, and the second substrate 4006. A signal line driver circuit 4003 that is formed using a single crystal semiconductor film or a polycrystalline semiconductor film over a substrate separately prepared is mounted in a region that is different from the region surrounded by the sealant 4005 over the first substrate 4001.

Note that there is no particular limitation on the connection method of the driver circuit which is separately formed, and a COG method, a wire bonding method, a TAB method, or the like can be used. FIG. 10A illustrates an example in which the signal line driver circuit 4003 is mounted by a COG method, and FIG. 10B illustrates an example in which the signal line driver circuit 4003 is mounted by a TAB method.

Further, the pixel portion 4002 and the scan line driver circuit 4004, which are formed over the first substrate 4001, each include a plurality of thin film transistors. The thin film transistor 4010 included in the pixel portion 4002 and the thin film transistor 4011 included in the scan line driver circuit 4004 are illustrated in FIG. 10C. Over the thin film transistors 4010 and 4011, insulating layers 4020 and 4021 are provided.

The highly reliable thin film transistors including an In—Ga—Zn—O-based film as the oxide semiconductor layer which is described in Embodiment 4 can be used as the thin film transistors 4010 and 4011. In this embodiment, the thin film transistors 4010 and 4011 are n-channel thin film transistors.

A pixel electrode layer 4030 included in the liquid crystal element 4013 is electrically connected to the thin film transistor 4010. A counter electrode layer 4031 of the liquid crystal element 4013 is provided for the second substrate 4006. A portion where the pixel electrode layer 4030, the counter electrode layer 4031, and the liquid crystal layer 4008 overlap with one another corresponds to the liquid crystal element 4013. Note that the pixel electrode layer 4030 and the counter electrode layer 4031 are provided with an insulating layer 4032 and an insulating layer 4033, respectively, which each function as an alignment film, and the liquid crystal layer 4008 is sandwiched between the pixel electrode layer 4030 and the counter electrode layer 4031 with the insulating layers 4032 and 4033 therebetween. Although not illustrated, a color filter may be provided on either the first substrate 4001 side or the second substrate 4006 side.

Note that the first substrate 4001 and the second substrate 4006 can be formed of glass, metal (typically, stainless steel), ceramic, or plastic. As plastics, a fiberglass-reinforced plastics (FRP) plate, a polyvinyl fluoride (PVF) film, a polyester film, or an acrylic resin film can be used. In addition, a sheet with a structure in which an aluminum foil is sandwiched between PVF films or polyester films can be used.

Reference numeral 4035 denotes a columnar spacer obtained by selectively etching an insulating film and is provided to control the distance between the pixel electrode layer 4030 and the counter electrode layer 4031 (a cell gap). Alternatively, a spherical spacer may also be used. In addition, the counter electrode layer 4031 is electrically connected to a common potential line formed over the same substrate as the thin film transistor 4010. With use of a common connection portion, the counter electrode layer 4031 and the common potential line can be electrically connected to each other by conductive particles arranged between a pair of substrates. Note that the conductive particles are included in the sealant 4005.

Alternatively, liquid crystal exhibiting a blue phase for which an alignment film is unnecessary may be used. A blue phase is one of liquid crystal phases, which appears just before a cholesteric phase changes into an isotropic phase while temperature of cholesteric liquid crystal is increased. Since the blue phase appears within an only narrow range of temperature, a liquid crystal composition containing a chiral agent at 5 wt % or more so as to improve the temperature range is used for the liquid crystal layer 4008. The liquid crystal composition including liquid crystal exhibiting a blue phase and a chiral agent has a short response time of greater than or equal to 10 μsec and less than or equal to 100 μsec and is optically isotropic; therefore, alignment treatment is not necessary and viewing angle dependence is small.

Note that although this embodiment shows an example of a transmissive liquid crystal display device, the present invention can also be applied to a reflective liquid crystal display device or a semi-transmissive liquid crystal display device.

While an example of the liquid crystal display device in which the polarizing plate is provided on the outer side of the substrate (on the viewer side) and the coloring layer and the electrode layer used for a display element are provided on the inner side of the substrate in that order is described in this embodiment, the polarizing plate may be provided on the inner side of the substrate. The stacked structure of the polarizing plate and the coloring layer is not limited to this embodiment and may be set as appropriate depending on materials of the polarizing plate and the coloring layer or conditions of manufacturing process. Further, a light-blocking film serving as a black matrix may be provided.

In this embodiment, in order to reduce the surface roughness of the thin film transistor and to improve the reliability of the thin film transistor, the thin film transistor obtained by Embodiment 4 is covered with the insulating layers (the insulating layer 4020 and the insulating layer 4021) serving as a protective film or a planarizing insulating film. Note that the protective film is provided to prevent entry of contaminant impurities such as organic substance, metal, or moisture existing in air and is preferably a dense film. The protective film may be formed with a single layer or a stacked layer of a silicon oxide film, a silicon nitride film, a silicon oxynitride film, a silicon nitride oxide film, an aluminum oxide film, an aluminum nitride film, an aluminum oxynitride film, and/or an aluminum nitride oxide film by a sputtering method. Although an example in which the protective film is formed by a sputtering method is described in this embodiment, the present invention is not limited to this method and a variety of methods may be employed.

In this embodiment, the insulating layer 4020 having a stacked-layer structure is formed as a protective film. Here, a silicon oxide film is formed by a sputtering method, as a first layer of the insulating layer 4020. The use of a silicon oxide film as a protective film has an effect of preventing hillock of an aluminum film which is used as the source and drain electrode layers.

As a second layer of the protective film, an insulating layer is formed. Here, a silicon nitride film is formed by a sputtering method, as a second layer of the insulating layer 4020. The use of the silicon nitride film as the protective film can prevent mobile ions of sodium or the like from entering a semiconductor region so that variation in electrical characteristics of the TFT can be suppressed.

After the protective film is formed, annealing (at higher than or equal to 300° C. and lower than or equal to 400° C.) of the oxide semiconductor layer may be performed.

The insulating layer 4021 is formed as the planarizing insulating film. The insulating layer 4021 can be formed using a heat resistant organic material such as acrylic, polyimide, benzocyclobutene, polyamide, or epoxy. Other than such organic materials, it is also possible to use a low-dielectric constant material (a low-k material), a siloxane-based resin, PSG (phosphosilicate glass), BPSG (borophosphosilicate glass), or the like. Note that the insulating layer 4021 may be formed by stacking a plurality of insulating films formed of these materials.

Note that the siloxane-based resin corresponds to a resin including a Si—O—Si bond formed using a siloxane-based material as a starting material. The siloxane-based resin may include as a substituent an organic group (e.g., an alkyl group or an aryl group) or a fluoro group. In addition, the organic group may include a fluoro group.

There is no particular limitation on the method for forming the insulating layer 4021, and the insulating layer 4021 can be formed, depending on the material, by a sputtering method, an SOG method, spin coating, dipping, spray coating, a droplet discharge method (such as an inkjet method, screen printing, or offset printing), or with a tool such as a doctor knife, a roll coater, a curtain coater, or a knife coater. In the case where the insulating layer 4021 is formed with the use of a liquid material, annealing (at higher than or equal to 300° C. and lower than or equal to 400° C.) of the oxide semiconductor layer may be performed at the same time as a baking step. When the baking of the insulating layer 4021 and the annealing of the oxide semiconductor layer are performed at the same time, a semiconductor device can be manufactured efficiently.

The pixel electrode layer 4030 and the counter electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

Conductive compositions including a conductive high molecule (also referred to as a conductive polymer) can be used for the pixel electrode layer 4030 and the counter electrode layer 4031. The pixel electrode formed using the conductive composition preferably has a sheet resistance of less than or equal to 10000 ohms per square and a transmittance of greater than or equal to 70% at a wavelength of 550 nm Further, the resistivity of the conductive high molecule included in the conductive composition is preferably less than or equal to 0.1 Ω·cm.

As the conductive high molecule, a so-called π-electron conjugated conductive polymer can be used. For example, polyaniline or a derivative thereof, polypyrrole or a derivative thereof, polythiophene or a derivative thereof, a copolymer of two or more kinds of them, and the like can be given.

Further, a variety of signals and potentials are supplied to the signal line driver circuit 4003 which is formed separately, the scan line driver circuit 4004, or the pixel portion 4002 from an FPC 4018.

In this embodiment, a connection terminal electrode 4015 is formed from the same conductive film as that of the pixel electrode layer 4030 included in the liquid crystal element 4013, and a terminal electrode 4016 is formed from the same conductive film as that of the source and drain electrode layers of the thin film transistors 4010 and 4011.

The connection terminal electrode 4015 is electrically connected to a terminal included in the FPC 4018 via an anisotropic conductive film 4019.

FIGS. 10A to 10C illustrate an example in which the signal line driver circuit 4003 is formed separately and mounted on the first substrate 4001; however, this embodiment is not limited to this structure. The scan line driver circuit may be separately formed and then mounted, or only part of the signal line driver circuit or part of the scan line driver circuit may be separately formed and then mounted.

Figure 11:
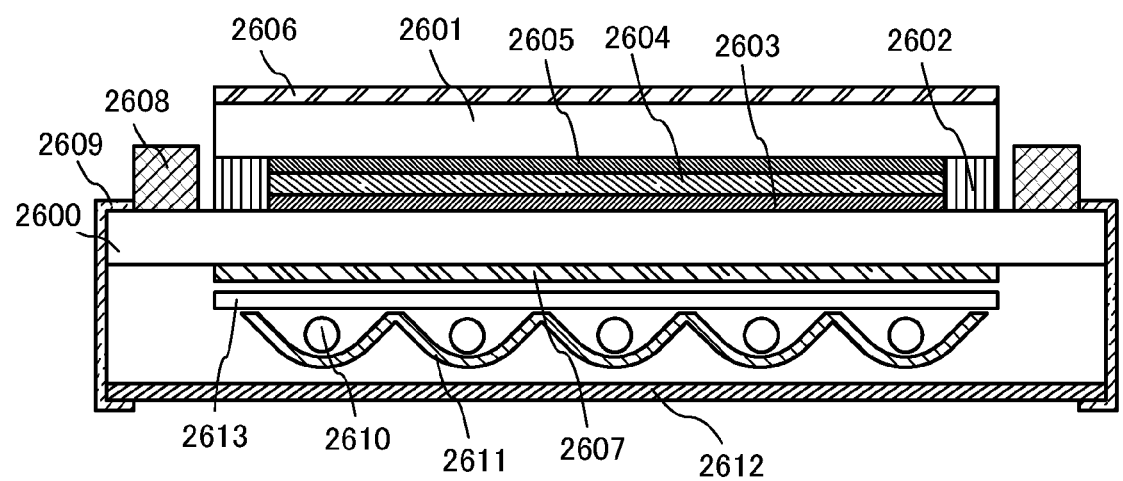
FIG. 11 illustrates a semiconductor device according to an embodiment.

FIG. 11 illustrates an example in which a liquid crystal display module is formed as a semiconductor device by using a TFT substrate 2600 formed using the TFT described in Embodiment 4.

FIG. 11 shows an example of a liquid crystal display module, in which the TFT substrate 2600 and a counter substrate 2601 are fixed to each other with a sealant 2602, and a pixel portion 2603 including a TFT or the like, a display element 2604 including a liquid crystal layer, a coloring layer 2605, and a polarizing plate 2606 are provided between the substrates to form a display region. The coloring layer 2605 is necessary to perform color display. In the RGB system, respective coloring layers corresponding to colors of red, green, and blue are provided for respective pixels. The polarizing plates 2606 and 2607 and a diffusion plate 2613 are provided outside the TFT substrate 2600 and the counter substrate 2601. A light source includes a cold cathode fluorescent lamp 2610 and a reflective plate 2611, and a circuit substrate 2612 is connected to a wiring circuit portion 2608 of the TFT substrate 2600 by a flexible wiring board 2609 and includes an external circuit such as a control circuit or a power source circuit. The polarizing plate and the liquid crystal layer may be stacked with a retardation plate therebetween.

For the liquid crystal display module, a twisted nematic (TN) mode, an in-plane-switching (IPS) mode, a fringe field switching (FFS) mode, a multi-domain vertical alignment (MVA) mode, a patterned vertical alignment (PVA) mode, an axially symmetric aligned micro-cell (ASM) mode, an optical compensated birefringence (OCB) mode, a ferroelectric liquid crystal (FLC) mode, an antiferroelectric liquid crystal (AFLC) mode, or the like can be used.

Through the above process, a highly reliable liquid crystal display panel as a semiconductor device can be manufactured.

Note that the structure described in this embodiment can be combined with any of the structures described in other embodiments as appropriate.

(Embodiment 7)

In this embodiment, an example of electronic paper will be described as a semiconductor device to which the thin film transistor described in Embodiment 4 is applied.

Figure 12:
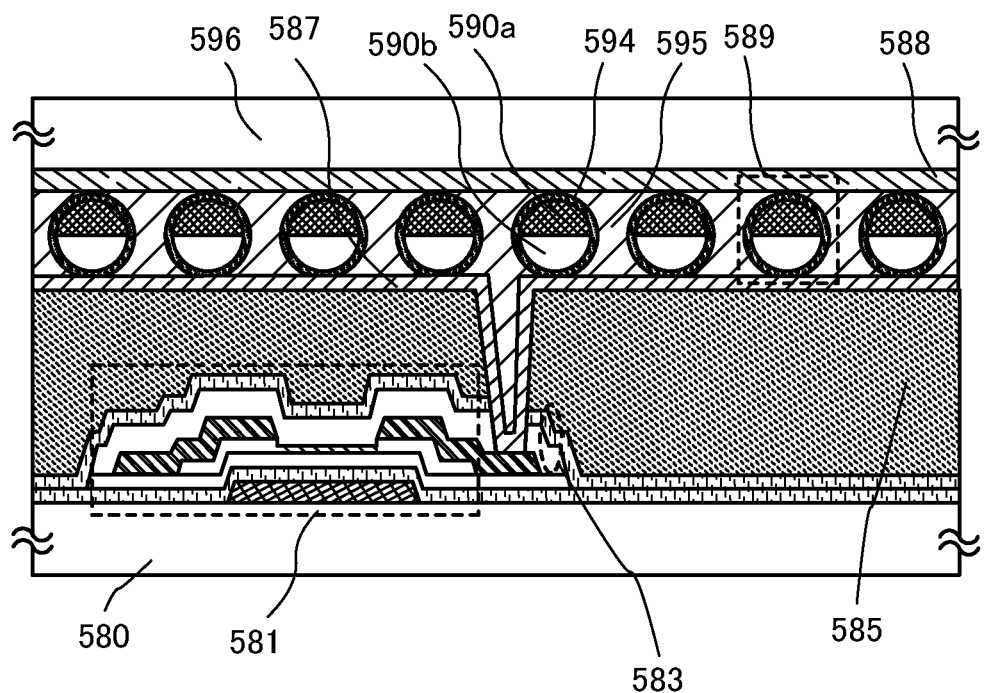
FIG. 12 illustrates a semiconductor device according to an embodiment.

FIG. 12 illustrates active matrix electronic paper as an example of a semiconductor device. A thin film transistor 581 used in the semiconductor device can be manufactured by application of the thin film transistor described in Embodiment 4.

The electronic paper in FIG. 12 is an example of a display device using a twisting ball display system. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

The thin film transistor 581 formed over the substrate 580 is a thin film transistor with a bottom gate structure, and a source or drain electrode layer thereof is in contact with a first electrode layer 587 through an opening formed in an insulating layer 583 and an insulating layer 585, whereby the thin film transistor 581 is electrically connected to the first electrode layer 587. Between the first electrode layer 587 and a second electrode layer 588, spherical particles 589 each having a black region 590a, a white region 590b, and a cavity 594 filled with liquid are provided. A space around the spherical particles 589 is filled with a filler 595 such as a resin (see FIG. 12). In this embodiment, the first electrode layer 587 corresponds to a pixel electrode, and the second electrode layer 588 corresponds to a common electrode. The second electrode layer 588 is electrically connected to a common potential line provided over the same substrate as the thin film transistor 581. With the use of a common connection portion, the second electrode layer 588 and the common potential line can be electrically connected to each other through conductive particles provided between the substrate 580 and a substrate 596.

Further, instead of the twisting ball, an electrophoretic element can also be used. A microcapsule having a diameter of approximately greater than or equal to 10 μm and less than or equal to 200 μm in which transparent liquid, positively charged white microparticles, and negatively charged black microparticles are encapsulated, is used. In the microcapsule provided between the first electrode layer and the second electrode layer, when an electric field is applied by the first electrode layer and the second electrode layer, the white microparticles and the black microparticles move in opposite directions, so that white or black can be displayed. A display element using this principle is an electrophoretic display element and is generally called electronic paper. The electrophoretic display element has higher reflectance than a liquid crystal display element, and thus, an auxiliary light is unnecessary, power consumption is low, and a display portion can be recognized in a dim place. In addition, even when power is not supplied to the display portion, an image which has been displayed once can be maintained. Accordingly, a displayed image can be stored even if a semiconductor device having a display function (which may be referred to simply as a display device or a semiconductor device provided with a display device) is distanced from an electric wave source.

Through this process, a highly reliable electronic paper as a semiconductor device can be manufactured.

Note that the structure described in this embodiment can be combined with any of the structures described in other embodiments as appropriate.

(Embodiment 8)

In this embodiment, an example of a light-emitting display device will be described as a semiconductor device to which the thin film transistor described in Embodiment 4 is applied. As a display element included in a display device, a light-emitting element utilizing electroluminescence is described here. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of a voltage to a light-emitting element, electrons and holes are separately injected from a pair of electrodes into a layer containing a light-emitting organic compound, so that current flows. Then, recombination of these carriers (the electrons and holes) makes the light-emitting organic compound to form an excited state and to emit light when it returns from the excited state to a ground state. Owing to such a mechanism, this light-emitting element is referred to as a current-excitation light-emitting element.

Inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that an example of an organic EL element as a light-emitting element is described here.

Figure 13:
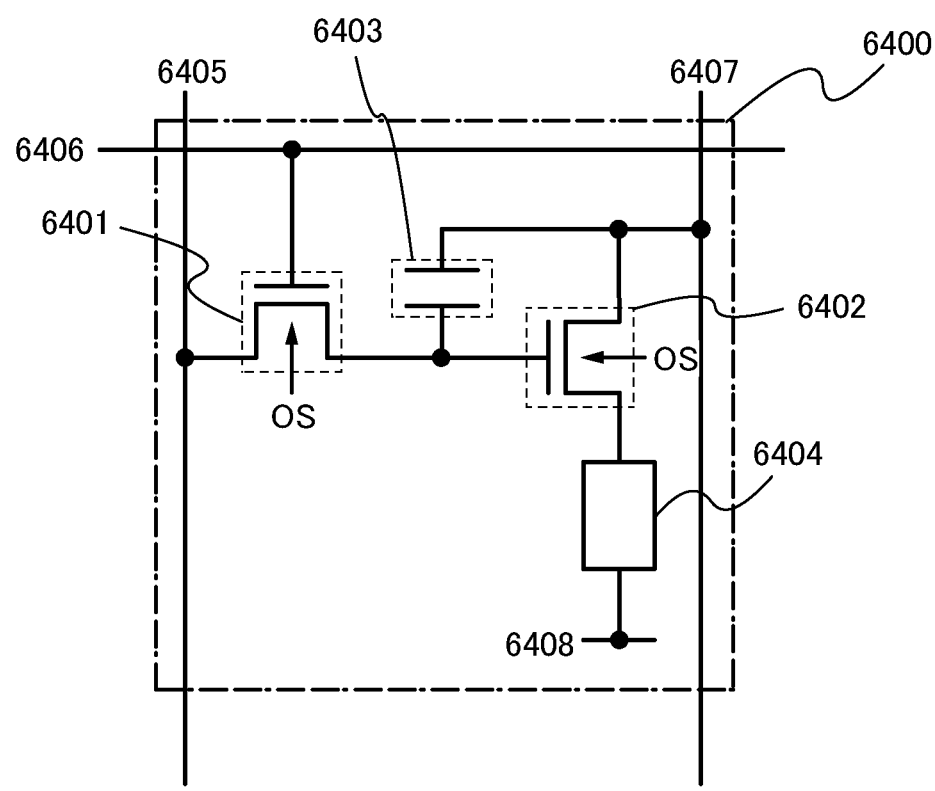
FIG. 13 illustrates a semiconductor device according to an embodiment.

FIG. 13 illustrates an example of a pixel structure as an example of a semiconductor device of the present invention, which can be driven by a digital time grayscale method.

A structure and operation of a pixel to which digital time grayscale driving can be applied are described. Here, an example is described in which one pixel includes two n-channel transistors each of which is described in Embodiment 4 and each of which includes the oxide semiconductor layer (In—Ga—Zn—O-based film) in a channel formation region.

A pixel 6400 includes a switching transistor 6401, a driver transistor 6402, a light-emitting element 6404, and a capacitor 6403. A gate of the switching transistor 6401 is connected to a scan line 6406, a first electrode (one of a source electrode and a drain electrode) of the switching transistor 6401 is connected to a signal line 6405, and a second electrode (the other of the source electrode and the drain electrode) of the switching transistor 6401 is connected to a gate of the driver transistor 6402. The gate of the driver transistor 6402 is connected to a power supply line 6407 via the capacitor 6403, a first electrode of the driver transistor 6402 is connected to the power supply line 6407, and a second electrode of the driver transistor 6402 is connected to a first electrode (pixel electrode) of the light-emitting element 6404. A second electrode of the light-emitting element 6404 corresponds to a common electrode 6408. The common electrode 6408 is electrically connected to a common potential line provided over the same substrate. The connection portion may be used as a common connection portion.

The second electrode (common electrode 6408) of the light-emitting element 6404 is set to a low power supply potential. Note that the low power supply potential is a potential satisfying the low power supply potential<a high power supply potential with reference to the high power supply potential that is set to the power supply line 6407. As the low power supply potential, GND, 0 V, or the like may be employed, for example. A potential difference between the high power supply potential and the low power supply potential is applied to the light-emitting element 6404 and current is supplied to the light-emitting element 6404, so that the light-emitting element 6404 emits light. Here, in order to make the light-emitting element 6404 emit light, each potential is set so that the potential difference between the high power supply potential and the low power supply potential is a forward threshold voltage or higher of the light-emitting element 6404.

Note that gate capacitance of the driver transistor 6402 may be used as a substitute for the capacitor 6403, so that the capacitor 6403 can be omitted. The gate capacitance of the driver transistor 6402 may be formed between the channel region and the gate electrode.

In the case of a voltage-input voltage driving method, a video signal is input to the gate of the driver transistor 6402 so that the driver transistor 6402 is in either of two states of being sufficiently turned on or turned off. That is, the driver transistor 6402 operates in a linear region. Since the driver transistor 6402 operates in the linear region, a voltage higher than the voltage of the power supply line 6407 is applied to the gate of the driver transistor 6402. Note that a voltage higher than or equal to (voltage of the power supply line+Vth of the driver transistor 6402) is applied to the signal line 6405.

In the case of performing analog grayscale driving instead of digital time grayscale driving, the same pixel structure as FIG. 13 can be used by changing signal input.

In the case of performing analog grayscale driving, a voltage higher than or equal to (forward voltage of the light-emitting element 6404+Vth of the driver transistor 6402) is applied to the gate of the driver transistor 6402. The forward voltage of the light-emitting element 6404 indicates a voltage at which a desired luminance is obtained, and includes at least forward threshold voltage. The video signal by which the driver transistor 6402 operates in a saturation region is input, so that current can be supplied to the light-emitting element 6404. In order for the driver transistor 6402 to operate in the saturation region, the potential of the power supply line 6407 is set higher than the gate potential of the driver transistor 6402. When an analog video signal is used, it is possible to feed current to the light-emitting element 6404 in accordance with the video signal and perform analog grayscale driving.

Note that the pixel structure illustrated in FIG. 13 is not limited thereto. For example, the pixel illustrated in FIG. 13 may further include a switch, a resistor, a capacitor, a transistor, a logic circuit, or the like.

Next, a structure of a light-emitting element will be described with reference to FIGS. 14A to 14C. Here, a cross-sectional structure of a pixel will be described by taking an n-channel driver TFT as an example. Driver TFTs 7011, 7021, and 7001 used for semiconductor devices illustrated in FIGS. 14A to 14C can be manufactured in a manner similar to that of the thin film transistor described in Embodiment 4 and are highly reliable thin film transistors each including an In—Ga—Zn—O-based film as an oxide semiconductor layer.

In order to extract light emitted from the light-emitting element, at least one of an anode and a cathode is required to transmit light. A thin film transistor and a light-emitting element are formed over a substrate. A light-emitting element can have a top emission structure, in which light emission is extracted through the surface opposite to the substrate; a bottom emission structure, in which light emission is extracted through the surface on the substrate side; or a dual emission structure, in which light emission is extracted through the surface opposite to the substrate and the surface on the substrate side. The pixel structure of the present invention can be applied to a light-emitting element having any of these emission structures.

A light-emitting element having the bottom emission structure is described with reference to FIG. 14A.

FIG. 14A is a cross-sectional view of a pixel in the case where the driver TFT 7011 formed over a substrate 7030 is an n-channel TFT and light is emitted from a light-emitting element 7012 to a first electrode 7013 side. In FIG. 14A, the first electrode 7013 of the light-emitting element 7012 is formed over a conductive film 7017 having a light-transmitting property with respect to visible light, which is electrically connected to a drain electrode layer of the driver TFT 7011, and an EL layer 7014 and a second electrode 7015 are stacked in this order over the first electrode 7013.

As the conductive film 7017 having a light-transmitting property with respect to visible light, a conductive film having a light-transmitting property with respect to visible light, such as a film of indium oxide including tungsten oxide, indium zinc oxide including tungsten oxide, indium oxide including titanium oxide, indium tin oxide including titanium oxide, indium tin oxide, indium zinc oxide, or indium tin oxide to which silicon oxide is added can be used.

A variety of materials can be used for the first electrode 7013 of the light-emitting element. For example, in the case where the first electrode 7013 is used as a cathode, it is preferable to use a material having a low work function, specifically, an alkali metal such as Li or Cs; an alkaline earth metal such as Mg, Ca, or Sr; an alloy containing any of these metals (e.g., Mg:Ag or Al:Li); or a rare earth metal such as Yb or Er, for example. In FIG. 14A, the first electrode 7013 is formed to have a thickness that allows visible light to transmit (preferably, approximately 5 nm to 30 nm). For example, an aluminum film with a thickness of 20 nm is used as the first electrode 7013.

Note that the conductive film 7017 having a light-transmitting property with respect to visible light and the first electrode 7013 may be formed by stacking a conductive film having a light-transmitting property with respect to visible light and an aluminum film and then performing selective etching. In this case, the etching can be performed using the same mask, which is preferable.

The peripheral portion of the first electrode 7013 is covered with a partition 7019. The partition 7019 is formed using an organic resin film of polyimide, acrylic, polyamide, epoxy, or the like, an inorganic insulating film, or organic polysiloxane. It is particularly preferable that the partition 7019 be formed using a photosensitive resin material to have an opening over the first electrode 7013 so that a sidewall of the opening is formed as an inclined surface with continuous curvature. In the case where a photosensitive resin material is used for the partition 7019, a step of forming a resist mask can be omitted.

The EL layer 7014 which is formed over the first electrode 7013 and the partition 7019 may include at least a light-emitting layer and be formed using a single layer or a plurality of layers stacked. When the EL layer 7014 is formed using a plurality of layers, an electron-injection layer, an electron-transport layer, a light-emitting layer, a hole-transport layer, and a hole-injection layer are stacked in that order over the first electrode 7013 serving as a cathode. It is not necessary to form all of these layers.

The stacking order is not limited to the above stacking order, and a hole-injection layer, a hole-transport layer, a light-emitting layer, an electron-transport layer, and an electron-injection layer may be stacked in that order over the first electrode 7013 serving as an anode. However, from a power consumption standpoint, it is preferable that the first electrode 7013 serve as a cathode and an electron-injection layer, an electron-transport layer, a light-emitting layer, a hole-transport layer, and a hole-injection layer be stacked in that order over the first electrode 7013 because voltage rise in the driver circuit portion can be suppressed and power consumption can be reduced.

As the second electrode 7015 formed over the EL layer 7014, various materials can be used. For example, in the case of using the second electrode 7015 as an anode, a material having a high work function (specifically, a work function higher than or equal to 4.0 eV), such as ZrN, Ti, W, Ni, Pt, Cr, or a transparent conductive material such as ITO, IZO, or ZnO, is preferably used. As a light-blocking film 7016 over the second electrode 7015, a metal which blocks light, a metal which reflects light, or the like is used. In this embodiment, an ITO film is used as the second electrode 7015 and a Ti film is used as the light-blocking film 7016.

The light-emitting element 7012 corresponds to a region where the EL layer 7014 including a light-emitting layer is sandwiched between the first electrode 7013 and the second electrode 7015. In the case of the element structure illustrated in FIG. 14A, light is emitted from the light-emitting element 7012 to the first electrode 7013 side as indicated by an arrow.

Note that in FIG. 14A, light emitted from the light-emitting element 7012 passes through a color filter layer 7033, an insulating layer 7032b, an oxide insulating layer 7032a, a gate insulating layer 7031, and a substrate 7030 to be emitted.

The color filter layer 7033 is formed by a droplet discharge method such as an inkjet method, a printing method, an etching method with the use of a photolithography technique, or the like.

The color filter layer 7033 is covered with the overcoat layer 7034, and also covered with the protective insulating layer 7035. Although the overcoat layer 7034 is illustrated to have a small thickness in FIG. 14A, the overcoat layer 7034 has a function of reducing unevenness caused by the color filter layer 7033 with the use of a resin material such as an acrylic resin.

A contact hole which is formed in the protective insulating layer 7035 and the insulating layer 7032 and reaches the drain electrode layer is provided in a portion which overlaps with the partition 7019.

Next, a light-emitting element having the dual emission structure is described with reference to FIG. 14B.

In FIG. 14B, a first electrode 7023 of a light-emitting element 7022 is formed over a conductive film 7027 having a light-transmitting property with respect to visible light, which is electrically connected to a drain electrode layer of the driver TFT 7021 formed over a substrate 7040, and an EL layer 7024 and a second electrode 7025 are stacked in that order over the first electrode 7023.

As the conductive film 7027 having a light-transmitting property with respect to visible light, a conductive film having a light-transmitting property with respect to visible light, such as a film of indium oxide including tungsten oxide, indium zinc oxide including tungsten oxide, indium oxide including titanium oxide, indium tin oxide including titanium oxide, indium tin oxide, indium zinc oxide, or indium tin oxide to which silicon oxide is added can be used.

A variety of materials can be used for the first electrode 7023. For example, in the case where the first electrode 7023 is used as a cathode, the first electrode 7023 is preferably formed using, for example, a material having a low work function, such as an alkali metal such as Li or Cs, an alkaline earth metal such as Mg, Ca, or Sr, an alloy containing any of these metals (e.g., Mg:Ag or Al:Li), or a rare earth metal such as Yb or Er. In this embodiment, the first electrode 7023 functions as a cathode and is formed to have a thickness through which visible light can be transmitted (preferably, approximately 5 nm to 30 nm). For example, an aluminum film with a thickness of 20 nm can be used as the cathode.

Note that the conductive film having a light-transmitting property with respect to visible light and the aluminum film may be stacked and then selectively etched, whereby the conductive film 7027 having a light-transmitting property with respect to visible light and the first electrode 7023 may be formed. In this case, etching can be performed with the use of the same mask, which is preferable.

The peripheral portion of the first electrode 7023 is covered with a partition 7029. The partition 7029 is formed using an organic resin film of polyimide, acrylic, polyamide, epoxy, or the like, an inorganic insulating film, or organic polysiloxane. It is particularly preferable that the partition 7029 be formed using a photosensitive resin material to have an opening over the first electrode 7023 so that a sidewall of the opening is formed as an inclined surface with continuous curvature. In the case where a photosensitive resin material is used for the partition 7029, a step of forming a resist mask can be omitted.

The EL layer 7024 which is formed over the first electrode 7023 and the partition 7029 may include a light-emitting layer and be formed using a single layer or a plurality of layers stacked. When the EL layer 7024 is formed using a plurality of layers, an electron-injection layer, an electron-transport layer, a light-emitting layer, a hole-transport layer, and a hole-injection layer are stacked in that order over the first electrode 7023 serving as a cathode. It is not necessary to form all of these layers.

The stacking order is not limited to the above stacking order, and a hole-injection layer, a hole-transport layer, a light-emitting layer, an electron-transport layer, and an electron-injection layer may be stacked in that order over the first electrode 7023 used as an anode. However, from a power consumption standpoint, it is preferable that the first electrode 7023 used as a cathode and an electron-injection layer, an electron-transport layer, a light-emitting layer, a hole-transport layer, and a hole-injection layer be stacked in that order over the first electrode 7023 because power consumption can be reduced.

As the second electrode 7025 formed over the EL layer 7024, various materials can be used. For example, in the case where the second electrode 7025 is used as an anode, a material having a high work function, for example, a transparent conductive material such as ITO, IZO, or ZnO is preferable. In this embodiment, the second electrode 7025 is used as an anode, and an ITO film containing silicon oxide is formed.

The light-emitting element 7022 corresponds to a region where the EL layer 7024 including a light-emitting layer is sandwiched between the first electrode 7023 and the second electrode 7025. In the case of the element structure illustrated in FIG. 14B, light is emitted from the light-emitting element 7022 to both the second electrode 7025 side and the first electrode 7023 side as indicated by arrows.

Note that in FIG. 14B, light emitted from the light-emitting element 7022 to the first electrode 7023 side passes through a color filter layer 7043, an insulating layer 7042b, an oxide insulating layer 7041a, a gate insulating layer 7041, and a substrate 7040 to be emitted.

The color filter layer 7043 is formed by a droplet discharge method such as an inkjet method, a printing method, an etching method with the use of a photolithography technique, or the like.

The color filter layer 7043 is covered with the overcoat layer 7044, and also covered with the protective insulating layer 7045.

A contact hole which is formed in the protective insulating layer 7045 and the insulating layer 7042 and reaches the drain electrode layer is provided in a portion which overlaps with the partition 7029.

Note that in the case where the light-emitting element having a dual emission structure is used and full color display is performed on both display surfaces, light from the second electrode 7025 side does not pass through the color filter layer 7043; therefore, a sealing substrate provided with another color filter layer is preferably provided on the second electrode 7025.

Next, a light-emitting element having a top emission structure is described with reference to FIG. 14C.

FIG. 14C is a cross-sectional view of a pixel in the case where the driver TFT 7001 is an n-channel TFT and light is emitted from a light-emitting element 7002 to a second electrode 7005 side. In FIG. 14C, the first electrode 7003, which is electrically connected to a drain electrode layer of the driver TFT 7001, of the light-emitting element 7002 is formed, and an EL layer 7004 and the second electrode 7005 are stacked in this order over the first electrode 7003.

A variety of materials can be used for the first electrode 7003. For example, in the case where the first electrode 7003 is used as a cathode, it is preferable to use a material having a low work function, specifically, an alkali metal such as Li or Cs; an alkaline earth metal such as Mg, Ca, or Sr; an alloy containing any of these metals (e.g., Mg:Ag or Al:Li); or a rare earth metal such as Yb or Er, for example.

The peripheral portion of the first electrode 7003 is covered with a partition 7009. The partition 7009 is formed using an organic resin film of polyimide, acrylic, polyamide, epoxy, or the like, an inorganic insulating film, or organic polysiloxane. It is particularly preferable that the partition 7009 be formed using a photosensitive resin material to have an opening over the first electrode 7003 so that a sidewall of the opening is formed as an inclined surface with continuous curvature. In the case where a photosensitive resin material is used for the partition 7009, a step of forming a resist mask can be omitted.

The EL layer 7004 which is formed over the first electrode 7003 and the partition 7009 may include at least a light-emitting layer and be formed using a single layer or a plurality of layers stacked. When the EL layer 7004 is formed using a plurality of layers, an electron-injection layer, an electron-transport layer, a light-emitting layer, a hole-transport layer, and a hole-injection layer are stacked in that order over the first electrode 7003 used as a cathode. It is not necessary to form all of these layers.

The stacking order is not limited to the above stacking order, and a hole-injection layer, a hole-transport layer, a light-emitting layer, an electron-transport layer, and an electron-injection layer are stacked in that order over the first electrode 7003 used as an anode.

In FIG. 14C, a hole-injection layer, a hole-transport layer, a light-emitting layer, an electron-transport layer, and an electron-injection layer are stacked in this order over a stacked film in which a Ti film, an aluminum film, and a Ti film are formed in this order, and thereover, a stacked layer of a Mg:Ag alloy thin film and an ITO film is formed.

Note that when the TFT 7001 is an n-type TFT, it is preferable that an electron-injection layer, an electron-transport layer, a light-emitting layer, a hole-transport layer, and a hole-injection layer are stacked in that order over the first electrode 7003 because an increase in voltage in the driver circuit can be suppressed and power consumption can be reduced.

The second electrode 7005 is formed using a conductive film having a light-transmitting property with respect to visible light, such as a film of indium oxide containing tungsten oxide, indium zinc oxide containing tungsten oxide, indium oxide containing titanium oxide, indium tin oxide containing titanium oxide, indium tin oxide, indium zinc oxide, indium tin oxide to which silicon oxide is added, or the like may be used.

The light-emitting element 7002 corresponds to a region where the EL layer 7004 including a light-emitting layer is sandwiched between the first electrode 7003 and the second electrode 7005. In the case of the pixel illustrated in FIG. 14C, light is emitted from the light-emitting element 7002 to the second electrode 7005 side as indicated by an arrow.

In FIG. 14C, the drain electrode layer of the TFT 7001 is electrically connected to the first electrode 7003 through a contact hole provided in an oxide insulating layer 7052*a*, a protective insulating layer 7052*b*, an insulating layer 7053, and an insulating layer 7055. The insulating layer 7053 can be formed using a resin material such as polyimide, acrylic, benzocyclobutene, polyamide, or epoxy. In addition to such resin materials, it is also possible to use a low-dielectric constant material (low-k material), a siloxane-based resin, phosphosilicate glass (PSG), borophosphosilicate glass (BPSG), or the like. Note that the insulating layer 7053 may be formed by stacking a plurality of insulating films formed of these materials. There is no particular limitation on the method for forming the insulating layer 7053, and the insulating layer 7053 can be formed, depending on the material, by a sputtering method, an SOG method, spin coating, dipping, spray coating, a droplet discharge method (such as an inkjet method, screen printing, or offset printing), or with a tool such as a doctor knife, a roll coater, a curtain coater, or a knife coater.

The partition 7009 is provided so as to insulate the first electrode 7003 and a first electrode 7008 of an adjacent pixel. The partition 7009 is formed using an organic resin film of polyimide, acrylic, polyamide, epoxy, or the like, an inorganic insulating film, or organic polysiloxane. It is particularly preferable that the partition 7009 be formed using a photosensitive resin material to have an opening over the first electrode 7003 so that a sidewall of the opening is formed as an inclined surface with continuous curvature. In the case where a photosensitive resin material is used for the partition 7009, a step of forming a resist mask can be omitted.

In the structure of FIG. 14C, when full color display is performed, for example, the light-emitting element 7002 is used as a green light-emitting element, one of used as a blue light-emitting element. Alternatively, a light-emitting display device capable of full color display may be manufactured using four kinds of light-emitting elements which include a white light-emitting element in addition to three kinds of light-emitting elements.

In the structure of FIG. 14C, a light-emitting display device capable of full color display may be manufactured in such a way that all of a plurality of light-emitting elements which is arranged is white light-emitting elements and a sealing substrate having a color filter or the like is arranged on the light-emitting element 7002. A material which exhibits a single color such as white is formed and combined with a color filter or a color conversion layer, whereby full color display can be performed.

Needless to say, display of monochromatic light can also be performed. For example, a lighting system may be formed with the use of white light emission, or an area-color light-emitting device may be formed with the use of a single color light emission.

If necessary, an optical film such as a polarizing film including a circularly polarizing plate may be provided.

Note that, although the organic EL elements are described here as the light-emitting elements, an inorganic EL element can also be provided as a light-emitting element.

Note that the example is described in which a thin film transistor (a driver TFT) which controls the driving of a light-emitting element is electrically connected to the light-emitting element; however, a structure may be employed in which a TFT for current control is connected between the driver TFT and the light-emitting element.

The semiconductor device described in this embodiment is not limited to the structures illustrated in FIGS. 14A to 14C, and can be modified in various ways based on the spirit of techniques according to the present invention.

Figure 15A:
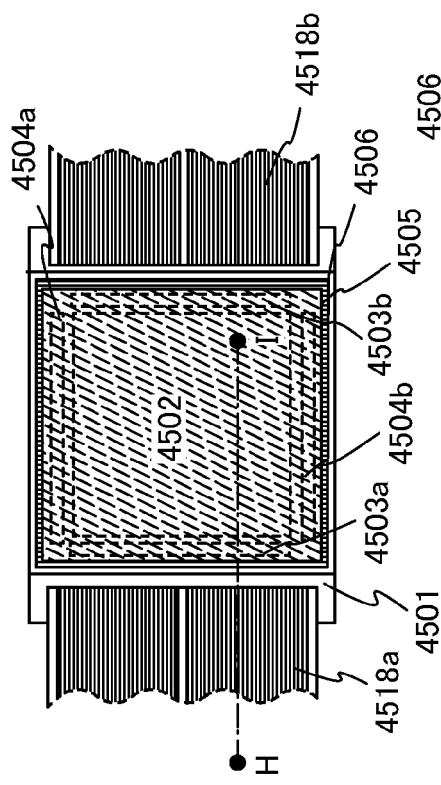
FIGS. 15A and 15B illustrate a semiconductor device according to an embodiment.
Figure 15B:
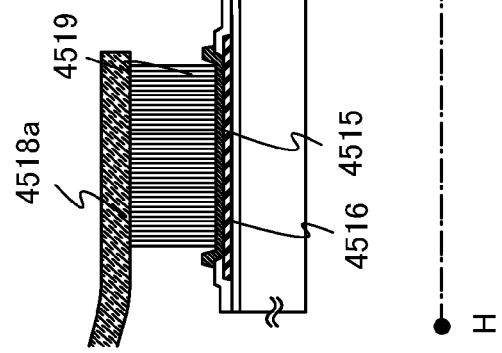

Next, the appearance and a cross section of a light-emitting display panel (also referred to as a light-emitting panel), which is one embodiment of a semiconductor device to which the thin film transistor described in Embodiment 4 is applied, will be described with reference to FIGS. 15A and 15B. FIG. 15A is a top view of a panel in which thin film transistors and a light-emitting element formed over a first substrate are sealed between the first substrate and a second substrate with a sealant. FIG. 15B is a cross-sectional view taken along the line H-I of FIG. 15A.

A sealant 4505 is provided so as to surround a pixel portion 4502, signal line driver circuits 4503*a* and 4503*b*, and scan line driver circuits 4504*a* and 4504*b* which are provided over a first substrate 4501. In addition, a second substrate 4506 is provided over the pixel portion 4502, the signal line driver circuits 4503*a* and 4503*b*, and the scan line driver circuits 4504*a* and 4504*b*. Accordingly, the pixel portion 4502, the signal line driver circuits 4503*a* and 4503*b*, and the scan line driver circuits 4504*a* and 4504*b* are sealed together with a filler 4507, by the first substrate 4501, the sealant 4505, and the second substrate 4506. In such a manner, it is preferable to pack (seal) the pixel portion 4502, the signal line driver circuits 4503*a* and 4503*b*, and the scan line driver circuits 4504*a* and 4504*b* with a protective film (such as an attachment film or an ultraviolet curable resin film) or a cover material with high air-tightness and little degasification so that the pixel portion 4502, the signal line driver circuits 4503*a* and 4503*b*, and the scan line driver circuits 4504*a* and 4504*b* are not exposed to the air.

The pixel portion 4502, the signal line driver circuits 4503*a* and 4503*b*, and the scan line driver circuits 4504*a* and 4504*b* formed over the first substrate 4501 each include a plurality of thin film transistors, and the thin film transistor 4510 included in the pixel portion 4502 and the thin film transistor 4509 included in the signal line driver circuit 4503*a* are illustrated as an example in FIG. 15B.

The highly reliable thin film transistor including an In—Ga—Zn—O-based film as the oxide semiconductor layer which is described in Embodiment 4 can be used as the thin film transistors 4509 and 4510. In this embodiment, the thin film transistors 4509 and 4510 are n-channel thin film transistors.

A conductive layer 4540 is provided over part of an insulating layer 4544 so as to overlap with a channel formation region of an oxide semiconductor layer in the thin film transistor 4509 for the driver circuit. The conductive layer 4540 is provided so as to overlap with the channel formation region of the oxide semiconductor layer, whereby the amount of change in the threshold voltage of the thin film transistor 4509 before and after BT test can be reduced. Further, a potential of the conductive layer 4540 may be the same as or different from that of a gate electrode layer of the thin film transistor 4509. The conductive layer 4540 can function also as a second gate electrode layer. Alternatively, the potential of the conductive layer 4540 may be GND or 0 V, or the conductive layer 4540 may be in a floating state.

Moreover, reference numeral 4511 denotes a light-emitting element. A first electrode layer 4517 which is a pixel electrode included in the light-emitting element 4511 is electrically connected to a source electrode layer or a drain electrode layer of the thin film transistor 4510. Note that the light-emitting element 4511 has a stacked structure of the first electrode layer 4517, an electroluminescent layer 4512, and a second electrode layer 4513; however, the structure of the light-emitting element is not limited to that shown in this embodiment. The structure of the light-emitting element 4511 can be changed as appropriate depending on the direction in which light is extracted from the light-emitting element 4511, or the like.

A bank 4520 is formed using an organic resin film, an inorganic insulating film, or organic polysiloxane. In particular, it is preferable that the bank 4520 be formed using a photosensitive material to have an opening portion over the first electrode layer 4517, and a sidewall of the opening portion be formed as an inclined surface with a continuous curvature.

The electroluminescent layer 4512 may be formed with a single layer or a plurality of layers stacked.

In order to prevent oxygen, hydrogen, moisture, carbon dioxide, or the like from entering the light-emitting element 4511, a protective film may be formed over the second electrode layer 4513 and the bank 4520. As the protective film, a silicon nitride film, a silicon nitride oxide film, a DLC film, or the like can be formed.

A variety of signals and potentials are supplied to the signal line driver circuits 4503a and 4503b, the scan line driver circuits 4504a and 4504b, or the pixel portion 4502 from an FPC 4518a and an FPC 4518b.

In this embodiment, a connection terminal electrode 4515 is formed using the same conductive film as the first electrode layer 4517 included in the light-emitting element 4511. A terminal electrode 4516 is formed using the same conductive film as the source electrode layers and the drain electrode layers of the thin film transistors 4509 and 4510.

The connection terminal electrode 4515 is electrically connected to a terminal included in the FPC 4518a via an anisotropic conductive film 4519.

The second substrate 4506 located in the direction in which light is extracted from the light-emitting element 4511 needs to have a light-transmitting property with respect to visible light. In that case, a material having a light-transmitting property with respect to visible light, such as a glass plate, a plastic plate, a polyester film, or an acrylic film is used for the substrate.

As the filler 4507, an ultraviolet curable resin or a thermosetting resin can be used in addition to an inert gas such as nitrogen or argon. For example, PVC (polyvinyl chloride), acrylic, polyimide, an epoxy resin, a silicone resin, PVB (polyvinyl butyral), or EVA (ethylene vinyl acetate) can be used. In this embodiment, nitrogen is used for the filler.

In addition, if needed, an optical film such as a polarizing plate, a circularly polarizing plate (including an elliptically polarizing plate), a retardation plate (a quarter-wave plate or a half-wave plate), or a color filter may be provided as appropriate on a light-emitting surface of the light-emitting element. Further, a polarizing plate or a circularly polarizing plate may be provided with an anti-reflection film. For example, anti-glare treatment by which reflected light can be diffused by projections and depressions on the surface so as to reduce the glare can be performed.

The signal line driver circuits 4503a and 4503b and the scan line driver circuits 4504a and 4504b may be mounted as driver circuits formed using a single crystal semiconductor film or a polycrystalline semiconductor film over a substrate separately prepared. In addition, only the signal line driver circuits or part thereof, or only the scan line driver circuits or part thereof may be separately formed and mounted. This embodiment is not limited to the structure illustrated in FIGS. 15A and 15B.

Through the above process, a highly reliable light-emitting display device (display panel) as a semiconductor device can be manufactured.

Note that the structure described in this embodiment can be combined with any of the structures described in other embodiments as appropriate.

(Embodiment 9)

A semiconductor device to which the thin film transistor described in Embodiment 4 is applied can be used as electronic paper. Electronic paper can be used for electronic appliances of a variety of fields as long as they can display data. For example, electronic paper can be applied to an e-book reader (electronic book), a poster, an advertisement in a vehicle such as a train, or displays of various cards such as a credit card. Examples of the electronic appliances are illustrated in FIGS. 16A and 16B and FIG. 17.

Figure 16A:
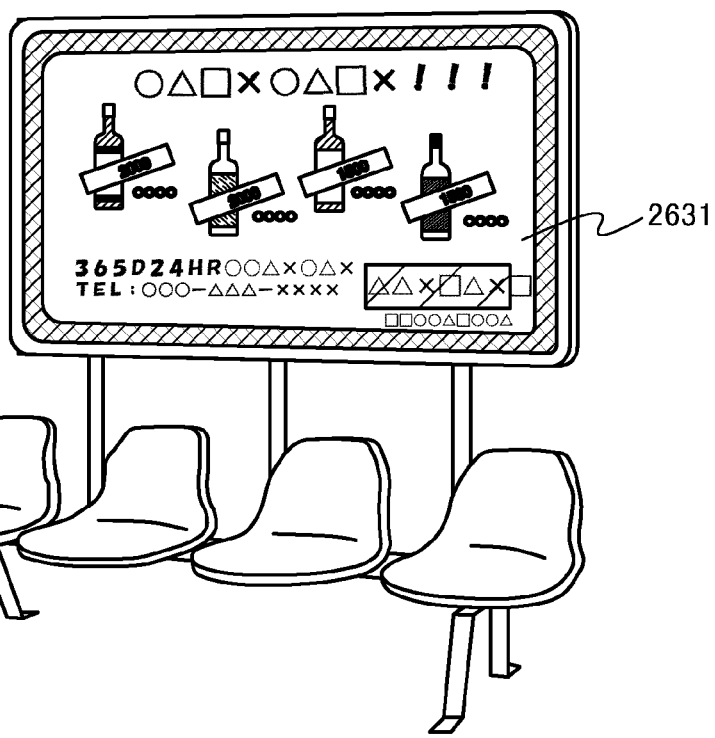
FIGS. 16A and 16B each illustrate an example of application of electronic paper.

FIG. 16A illustrates a poster 2631 using electronic paper. In the case where an advertising medium is paper, the advertisement is replaced by hand; however, by using the electronic paper, the advertising display can be changed in a short time. Furthermore, stable images can be obtained without display defects. Note that the poster may have a configuration capable of wirelessly transmitting and receiving data.

Figure 16B:
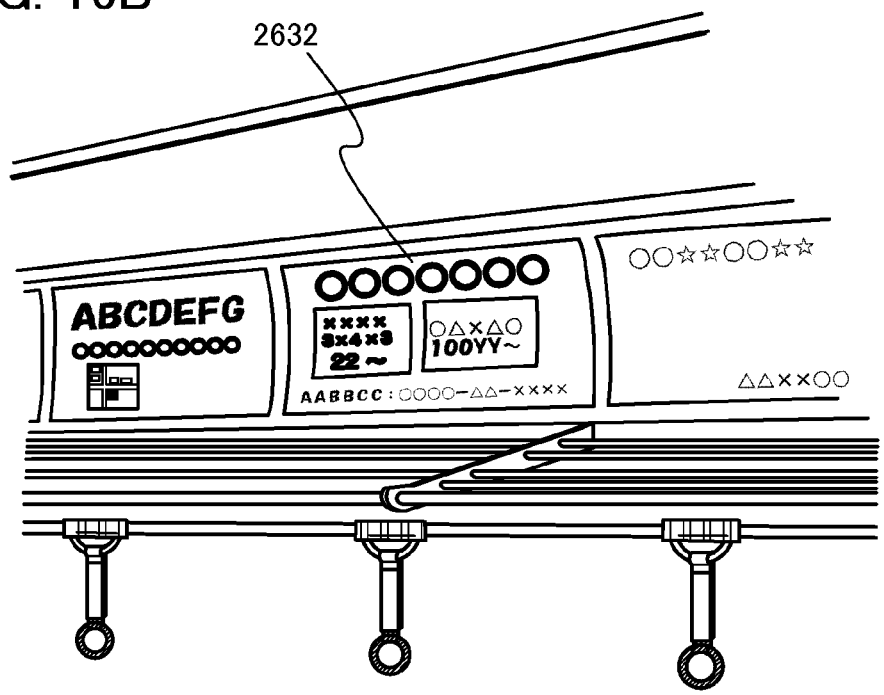

FIG. 16B illustrates an advertisement 2632 in a vehicle such as a train. In a case where an advertising medium is paper, the advertisement is replaced by hand; however, by using the electronic paper, much manpower is not needed and the advertising display can be changed in a short time. Furthermore, stable images can be obtained without display defects. Note that the advertisement in a vehicle may have a configuration capable of wirelessly transmitting and receiving data.

Figure 17:
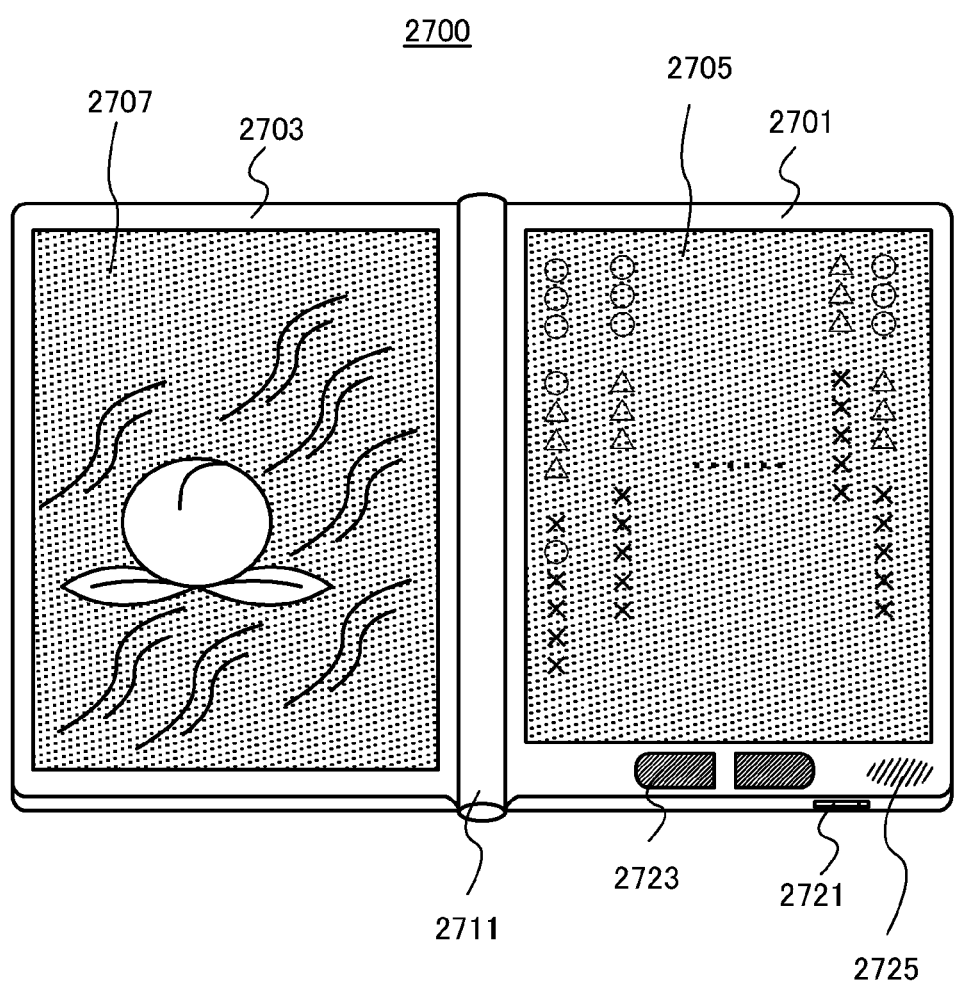
FIG. 17 illustrates an external view of an example of an e-book reader.

FIG. 17 illustrates an e-book reader 2700. For example, the e-book reader 2700 includes two housings, a housing 2701 and a housing 2703. The housings 2701 and 2703 are bound with each other by an axis portion 2711, along which the e-book reader 2700 is opened and closed. With such a structure, the e-book reader 2700 can operate like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, text can be displayed on a display portion on the right side (the display portion 2705 in FIG. 17) and images can be displayed on a display portion on the left side (the display portion 2707 in FIG. 17).

FIG. 17 illustrates an example in which the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, and the like may be provided on the same surface as the display portion of the housing. Furthermore, an external connection terminal (an earphone terminal, a USB terminal, a terminal that can be connected to various cables such as an AC adapter and a USB cable, or the like), a recording medium insertion portion, and the like may be provided on the back surface or the side surface of the housing. Moreover, the e-book reader 2700 may have a function of an electronic dictionary.

The e-book reader 2700 may have a configuration capable of wirelessly transmitting and receiving data. Through wireless communication, desired book data or the like can be purchased and downloaded from an electronic book server.

Note that the structure described in this embodiment can be combined with any of the structures described in other embodiments as appropriate.

(Embodiment 10)

A semiconductor device including the thin film transistor described in Embodiment 4 can be applied to a variety of electronic devices (including amusement machines). Examples of electronic devices are a television device (also referred to as a television or a television receiver), a monitor of a computer or the like, a digital camera, a digital video camera, a digital photo frame, a mobile phone (also referred to as a mobile telephone or a mobile phone device), a portable game machine, a portable information terminal, an audio reproducing device, a large-sized game machine such as a pachinko machine, and the like.

Figure 18A:
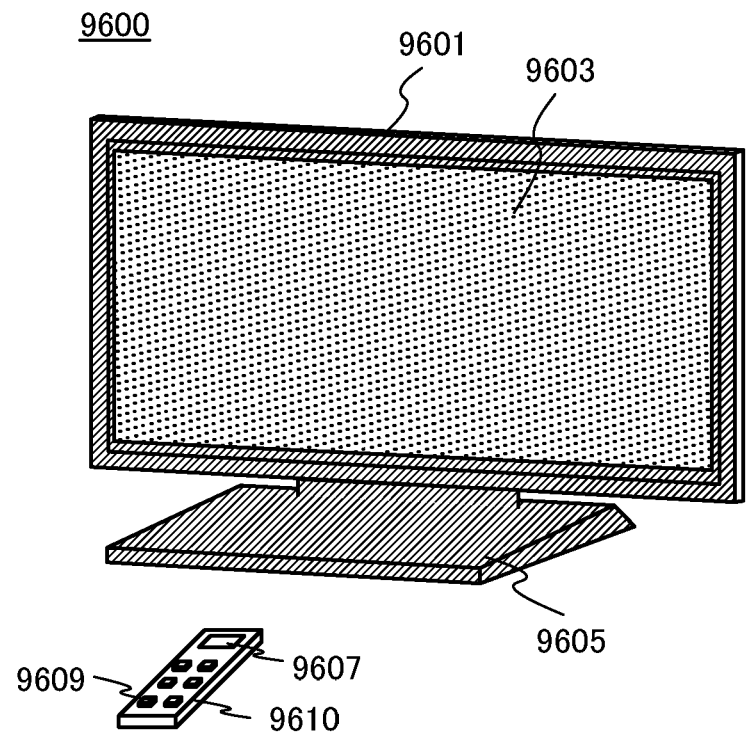
FIG. 18A is an external view of an example of a television device and FIG. 18B is an external view of an example of a digital photo frame.

FIG. 18A illustrates a television device 9600. In the television device 9600, a display portion 9603 is incorporated in a housing 9601. The display portion 9603 can display images. Here, the housing 9601 is supported by a stand 9605.

The television device 9600 can be operated with an operation switch of the housing 9601 or a separate remote controller 9610. Channels and volume can be controlled with an operation key 9609 of the remote controller 9610 so that an image displayed on the display portion 9603 can be controlled. Furthermore, the remote controller 9610 may be provided with a display portion 9607 for displaying data output from the remote controller 9610.

Note that the television device 9600 is provided with a receiver, a modem, and the like. With the use of the receiver, general television broadcasting can be received. Furthermore, when the television device 9600 is connected to a communication network by wired or wireless connection via the modem, one-way (from a transmitter to a receiver) or two-way (between a transmitter and a receiver, between receivers, or the like) data communication can be performed.

Figure 18B:
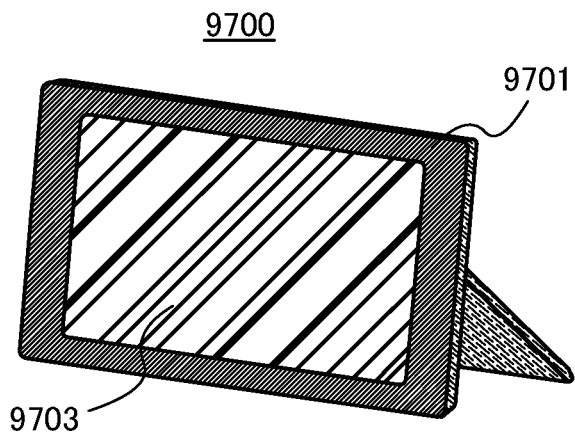

FIG. 18B illustrates a digital photo frame 9700. For example, in the digital photo frame 9700, a display portion 9703 is incorporated in a housing 9701. The display portion 9703 can display a variety of images. For example, the display portion 9703 can display data of an image taken with a digital camera or the like and function as a normal photo frame Note that the digital photo frame 9700 is provided with an operation portion, an external connection portion (a USB terminal, a terminal connectable to various cables such as a USB cable, or the like), a recording medium insertion portion, and the like. Although these components may be provided on the surface on which the display portion is provided, it is preferable to provide them on the side surface or the back surface for the design of the digital photo frame 9700. For example, a memory storing data of an image taken with a digital camera is inserted in the recording medium insertion portion of the digital photo frame, whereby the image data can be transferred and then displayed on the display portion 9703.

The digital photo frame 9700 may be configured to transmit and receive data wirelessly. The structure may be employed in which desired image data is transferred wirelessly to be displayed.

Figure 19A:
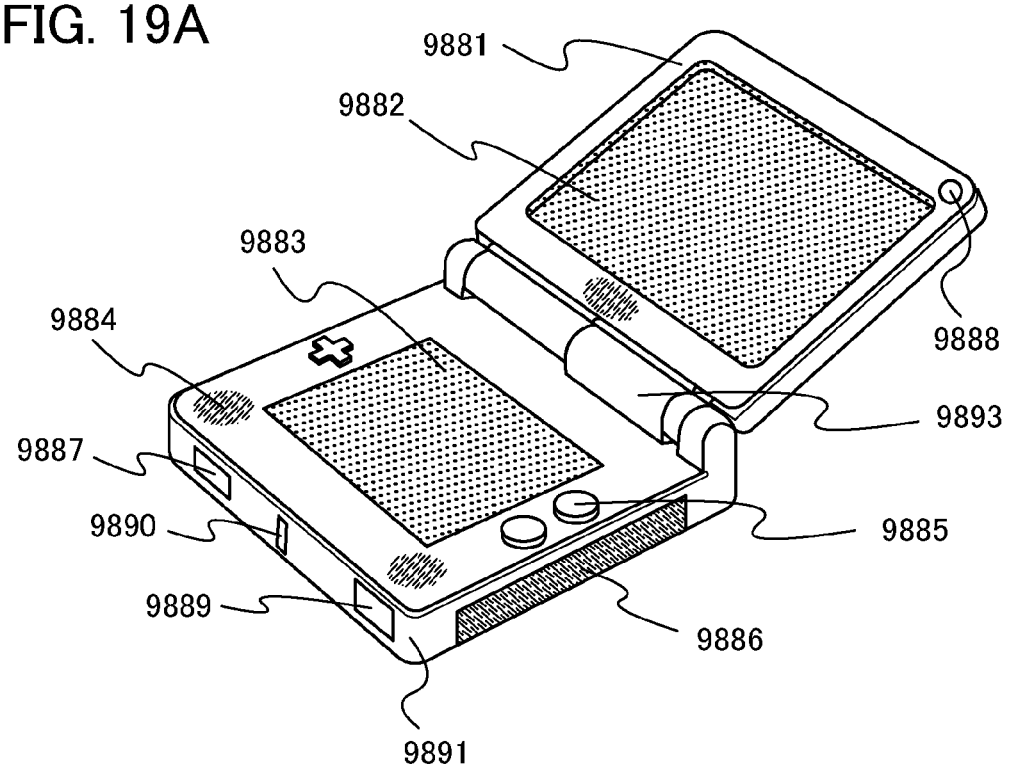
FIGS. 19A and 19B are each an external view of an example of an amusement machine.

FIG. 19A illustrates a portable game machine including a housing 9881 and a housing 9891 which are jointed with a connector 9893 so as to be able to open and close. A display portion 9882 and a display portion 9883 are incorporated in the housing 9881 and the housing 9891, respectively. The portable game machine illustrated in FIG. 19A additionally includes a speaker portion 9884, a recording medium inserting portion 9886, an LED lamp 9890, an input means (operation keys 9885, a connection terminal 9887, a sensor 9888 (including a function of measuring force, displacement, position, speed, acceleration, angular speed, the number of rotations, distance, light, liquid, magnetism, temperature, chemical substance, sound, time, hardness, electric field, current, voltage, electric power, radiation, flow rate, humidity, tilt angle, vibration, smell, or infrared ray), a microphone 9889), and the like. It is needless to say that the structure of the portable game machine is not limited to that described above. The portable game machine may have a structure in which additional accessory equipment is provided as appropriate as long as at least the semiconductor device according to the present invention is provided. The portable game machine illustrated in FIG. 19A has a function of reading a program or data stored in a recording medium to display it on the display portion, and a function of sharing information with another portable game machine by wireless communication. The portable game machine illustrated in FIG. 19A can have various functions without limitation to the above.

Figure 19B:
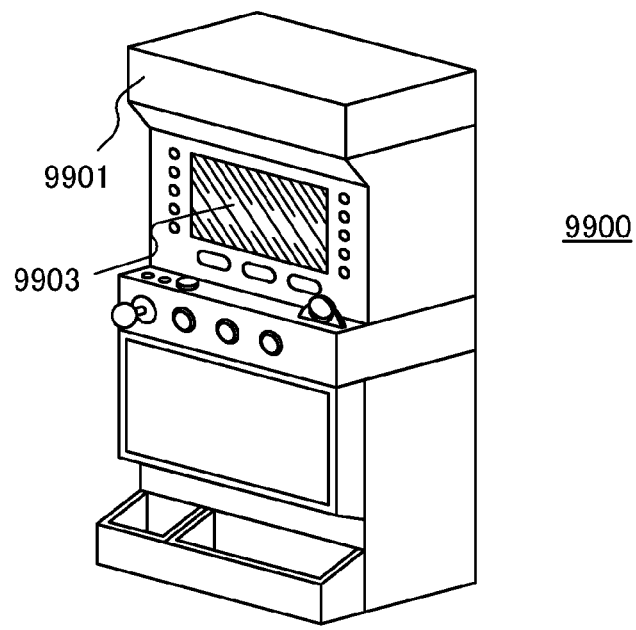

FIG. 19B illustrates a slot machine 9900, which is a large-sized game machine. In the slot machine 9900, a display portion 9903 is incorporated in a housing 9901. In addition, the slot machine 9900 includes an operation means such as a start lever or a stop switch, a coin slot, a speaker, and the like. Needless to say, the structure of the slot machine 9900 is not limited to the above structure. The slot machine may have a structure in which additional accessory equipment is provided as appropriate as long as at least the semiconductor device according to the present invention is provided.

Figure 20A:
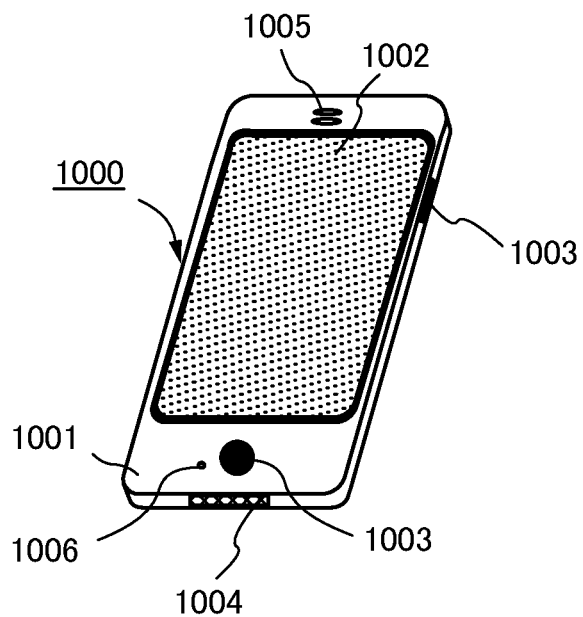
FIGS. 20A and 20B are each an external view of an example of a mobile phone.

FIG. 20A illustrates a mobile phone 1000. The mobile phone 1000 is provided with a display portion 1002 incorporated into a housing 1001, an operation button 1003, an external connection port 1004, a speaker 1005, a microphone 1006, and the like.

When the display portion 1002 of the mobile phone 1000 illustrated in FIG. 20A is touched with a finger or the like, data can be input into the mobile phone 1000. Users can make a call or text messaging by touching the display portion 1002 with their fingers or the like.

There are mainly three screen modes of the display portion 1002. The first mode is a display mode mainly for displaying an image. The second mode is an input mode mainly for inputting data such as text. The third mode is a display-and-input mode in which two modes of the display mode and the input mode are combined.

For example, in the case of making a call or texting, a text input mode mainly for inputting text is selected for the display portion 1002 so that characters displayed on a screen can be input. In that case, it is preferable to display a keyboard or number buttons on almost all area of the screen of the display portion 1002.

When a detection device including a sensor for detecting inclination, such as a gyroscope or an acceleration sensor, is provided inside the mobile phone 1000, display on the screen of the display portion 1002 can be automatically changed by determining the orientation of the mobile phone 1000 (whether the mobile phone 1000 stands upright or is laid down on its side).

The screen modes are changed by touching the display portion 1002 or using the operation button 1003 of the housing 1001. Alternatively, the screen modes may be changed depending on the kind of the image displayed on the display portion 1002. For example, when a signal of an image displayed on the display portion is a signal of moving image data, the screen mode is switched to the display mode. When the signal is a signal of text data, the screen mode is switched to the input mode.

Further, in the input mode, when input by touching the display portion 1002 is not performed for a certain period while a signal detected by an optical sensor in the display portion 1002 is detected, the screen mode may be controlled so as to be changed from the input mode to the display mode.

The display portion 1002 can also function as an image sensor. For example, an image of a palm print, a fingerprint, or the like is taken when the display portion 1002 is touched with a palm or a finger, whereby personal identification can be performed. Further, by providing a backlight or a sensing light source which emits a near-infrared light in the display portion, an image of a finger vein, a palm vein, or the like can be taken.

Figure 20B:
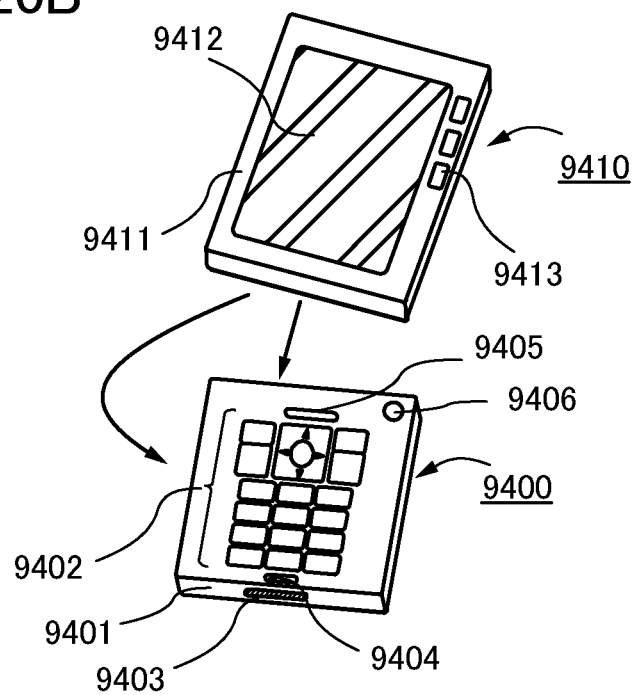

FIG. 20B illustrates another example of a mobile phone. The mobile phone in FIG. 20B includes a display device 9410 in which a display portion 9412 and operation buttons 9413 are included in a housing 9411; and a communication device 9400 in which operation buttons 9402, an external input terminal 9403, a microphone 9404, a speaker 9405, and a light-emitting portion 9406 that emits light when receiving a call are included in a housing 9401. The display device 9410 having a display function can be detached from and attached to the communication device 9400 having a telephone function in two directions indicated by arrows. Thus, the display device 9410 and the communication device 9400 can be attached to each other along their short sides or long sides. In addition, when only the display function is needed, the display device 9410 can be detached from the communication device 9400 and used alone. Images or input information can be transmitted or received by wireless or wire communication between the communication device 9400 and the display device 9410, each of which has a rechargeable battery.

Note that the structure described in this embodiment can be combined with any of the structures described in other embodiments as appropriate.

This application is based on Japanese Patent Application serial no. 2009-255217 filed with Japan Patent Office on Nov. 6, 2009, the entire contents of which are hereby incorporated by reference.

The invention claimed is:

1. A method for manufacturing an oxide semiconductor element, comprising the step of:
    forming an oxide semiconductor layer over a substrate by using a sputtering target in a chamber,
    wherein a filling rate of the sputtering target is greater than or equal to 90%, and
    wherein the sputtering target is heated by a heater in the chamber before the step of forming the oxide semiconductor layer so that hydrogen and carbon contained in the sputtering target are removed.

2. The method for manufacturing the oxide semiconductor element according to claim 1, wherein a temperature of the sputtering target is higher than or equal to 100° C. and lower than or equal to 600° C.

3. The method for manufacturing the oxide semiconductor element according to claim 1, further comprising the steps of:
    forming a gate insulating film adjacent to the oxide semiconductor layer;
    forming a gate electrode adjacent to the oxide semiconductor layer with the gate insulating film interposed therebetween; and
    forming a source electrode and a drain electrode in contact with the oxide semiconductor layer.

4. The method for manufacturing the oxide semiconductor element according to claim 1, further comprising the steps of:
    removing moisture remaining in the chamber; and
    introducing a sputtering gas for forming the oxide semiconductor layer after removing the moisture remaining in the chamber,
    wherein hydrogen and moisture are removed from the sputtering gas.

5. The method for manufacturing the oxide semiconductor element according to claim 4, wherein the moisture remaining in the chamber is removed by evacuation with the use of a cryopump.

6. The method for manufacturing the oxide semiconductor element according to claim 1, further comprising the steps of:
    heating the substrate in forming the oxide semiconductor layer;
    transporting the substrate to a treatment chamber after forming the oxide semiconductor layer; and
    cooling the substrate by a nitrogen gas or a rare gas in the treatment chamber.

7. The method for manufacturing the oxide semiconductor element according to claim 6, wherein a temperature of the substrate in the oxide semiconductor layer formation is higher than or equal to 100° C. and lower than or equal to 400° C.

8. The method for manufacturing the oxide semiconductor element according to claim 1, wherein the sputtering target comprises a metal oxide with an energy gap of larger than or equal to 2 eV and smaller than or equal to 4.5 eV as its main component.

9. The method for manufacturing the oxide semiconductor element according to claim 1, wherein the sputtering target is a metal oxide comprising indium, gallium, and zinc.

10. A method for manufacturing an oxide semiconductor element, comprising the steps of:
    forming a gate electrode over a substrate;
    forming a gate insulating film over the gate electrode;
    forming an oxide semiconductor layer over the gate electrode with the gate insulating film therebetween;
    forming a source electrode and a drain electrode in contact with the oxide semiconductor layer so that end portions of the source electrode and the drain electrode overlap with the gate electrode; and
    forming an oxide insulating film covering the oxide semiconductor layer between the source electrode and the drain electrode,
    wherein the substrate is held in a chamber kept in a reduced pressure state,
    wherein moisture remaining in the chamber is removed and a sputtering gas from which hydrogen and moisture are removed is introduced, and
    wherein the oxide semiconductor layer is formed by using a sputtering target in the chamber,
    wherein a filling rate of the sputtering target is greater than or equal to 90%, and
    wherein the sputtering target is heated by a heater in the chamber before the step of forming the oxide semiconductor layer so that hydrogen and carbon contained in the sputtering target are removed.

11. The method for manufacturing the oxide semiconductor element according to claim 10, wherein the remaining moisture is removed by evacuation with the use of a cryopump.

12. The method for manufacturing the oxide semiconductor element according to claim 10, wherein the sputtering target comprises a metal oxide with an energy gap of larger than or equal to 2 eV and smaller than or equal to 4.5 eV as its main component.

13. The method for manufacturing the oxide semiconductor element according to claim 10, wherein the sputtering target is a metal oxide comprising indium, gallium, and zinc.

14. The method for manufacturing the oxide semiconductor element according to claim 10, wherein the sputtering target is heated to higher than or equal to room temperature and lower than or equal to 600° C. during the step of forming the oxide semiconductor layer.

* * * * *

UNITED STATES PATENT AND TRADEMARK OFFICE
CERTIFICATE OF CORRECTION

PATENT NO. : 8,709,864 B2  
APPLICATION NO. : 12/938538  
DATED : April 29, 2014  
INVENTOR(S) : Shunpei Yamazaki et al.

Page 1 of 1

It is certified that error appears in the above-identified patent and that said Letters Patent is hereby corrected as shown below:

In the Specification

At column 18, line 32, "OH" should be --OH$^-$--;

At column 25, line 50, "102" should be --10_2--;

At column 32, line 56, "nm" should be --nm.--;

At column 41, line 46, after "one of" insert --adjacent light-emitting elements is used as a red light-emitting element, and the other is--.

Signed and Sealed this  
Ninth Day of September, 2014

Michelle K. Lee  
*Deputy Director of the United States Patent and Trademark Office*